US011066324B2

(12) United States Patent
Gross et al.

(10) Patent No.: US 11,066,324 B2
(45) Date of Patent: Jul. 20, 2021

(54) LITHIUM CONTAINING GLASSES

(71) Applicant: CORNING INCORPORATED, Corning, NY (US)

(72) Inventors: Timothy Michael Gross, Corning, NY (US); Xiaoju Guo, Painted Post, NY (US); Charlene Marie Smith, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 15/799,122

(22) Filed: Oct. 31, 2017

(65) Prior Publication Data

US 2018/0127304 A1 May 10, 2018
US 2021/0070649 A9 Mar. 11, 2021

Related U.S. Application Data

(60) Provisional application No. 62/418,367, filed on Nov. 7, 2016, provisional application No. 62/452,004, filed on Jan. 30, 2017, provisional application No. 62/565,190, filed on Sep. 29, 2017.

(51) Int. Cl.
| | |
|---|---|
| *C03C 3/091* | (2006.01) |
| *C03C 21/00* | (2006.01) |
| *C03C 3/097* | (2006.01) |
| *H05K 5/03* | (2006.01) |
| *H05K 5/00* | (2006.01) |
| *C03C 3/085* | (2006.01) |
| *G02F 1/1333* | (2006.01) |

(52) U.S. Cl.
CPC .............. *C03C 3/091* (2013.01); *C03C 3/085* (2013.01); *C03C 3/097* (2013.01); *C03C 21/002* (2013.01); *H05K 5/0017* (2013.01); *H05K 5/03* (2013.01); *G02F 2001/133331* (2013.01)

(58) Field of Classification Search
CPC ......... C03C 3/091; C03C 3/097; C03C 3/085; C03C 21/002
See application file for complete search history.

(56) References Cited

U.S. PATENT DOCUMENTS

| | | | |
|---|---|---|---|
| 3,451,798 A | 6/1969 | Simon | |
| 3,537,834 A | 11/1970 | Simon | |
| 6,268,304 B1 | 7/2001 | Maeda et al. | |
| 6,391,444 B1 | 5/2002 | Kielmeyer | |
| 6,896,646 B2 | 5/2005 | Kaiser et al. | |
| 7,409,839 B2 | 8/2008 | Boratav et al. | |
| 8,168,295 B2 | 5/2012 | Murata | |
| 8,652,979 B2 | 2/2014 | Murata | |
| 8,748,002 B2 | 6/2014 | Murata | |
| 8,835,007 B2 | 9/2014 | Murata et al. | |
| 8,854,623 B2 | 10/2014 | Fontaine et al. | |
| 9,388,064 B2 | 7/2016 | Murata | |
| 9,512,025 B2 | 12/2016 | Chung et al. | |
| 9,593,042 B2 | 3/2017 | Hu et al. | |
| 10,065,880 B2 | 9/2018 | Gross et al. | |
| 2004/0063564 A1 | 4/2004 | Kawai et al. | |
| 2009/0107182 A1 | 4/2009 | Anderson et al. | |
| 2012/0052271 A1 | 3/2012 | Gomez et al. | |
| 2012/0321898 A1 | 12/2012 | Meinhardt et al. | |
| 2013/0101980 A1 | 4/2013 | Domey et al. | |
| 2014/0023865 A1* | 1/2014 | Comte | C03C 3/083 428/410 |
| 2015/0064472 A1 | 3/2015 | Gross et al. | |
| 2015/0166405 A1 | 6/2015 | Murata et al. | |
| 2015/0225288 A1 | 8/2015 | Bookbinder et al. | |
| 2016/0102011 A1 | 4/2016 | Hu et al. | |
| 2016/0137550 A1 | 5/2016 | Murata et al. | |
| 2016/0347655 A1 | 12/2016 | Meinhardt et al. | |
| 2016/0347656 A1 | 12/2016 | Kawamoto et al. | |
| 2016/0376186 A1 | 12/2016 | Gross | |
| 2016/0376187 A1 | 12/2016 | Gross | |
| 2017/0247284 A1 | 8/2017 | Miyasaka et al. | |
| 2018/0127302 A1* | 5/2018 | Gross | C03C 3/083 |
| 2018/0127304 A1 | 5/2018 | Gross et al. | |

FOREIGN PATENT DOCUMENTS

| | | |
|---|---|---|
| CN | 105753314 A | 7/2016 |
| CN | 108463439 A | 8/2018 |
| EP | 0879801 A1 | 11/1998 |
| JP | 2014-141363 A | 8/2014 |
| JP | 05704767 B2 | 4/2015 |
| JP | 5744068 B2 | 7/2015 |
| JP | 05838967 B2 | 1/2016 |
| JP | 2016113340 A | 6/2016 |
| WO | 2010099278 A2 | 9/2010 |
| WO | 2012027660 A1 | 3/2012 |
| WO | 2013130665 A2 | 9/2013 |
| WO | 2015/162845 A1 | 10/2015 |
| WO | 2016/210244 A1 | 12/2016 |
| WO | 2017177109 A1 | 10/2017 |
| WO | 2017205605 A1 | 11/2017 |

OTHER PUBLICATIONS

International Searching Authority Invitation to Pay Additional Fees PCT/US2017/059315 dated Mar. 20, 2018.

(Continued)

*Primary Examiner* — Elizabeth A. Bolden
(74) *Attorney, Agent, or Firm* — Kevin M. Johnson

(57) ABSTRACT

A glass article including, on an oxide basis, from 60 mol % to 74 mol % $SiO_2$, from 7 mol % to 18 mol % $Al_2O_3$, from 3 mol % to 16 mol % $B_2O_3$, from 0 mol % to 6 mol % $Na_2O$, from 0 mol % to 5 mol % $P_2O_5$, from 5 mol % to 11 mol % $Li_2O$, less than or equal to 0.2 mol % $SnO_2$, and from 0.5 mol % to 6.5 mol % divalent cation oxides. The glass article has a molar ratio of $Al_2O_3$:($R_2O$+RO) greater than or equal to 0.9, where $R_2O$ is a sum of alkali metal oxides in mol % and RO is a sum of divalent cation oxides in mol %.

18 Claims, 27 Drawing Sheets

(56) References Cited

OTHER PUBLICATIONS

U.S. Appl. No. 15/799,430. Gross et al. "Low Viscosity Glasses and Methods and Systems for Manufacture" filed Oct. 31, 2017. 99 pgs. Downloaded from PAIR.
Chinese Patent Application No. 201780082332.0, Office Action dated Apr. 25, 2021; 11 pages (English Translation only); Chinese Patent Office.

* cited by examiner

LITHIUM CONTAINING GLASSES

CROSS-REFERENCE TO RELATED APPLICATIONS

This application claims the benefit of priority under 35 U.S.C. § 119 of U.S. Provisional Application Ser. No. 62/418,367 filed on Nov. 7, 2016, U.S. Provisional Application Ser. No. 62/452,004 filed on Jan. 30, 2017, and U.S. Provisional Application Ser. No. 62/565,190 filed on Sep. 29, 2017, the content of each is relied upon and incorporated herein by reference in its entirety.

BACKGROUND

Field

The present specification generally relates to low viscosity glasses and lithium containing glasses. More specifically, the present specification is directed to the manufacturing of low viscosity glasses and lithium containing aluminosilicate glasses which may be used as cover glasses. The present specification is also directed to low viscosity and lithium containing aluminosilicate glasses which contain a fusion line.

Technical Background

The mobile nature of portable devices, such as smart phones, tablets, portable media players, personal computers, and cameras, makes these devices particularly vulnerable to accidental dropping on hard surfaces, such as the ground. These devices typically incorporate cover glasses, which may become damaged upon impact with hard surfaces. In many of these devices, the cover glasses function as display covers, and may incorporate touch functionality, such that use of the devices is negatively impacted when the cover glasses are damaged.

There are two major failure modes of cover glass when the associated portable device is dropped on a hard surface. One of the modes is flexure failure, which is caused by bending of the glass when the device is subjected to dynamic load from impact with the hard surface. The other mode is sharp contact failure, which is caused by introduction of damage to the glass surface. Impact of the glass with rough hard surfaces, such as asphalt, granite, etc., can result in sharp indentations in the glass surface. These indentations become failure sites in the glass surface from which cracks may develop and propagate.

Glass can be made more resistant to flexure failure by ion-exchange technique, which involves inducing compressive stress in the glass surface. However, the ion-exchanged glass will still be vulnerable to dynamic sharp contact, owing to the high stress concentration caused by local indentations in the glass from the sharp contact.

It has been a continuous effort for the glass makers and handheld device manufacturers to improve the resistance of handheld devices to sharp contact failure. Solutions range from coatings on the cover glass to bezels that prevent the cover glass from touching the hard surface directly when the device drops on the hard surface. However, due to the constraints of aesthetic and functional requirements, it is very difficult to completely prevent the cover glass from touching the hard surface.

It is also desirable that portable devices be as thin as possible. Accordingly, in addition to strength, it is also desired that glasses to be used as cover glass in portable devices be made as thin as possible. Thus, in addition to increasing the strength of the cover glass, it is also desirable for the glass to have mechanical characteristics that allow it to be formed by processes that are capable of making thin glass articles, such as thin glass sheets.

Glass forming apparatuses are commonly used to form various glass products such as glass sheets used for LCD displays, portable devices, and the like. These glass sheets may be manufactured by downwardly flowing molten glass over a forming wedge to form a continuous glass ribbon. Developing technologies are using glass compositions with increasingly lower liquidus viscosities. As such, higher forming temperatures are used to prevent devitrification of molten glass as it traverses the forming wedge.

Accordingly, a need exists for alternative methods and apparatuses for forming glass ribbons which can provide higher forming temperatures to mitigate devitrification of glasses having lower liquidus viscosities. Accordingly, a need also exists for glasses that can be strengthened, such as by ion exchange, and that have the mechanical properties that allow them to be formed as thin glass articles.

SUMMARY

According to some embodiments, a glass article comprises, on an oxide basis: from greater than or equal to 60 mol % to less than or equal to 74 mol % $SiO_2$; from greater than or equal to 7 mol % to less than or equal to 18 mol % $Al_2O_3$; from greater than or equal to 3 mol % to less than or equal to 16 mol % $B_2O_3$; from greater than 0 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; less than or equal to 0.2 mol % $SnO_2$, and from greater than or equal to 0.5 mol % to less than or equal to 6.5 mol % divalent cation oxides. The glass article has a molar ratio of $Al_2O_3:(R_2O+RO)$ of greater than or equal to 0.9, where $R_2O$ is a sum of alkali metal oxides in mol % and RO is a sum of divalent cation oxides in mol %.

According to some embodiments, a glass article comprises, on an oxide basis: from greater than or equal to 60 mol % to less than or equal to 66 mol % $SiO_2$; from greater than or equal to 11.5 mol % to less than or equal to 18 mol % $Al_2O_3$; from greater than or equal to 3 mol % to less than or equal to 8 mol % $B_2O_3$; from greater than or equal to 2 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; and from greater than or equal to 0.5 mol % to less than or equal to 6.5 mol % divalent cation oxides. The glass article has a molar ratio of $Al_2O_3:(R_2O+RO)$ of greater than or equal to 0.9, where $R_2O$ is a sum of alkali metal oxides in mol % and RO is a sum of divalent cation oxides in mol %.

According to some embodiments, a glass article comprises, on an oxide basis: from greater than or equal to 65 mol % to less than or equal to 74 mol % $SiO_2$; from greater than or equal to 7 mol % to less than or equal to 12 mol % $Al_2O_3$; from greater than or equal to 5 mol % to less than or equal to 16 mol % $B_2O_3$; from greater than or equal to 0 mol % to less than or equal to 4 mol % $Na_2O$; from greater than or equal to 0 mol % to less than or equal to 5 mol % $P_2O_5$; from greater than or equal to 5 mol % to less than or equal to 11 mol % $Li_2O$; and from greater than or equal to 0.5 mol % to less than or equal to 6.5 mol % divalent cation oxides. The glass article has a molar ratio of $Al_2O_3:(R_2O+RO)$ of greater than or equal to 0.9, where $R_2O$ is a sum of alkali metal oxides in mol % and RO is a sum of divalent cation oxides in mol %.

According to some embodiments, a glass article comprises, $Li_2O$, $SiO_2$, $Al_2O_3$, and a liquidus viscosity less than or equal to 300 kP, wherein $RI_{annealed}$–$RI_{as\ formed}$ is greater than or equal to 0.0003, where $IR_{annealed}$ is a refractive index at a wavelength of 589 nm of the glass heated at the annealing point of the glass for 1 hour and $RI_{as\ formed}$ is a refractive index at a wavelength of 589 nm of the glass as formed.

According to some embodiments, a consumer electronic product, comprises a housing having a front surface, a back surface, and side surfaces; electrical components provided at least partially within the housing, the electrical components including at least a controller, a memory, and a display, the display being provided at or adjacent to the front surface of the housing; and a cover substrate disposed over the display. At least one of a portion of the housing or the cover substrate comprises the glass article of any one of the first embodiment, the second embodiment, the third embodiment or the fourth embodiment recited above.

In further embodiments, a glass article comprises $SiO_2$, $Al_2O_3$, $B_2O_3$, $Li_2O$, $SnO_2$ and a fusion line. The glass article can also comprise $Na_2O$ or $P_2O_5$. In some embodiments, the glass article comprises, on an oxide basis: from greater than or equal to 60 mol % to less than or equal to 74 mol % $SiO_2$; from greater than or equal to 7 mol % to less than or equal to 18 mol % $Al_2O_3$; from greater than or equal to 3 mol % to less than or equal to 16 mol % $B_2O_3$; from greater than 0 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; and less than or equal to 0.2 mol % $SnO_2$. In some embodiments, the glass article comprises a molar ratio of $Al_2O_3$:$(R_2O+RO)$ greater than or equal to 0.9, where $R_2O$ is a sum of alkali metal oxides in mol % and RO is a sum of divalent cation oxides in mol %. In some embodiments, the glass article comprises a liquidus viscosity of less than or equal to 300 kP, less than or equal to 100 kP, less than or equal to 50 kP, or less than or equal to 25 kP. In some embodiments, the glass article is strengthened by an ion exchange process, such that a compressive stress layer is formed on at least one surface of the glass article. In some embodiments, the glass article comprises a depth of compression is greater than or equal to 0.15t, where t is a thickness of the glass article. In some embodiments, the glass article comprises a depth of compression (DOC) from greater than or equal to 0.15t to less than or equal to 0.25t, where t is a thickness of the glass article. In some embodiments, the glass article comprises a central tension from greater than or equal to 30 MPa to less than or equal to 150 MPa. In some embodiments, the glass article is strengthened by an ion exchange process that adds potassium ions to the glass article and a potassium depth of layer (DOL) is from greater than or equal to 5 μm to less than or equal to 30 μm. In some embodiments, the glass article comprises a compressive stress layer has a compressive stress at its surface from greater than or equal to 300 MPa to less than or equal to 950 MPa. In some embodiments, the glass article comprises a Knoop Scratch Lateral Cracking Threshold of greater than or equal to 5 N to less than or equal to 24 N. In some embodiments, the glass article comprises an Indentation Fracture Threshold of greater than or equal to 15 kgf.

In additional embodiments, a glass article comprises $SiO_2$, $Al_2O_3$ and a liquidus viscosity of less than or equal to 100 kP, less than or equal to 50 kP, or less than or equal to 25 kP. In some embodiments, the glass article comprises on a mole oxide basis: from greater than or equal to 60 mol % to less than or equal to 74 mol % $SiO_2$; from greater than or equal to 7 mol % to less than or equal to 18 mol % $Al_2O_3$; from greater than or equal to 3 mol % to less than or equal to 16 mol % $B_2O_3$; from greater than 0 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; and less than or equal to 0.2 mol % $SnO_2$. In some embodiments, the glass article is strengthened by an ion exchange process, such that a compressive stress layer is formed on at least one surface of the glass article. In some embodiments, the glass article comprises a depth of compression greater than or equal to 0.15t, where t is a thickness of the glass article. In some embodiments, the glass article comprises a depth of compression (DOC) from greater than or equal to 0.15t to less than or equal to 0.25t, where t is a thickness of the glass article. In some embodiments, the glass article comprises a central tension from greater than or equal to 30 MPa to less than or equal to 150 MPa. In some embodiments, the glass article is strengthened by an ion exchange process that adds potassium ions to the glass article and a potassium depth of layer (DOL) is from greater than or equal to 5 μm to less than or equal to 30 μm. In some embodiments, the glass article comprises a compressive stress layer has a compressive stress at its surface from greater than or equal to 300 MPa to less than or equal to 950 MPa.

In further embodiments, a glass article comprises at least $Li_2O$ and one or more of $SiO_2$, $Al_2O_3$, $B_2O_3$, and $SnO_2$ and further comprises a fusion line. In some embodiments, the glass article comprises $Na_2O$ or $P_2O_5$. In some embodiments, the glass article comprises on an oxide basis: from greater than or equal to 60 mol % to less than or equal to 74 mol % $SiO_2$; from greater than or equal to 7 mol % to less than or equal to 18 mol % $Al_2O_3$; from greater than or equal to 3 mol % to less than or equal to 16 mol % $B_2O_3$; from greater than 0 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; and less than or equal to 0.2 mol % $SnO_2$. In some embodiments, the glass article comprises a molar ratio of $Al_2O_3$:$(R_2O+RO)$ greater than or equal to 0.9, where $R_2O$ is a sum of alkali metal oxides in mol % and RO is a sum of divalent cation oxides in mol %. In some embodiments, the glass article comprises a liquidus viscosity of less than or equal to 300 kP, less than or equal to 100 kP, less than or equal to 50 kP, or less than or equal to 25 kP.

In additional embodiments, a glass article comprises $SiO_2$, $Al_2O_3$, $Li_2O$ and further comprising a liquidus viscosity of less than or equal to 100 kP and a fusion line. In some embodiments, the glass article comprises a liquidus viscosity of less than or equal to 50 kP or less than or equal to 25 kP. In some embodiments, the glass article comprises on a mole oxide basis: from greater than or equal to 60 mol % to less than or equal to 74 mol % $SiO_2$; from greater than or equal to 7 mol % to less than or equal to 18 mol % $Al_2O_3$; from greater than or equal to 3 mol % to less than or equal to 16 mol % $B_2O_3$; from greater than 0 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; and less than or equal to 0.2 mol % $SnO_2$. In some embodiments, the glass article is strengthened by an ion exchange process, such that a compressive stress layer is formed on at least one surface of the glass article.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Reference now be made in detail to manufacturing systems and processes for making such low viscosity glasses and lithium containing aluminosilicate glasses. Reference will now be made in detail to low viscosity glasses and lithium containing aluminosilicate glasses according to various embodiments. Reference will also be made in detail to low viscosity and lithium containing aluminosilicate glasses which contain a fusion line.

Glass Manufacturing Systems

Figure 1:
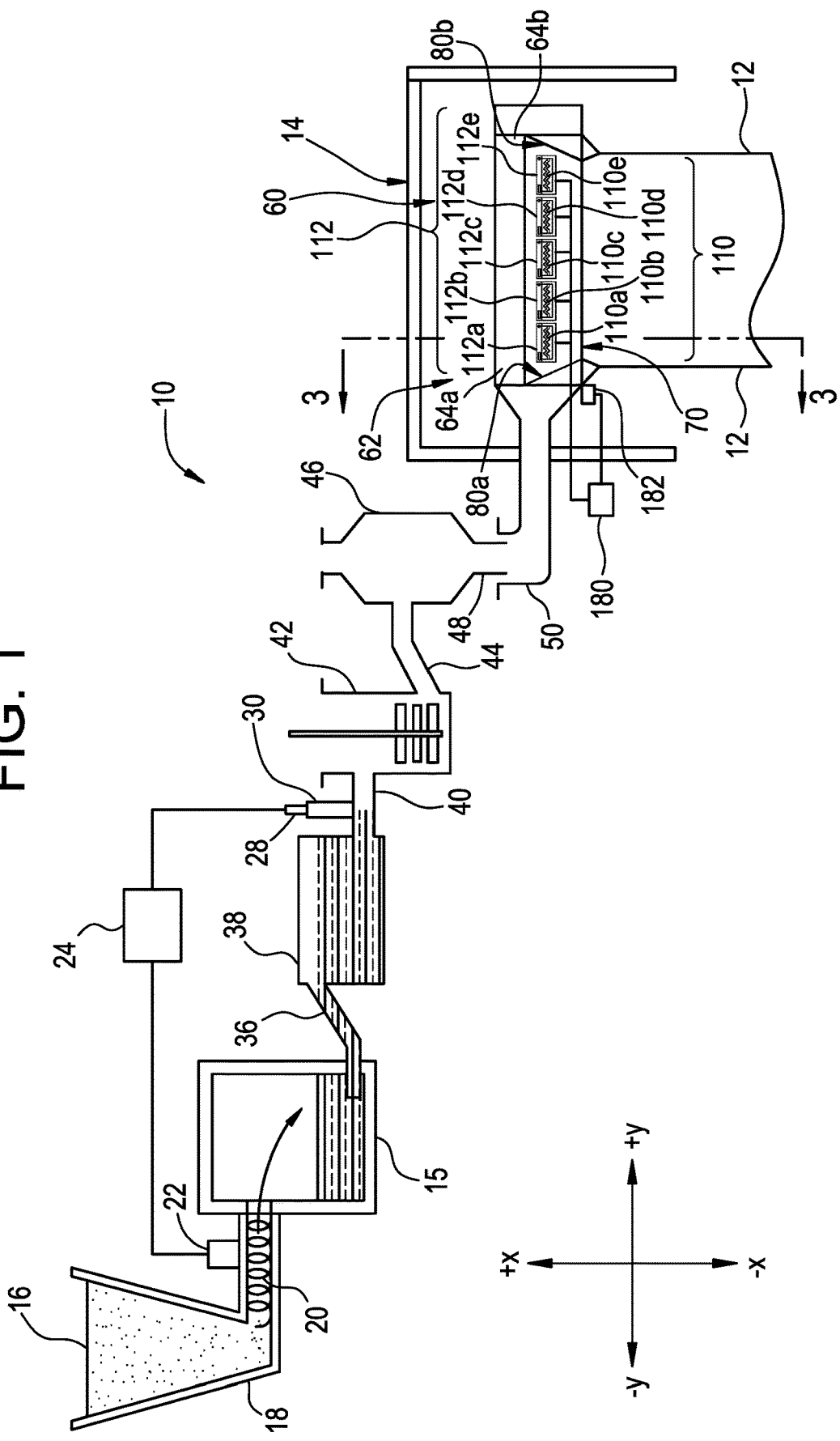
FIG. 1 schematically depicts an apparatus for forming a glass ribbon according to one or more embodiments shown and described herein.

Reference will now be made in detail to embodiments of the methods and apparatuses for forming glass ribbons, examples of which are illustrated in the accompanying drawings. Whenever possible, the same reference numerals are used throughout the drawings to refer to the same or like parts. One embodiment of an apparatus for making glass ribbons is shown in FIG. 1, and is designated generally throughout by the reference number 10. According to one embodiment, an apparatus for forming a glass ribbon includes a forming wedge disposed in a housing and comprising a pair of downwardly inclined forming surface portions converging at a root. A plurality of heating cartridges may be positioned in ports of the housing. Each heating cartridge may include a heat directing surface that is oriented at an angle of greater than about 90° with respect to a bottom surface of the heating cartridge. The heat directing surface may include a heating element positioned adjacent to the heat directing surface. The heating cartridge may be positioned such that the heat directing surface faces the forming wedge and an upper edge of the heat directing surface and a top surface of the heating cartridge are positioned above at least one of the root of the forming wedge or a trough of the forming wedge to direct heat from the heat directing surface of the heating cartridge towards either the root of the forming wedge or the trough the forming wedge. Various embodiments of methods and apparatuses for forming glass ribbons will be described in further detail herein with specific reference to the appended drawings.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

Referring now to FIG. 1, one embodiment of a glass forming apparatus 10 for forming a glass ribbon 12 is schematically depicted. The glass forming apparatus 10 generally includes a melting vessel 15 configured to receive glass batch material 16 from a storage bin 18. The glass batch material 16 can be introduced to the melting vessel 15 by a batch delivery device 20 powered by a motor 22. An optional controller 24 may be provided to activate the motor 22 and a molten glass level probe 28 can be used to measure the glass melt level within a standpipe 30 and communicate the measured information to the controller 24.

The glass forming apparatus 10 includes a fining vessel 38, such as a fining tube, located downstream from the melting vessel 15 and coupled to the melting vessel 15 by way of a first connecting tube 36. A mixing vessel 42, such as a stir chamber, is located downstream from the fining vessel 38. A delivery vessel 46, such as a bowl, may be located downstream from the mixing vessel 42. As depicted, a second connecting tube 40 couples the fining vessel 38 to the mixing vessel 42 and a third connecting tube 44 couples the mixing vessel 42 to the delivery vessel 46. As further illustrated, a downcomer 48 is positioned to deliver glass melt from the delivery vessel 46 to an inlet 50 of a forming vessel 60.

The melting vessel 15 is typically made from a refractory material, such as refractory (e.g., ceramic) brick. The glass forming apparatus 10 may further include components that are typically made from platinum or platinum-containing metals such as platinum-rhodium, platinum-iridium and combinations thereof, but which may also comprise such refractory metals such as molybdenum, palladium, rhenium, tantalum, titanium, tungsten, ruthenium, osmium, zirconium, and alloys thereof and/or zirconium dioxide. The platinum-containing components can include one or more of the first connecting tube 36, the fining vessel 38, the second connecting tube 40, the standpipe 30, the mixing vessel 42, the third connecting tube 44, the delivery vessel 46, the downcomer 48 and the inlet 50. The forming vessel 60 can also be made from a refractory material (for example, refractory brick and/or refractory metal) and is designed to form the glass melt into a glass ribbon 12.

Figure 2:
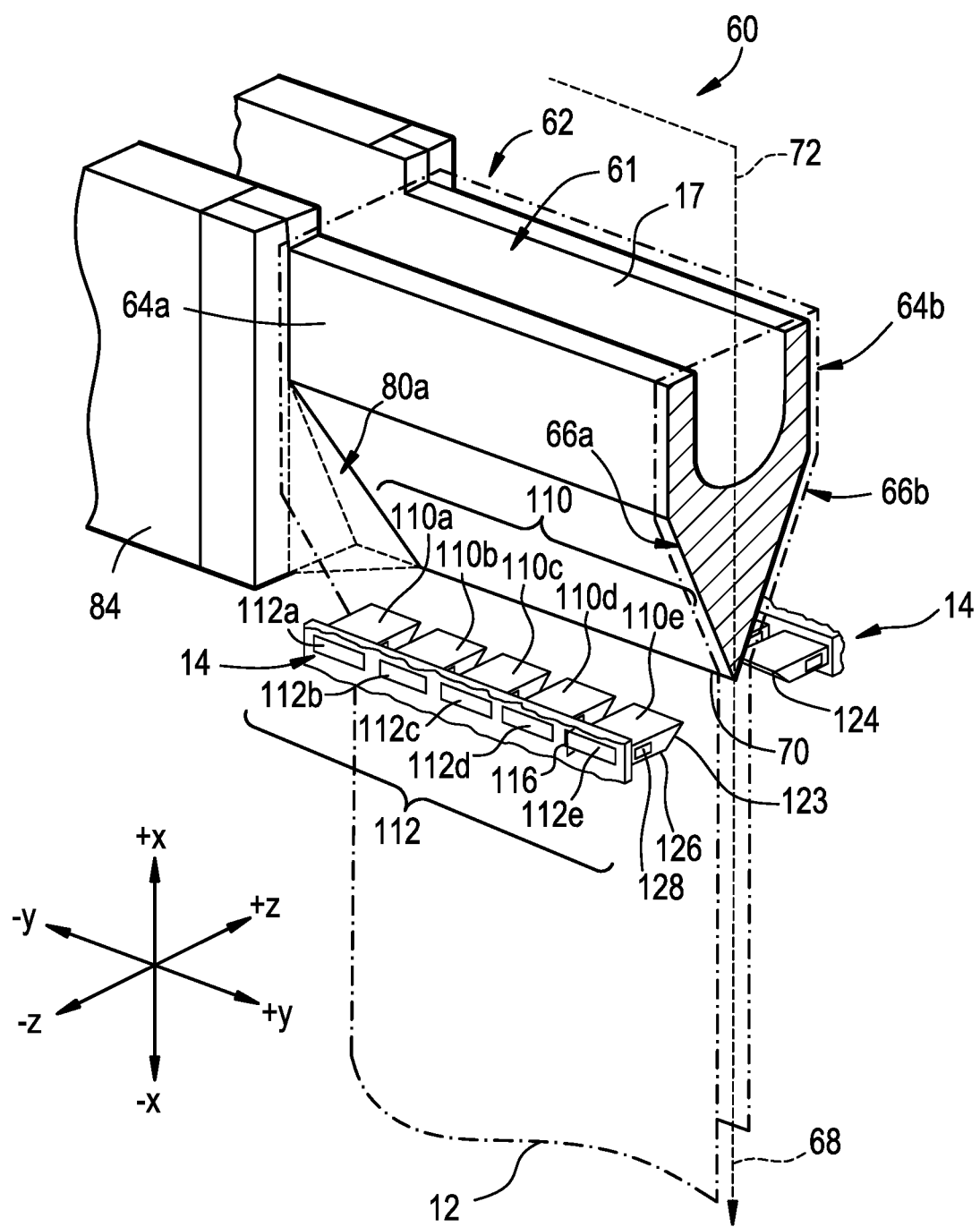
FIG. 2 schematically depicts a cross sectional perspective view at the location of line 3-3 of FIG. 1.

FIG. 2 is a cross sectional perspective view of the glass forming apparatus 10 along line 2-2 of FIG. 1. As shown, the forming vessel 60 includes a forming wedge 62 comprising an upwardly (i.e in the +x direction of the coordinate axes depicted in FIG. 2) open trough 61, a pair of downwardly (i.e., in the −x direction of the coordinate axes depicted in FIG. 2) inclined forming surface portions 66a, 66b that extend between opposed ends 64a, 64b of the forming wedge 62. The downwardly inclined forming surface portions 66a, 66b that converge along a downstream direction 68 to form a root 70. A draw plane 72 extends through the root 70. The glass ribbon 12 may be drawn from the forming wedge 62 in the downstream direction 68 along the draw plane 72, as will be described further herein. As depicted, the draw plane 72 bisects the root 70 in a generally horizontal, lengthwise direction (the +/−y direction of the coordinate axes depicted in FIG. 2) of the forming vessel 60 through the root 70. However, it should be understood that the draw plane 72 may extend at other various orientations with respect to the root 70 other than bisecting the forming vessel 60 through the root. While FIGS. 1 and 2 generally depict one embodiment of a glass forming apparatus and a forming vessel, it should also be understood that aspects of the present disclosure may be used with various other forming vessel configurations.

Referring to FIGS. 1 and 2, in certain embodiments, the forming vessel 60 may comprise an edge director 80a, 80b intersecting with the pair of downwardly inclined forming surface portions 66a, 66b. The edge directors help achieve a desired glass ribbon width and edge characteristics by directing the molten glass proximate to the root 70 of the forming vessel 60. In further embodiments, the edge director can intersect with both downwardly inclined forming surface portions 66a, 66b. In addition or alternatively, in certain embodiments an edge director can be positioned at each of the opposed ends 64a, 64b of the forming wedge 62. For instance, as shown in FIG. 1, an edge director 80a, 80b can be positioned at each of the opposed ends 64a, 64b of the forming wedge 62 with each edge director 80a, 80b configured to intersect with both of the downwardly inclined forming surface portions 66a, 66b. As further illustrated, each edge director 80a, 80b is substantially identical to one another. However, it should be understood that, in alternative embodiments, the edge directors may have different configurations and/or geometries depending on the specific characteristics of the glass forming apparatus. Further, it should be understood that various forming wedge and edge director configurations may be used in accordance with aspects of the present disclosure. For example, aspects of the present disclosure may be used with forming wedges and edge director configurations as disclosed in U.S. Pat. Nos. 3,451,798, 3,537,834, 7,409,839, U.S. patent application Ser. No. 14/278,582, filed May 15, 2014, and/or U.S. Provisional Pat. Application No. 61/155,669, filed Feb. 26, 2009, each of which are herein incorporated by reference.

Still referring to FIG. 1, the glass forming apparatus 10 can optionally include at least one edge roller assembly (not shown) for drawing glass ribbon from the root 70 of the forming vessel 60. It should be understood that various edge roller assembly configurations may be used in accordance with aspects of the present disclosure as will be discussed in detail further below.

A housing 14 encloses the forming vessel 60. The housing 14 may be formed from steel and contain refractory material and/or insulation to thermally insulate the forming vessel 60, and the molten glass flowing in and around the forming vessel 60, from the surrounding environment. While not shown, the housing 14 may include a plurality of cooling tubes or bayonets which can utilize water or other heat transfer mediums (e.g., air, etc.) to extract energy from portions of the forming vessel 60. Such cooling tubes or bayonets at higher elevations in the housing 14, e.g., above or proximate weirs of the forming vessel 60 or proximate the forming surfaces of the forming vessel 60, can increase viscosity more quickly to thereby improve glass stiffness and resistance to baggy warp. Further, one or more pairs of such cooling tubes or bayonets at these higher elevations can enable lower root viscosities for the same thickness of a glass ribbon.

Referring now to FIGS. 1-2, in operation, batch material 16, specifically batch material for forming glass, is fed from the storage bin 18 into the melting vessel 15 with the batch delivery device 20. The batch material 16 is melted into molten glass in the melting vessel 15. The molten glass passes from the melting vessel 15 into the fining vessel 38 through the first connecting tube 36. Dissolved gasses, which may result in glass defects, are removed from the molten glass in the fining vessel 38. The molten glass then passes from the fining vessel 38 into the mixing vessel 42 through the second connecting tube 40. The mixing vessel 42 homogenizes the molten glass, such as by stirring, and the homogenized molten glass passes through the third connecting tube 44 to the delivery vessel 46. The delivery vessel 46 discharges the homogenized molten glass through downcomer 48 and into the inlet 50 which, in turn, passes the homogenized molten glass into the trough 61 of the forming vessel 60.

As molten glass 17 fills the upwardly open trough 61 of forming wedge 62, it overflows the trough 61 and flows over the inclined forming surface portions 66a, 66b and rejoins at the root 70 of the forming wedge 62, thereby forming a glass ribbon 12. As depicted in FIG. 2, the glass ribbon 12 may be drawn in the downstream direction 68 along the draw plane 72 that extends through the root 70.

For glass forming apparatuses as depicted in FIGS. 1-2, it has been found that developing technologies such as high performance displays (HPD) utilizing organic light emitting diode (OLED) technology or cover glass displays benefit from glass compositions that are difficult to form, such as glass compositions with lower liquidus viscosities and/or lithium containing aluminosilicate glasses. Such glass compositions typically are made with higher forming temperatures to prevent the formation of defects, such as devitrification, in the glass ribbon drawn from the forming vessel 60. The glass forming apparatuses described herein can also utilize heating cartridges positioned proximate the root of the forming vessel 60 to maintain the molten glass at relatively high forming temperatures thereby aiding the sheet-forming process and preventing the formation of defects in the glass ribbon.

Figure 3:
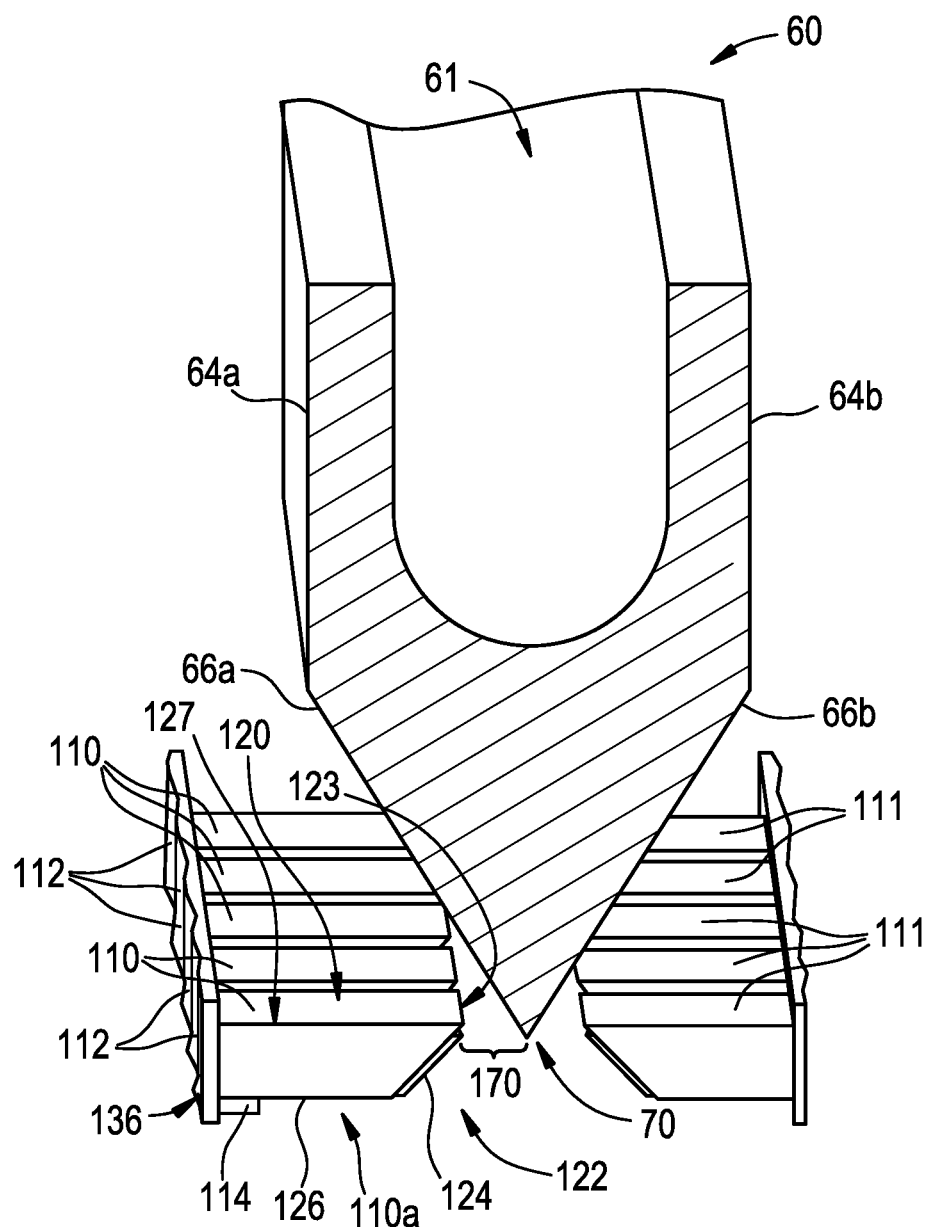
FIG. 3 schematically depicts a perspective front view of the apparatus for forming a glass ribbon of FIG. 2 according to one or more embodiments shown and described herein.

Specifically referring again to FIGS. 1-3, to maintain a relatively high temperature of the molten glass in the glass ribbon 12 drawn from the root 70 of the forming vessel 60, the glass forming apparatus 10 further includes a plurality of heating cartridges 110, 111 positioned in a series of ports 112 formed in the housing 14 and/or housing seal plate 136 (FIG. 3). The housing seal plate 136 forms part of housing 14 (FIGS. 1-2). As shown in FIG. 3, a first series of ports 112 and a second series of ports (not shown) are arranged so that a first plurality of heating cartridges 110 and a second plurality of heating cartridges 111 are located on opposite sides of the root 70 such that the draw plane 72 extends between the first plurality of heating cartridges 110 and the second plurality of heating cartridges 111. The first plurality of heating cartridges 110 and the first series of ports 112 will be described in more detail. However, it should be understood that the first plurality of heating cartridges 110 and the second plurality of heating cartridges 111 are substantially identical or of a similar construct to the other. Similarly, it should be understood that each series of ports 112 are substantially identical or of a similar construct to the other.

As depicted in FIGS. 1-2, the first series of ports 112 are arrayed across the width (the +/−y direction of the coordinate axes depicted in FIGS. 1 and 2) of the forming vessel 60 so that the first series of ports 112 spans the width (the +/−y direction of the coordinate axes depicted in FIGS. 1 and 2) of the draw plane 72 on which the glass ribbon 12 is drawn. Accordingly, it should be understood that the first plurality of heating cartridges 110, when inserted in the corresponding ports, are also arrayed across the width of the forming vessel 60 and extend across the width of the draw plane 72 of the glass ribbon 12. In some embodiments, each port of the first series of ports 112 are spaced laterally (i.e., in the +/−y direction of the coordinate axes depicted in FIGS. 1 and 2) apart from one another across the width of the forming vessel. In certain embodiments, each port of the first series of ports 112 can be spaced laterally apart from one another by an equal distance.

The first plurality of heating cartridges 110 may be configured to direct heat onto the root 70, thereby maintaining the root 70 at a desired temperature, such as above the divitrification temperature of the molten glass and, in turn, mitigating the formation of defects in the glass. As depicted in FIGS. 2 and 3, the first series of ports 112 can be located in the housing 14 such that the first plurality of heating cartridges 110 are positioned adjacent to and spaced from the root 70 of the forming vessel 60 in the −z direction. In the embodiment depicted in FIG. 3, the first plurality of heating cartridges 110 are spaced from the root 70 in the −z direction, and further positioned such that a portion of each heating cartridge 110 is located above (the +x direction of the coordinate axes) the root 70 and a portion is located below (in the −x direction of the coordinate axes) the root 70. Alternatively, in the embodiment depicted in FIG. 1, the first series of ports 112 can be located in the housing 14 such that the first plurality heating cartridges 110 are positioned entirely above the root 70. In still other embodiments (not shown), the first series of ports 112 can be located in the housing 14 such that the first plurality heating cartridges 110 are positioned below the root 70.

FIGS. 1-3 depict a first plurality of heating cartridges 110 that includes five heating cartridges 110a, 110b, 110c, 110d, 110e. Thus, FIGS. 1-3 depict that these five heating cartridges are positioned in a first series of ports 112 that includes five ports 112a, 112b, 112c, 112d, 112e formed in the housing 14. However, it should be understood that this is an exemplary number and that the number of heating cartridges in the first plurality of heating cartridges 110 and the number of corresponding ports in the first series of ports 112 may be more than five or less than five. Likewise, the width of the heating cartridges depends on the number of heating cartridges utilized as well as the width of the forming vessel. For example, FIG. 1 illustrates five heating cartridges across the full width of the forming vessel, while FIG. 1 illustrates five heating cartridges across less than the full width of the forming vessel. One of the first plurality of heating cartridges 110 will be described in more detail herein. However, it should be understood that each heating cartridge 110a, 110b, 110c, 110d, 110e of the first plurality of heating cartridges 110, as well as each heating cartridge of the second plurality of heating cartridges 111, is substantially identical or of a similar construct.

Figure 4A:
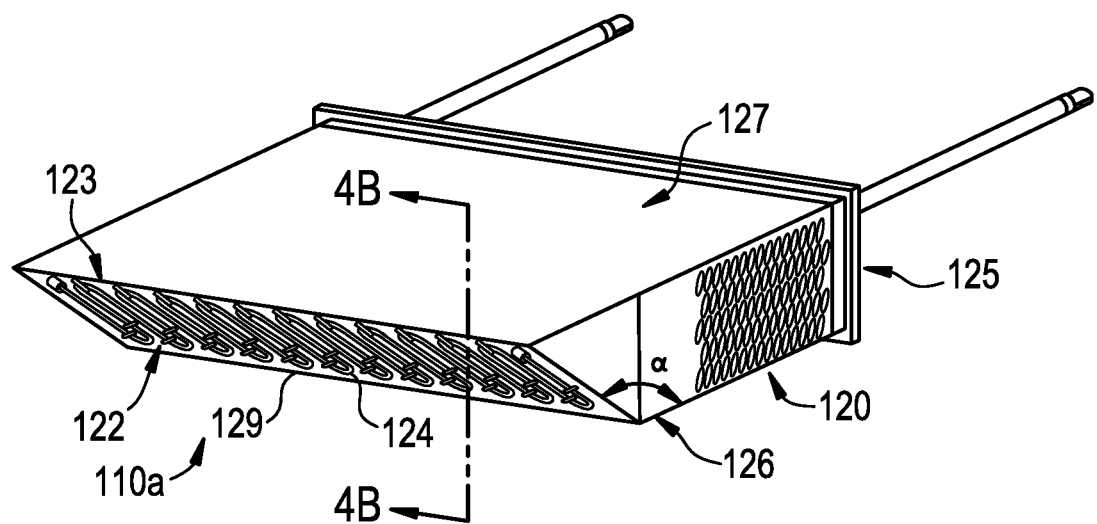
FIG. 4A schematically depicts a replaceable heating cartridge for use in an apparatus for making glass according to one or more embodiments shown and described herein.
Figure 4B:
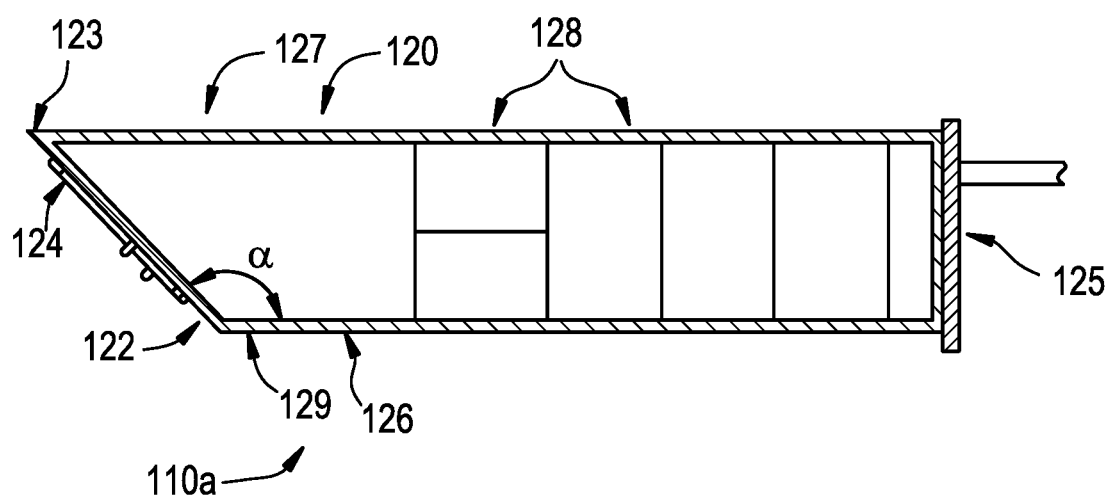
FIG. 4B schematically depicts a cross section of the replaceable heating cartridge along line 4B-4B of FIG. 4A.
Figure 5:
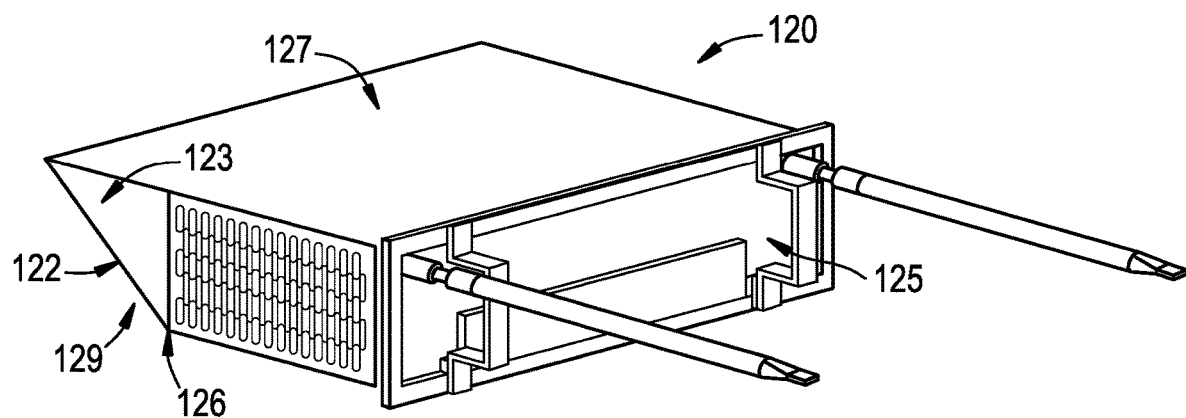
FIG. 5 schematically depicts a perspective back view of the replaceable heating cartridge of FIG. 4A according to one or more embodiments shown and described herein.

Referring now to FIGS. 3-5, in embodiments, each of the first plurality of heating cartridges 110 includes an enclosure 120 having a heat directing surface 122 with at least one heating element 124 positioned on or adjacent to the face thereof. The enclosure 120 may be fabricated from a variety of materials suitable for use at the elevated temperature conditions associated with the glass forming apparatus 10. For example, the enclosure 120, and other portions of the heating cartridge 110a can be formed from a refractory material such as high temperature nickel-based alloys, steel (e.g., stainless steel), or other alloys or materials (or combinations of materials), to meet the structural and/or thermal parameters associated with the glass forming apparatus 10. For example, in one embodiment, the enclosure 120 may be made of nickel-based alloys, such as Haynes® 214® nickel-based alloy produced by Haynes International, Inc.

While FIGS. 3-5 depict the heating cartridge 110a as comprising an enclosure, it should be understood that other embodiments are contemplated and possible. For example, rather than including a separate enclosure 120, the heat directing surface 122 may be affixed to a block (or blocks) of refractory materials instead of having a separate enclosure formed from metals/alloys. For example and without limitation, in embodiments, the heat directing surface is affixed to a body formed from NA-33 refractory blocks produced by ANH refractories.

In one embodiment, the heat directing surface 122 of the heating cartridge 110a is formed from a ceramic refractory backer material with low emissivity. Suitable ceramic refractory materials include, without limitation, SALI board available from Zircar ceramics. Portions of the heating cartridge 110a which are not directly exposed to the high temperatures of the glass forming apparatus 10 may be made from materials suitable for lower temperature applications. For example, when the heating cartridge 110a comprises an enclosure, the back face 125 of the enclosure 120 may be made from stainless steel selected to meet the structural and/or thermal parameters associated with the glass forming apparatus 10, such as, for example, 420 stainless steel.

In the embodiments described herein, the heat directing surface 122 of the heating cartridge 110a is oriented at an angle α with respect to a bottom surface 126 of the heating cartridge 110a. In the embodiments described herein, the angle α is greater than 90°. For example, in certain embodiments, the angle α of the heat directing surface 122 may be from about 120° to about 150° relative to the bottom surface 126 of the heating cartridge 110a. In other embodiments, the angle α of the heat directing surface 122 may be from about 130° to about 140° relative to the bottom surface 126 of the heating cartridge 110a. In specific embodiments, the angle α of the heat directing surface 122 is about 135° relative to the bottom surface 126 of the heating cartridge 110a.

In some embodiments, the downward-facing orientation of the heat directing surface 122 facilitates positioning the heating cartridge 110a in the housing 14 of the glass forming apparatus 10 such that the heat directing surface 122 of each replaceable heating cartridge faces the root 70 of the forming vessel 60. Specifically, the downward facing orientation of the heat directing surface 122 enables the heat directing surface 122 to radiate and direct heat toward and onto the root 70 of the forming vessel 60 with only minimal loss of heat to the surrounding environment, particularly to areas above the root 70, such as areas above the heating cartridge.

Referring again to FIGS. 1-3, in some embodiments, the heating cartridge 110a is positioned in the housing 14 of the glass forming apparatus 10 such that the upper edge 123 of the heat directing surface 122 and the top surface 127 of each heating cartridge 110a are positioned above the root 70. This positioning enables the heat directing surface 122 of the heating cartridge 110a to direct heat towards and onto the root 70 of the forming vessel 60, thereby increasing the temperature of the root 70 as well as the temperature of the molten glass flowing over the forming vessel 60 in the area of the root 70. For instance, as depicted in FIG. 1, the heating cartridge 110a can be positioned entirely upstream from the root 70. In alternative embodiments, as depicted in FIG. 3, the heating cartridge 110a can be positioned partially upstream from the root 70. For example, the top surface 127 of the heating cartridge 110a, can be positioned upstream from the root 70 while the bottom surface 126 of the heating cartridge 110a is positioned downstream from the root 70. Positioning the heating cartridge 110a partially upstream from the root 70 may provide adequate heating to the root 70 to prevent devitrification of the molten glass while reducing heat loss to non-target areas above the root 70 due to the angled heat directing face of the heating cartridge. Further, positioning the heating cartridge 110a partially upstream from the root 70 may allow the heating cartridge, specifically the heat directing surface 122, to be positioned closer to the root 70 such that a greater amount of heat is incident on the root 70 and the molten glass flowing over the root 70.

More specifically, the angle of the heat directing surface 122 and the position of the heating cartridge 110a within the housing 14 is such that the view factor from the heat directing surface is greater for objects (such as the root 70 of the forming vessel 60) located below the top surface 127 of the heating cartridge 110a than objects located above the top surface 127 of the heating cartridge 110a. The term "view factor," as used herein, refers to the relative proportion of thermal radiation from the heat directing surface 122 which is incident on the specified surface. For example, because the view factor from the heat directing surface 122 is greater for objects (such as the root 70 of the forming vessel 60) located below the top surface 127 of the heating cartridge 110a than objects located above the top surface 127 of the heating cartridge 110a, objects located below the top surface 127 of the heating cartridge 110a will receive a greater amount of heat flux from the heat directing surface 122 of the heating cartridge 110a than objects located above the top surface 127 of the heating cartridge 110a.

In some other embodiments (not shown), the heating cartridge 110 may be positioned downstream of the root 70 (i.e., in the −x direction). In these embodiments, the heat directing face of the heating cartridge may be angled to direct heat towards the root 70 as the heat rises along the angled heat directing face.

In the embodiments described herein, it should be understood that the heating cartridge 110a can function as both a heater for heating the root 70 as well as a thermal shield to thermally isolate and shield the area above the heating cartridge 110a from an area below the heating cartridge 110a, thereby preventing the loss of heat from the root 70 and molten glass flowing over the root 70 to non-target areas located above of the root 70 of the forming vessel 60. Specifically, as described above, the heat directing surface 122 of the heating cartridge 110a is oriented at an angle α that is greater than 90° with respect to the bottom surface 126 of the heating cartridge 110a. As such, the top surface 127 of the heating cartridge 110a and the upper edge 123 of the heat directing surface 122 are cantilevered over the lower edge 129 and bottom surface 126 of the heating cartridge 110a. This arrangement of the heat directing surface 122 creates the view factor of the heating cartridge as described herein. In addition, the cantilevered arrangement of the heat directing surface 122 extends the heat directing surface 122 across a gap 170 between the heat directing surface 122 and the forming vessel 60, decreasing the spacing between the forming vessel 60 and the heating cartridges and slowing the loss of heat from areas downstream of the root to areas of the glass forming apparatus 10 located upstream of the root 70 of the forming vessel 60. As such, the heating cartridge 110a also thermally shields areas above the heat directing surface 122 from areas below the heat directing surface 122.

Still referring to FIGS. 4-5, the heating element 124 positioned on or adjacent to the heat directing surface 122 is a resistance heating element. In certain embodiments, the material of the resistance heating element can be molybdenum disilicide. In some embodiments, the heating element 124 may be constructed from wire formed from molybdenum disilicide. For example and without limitation, in one embodiment the heating element 124 may be constructed from a molybdenum disilicide wire that is positioned on the heat directing surface 122 in a serpentine shape. By way of example and not limitation, a heating element 124 formed from molybdenum disilicide can include a winding element positioned on the heat directing surface 122. The ends of the heating element 124 extending through the heating cartridge 110a may have a diameter selected to minimize power losses away from the heat directing surface 122.

It has been determined that forming heating cartridge as described herein can greatly improve the heating efficiency of the heating cartridge. This may be attributable to the increased power-carrying capacity of the molybdenum disilicide heating element compared to other materials as well as the additional refractory material insulation and the angled heat directing surface. Further, it has also been found that the combination of segmented heating cartridges, such as the heating cartridges described herein, and molybdenum disilicide heating elements allows for higher forming temperatures at the root 70 than other conventional heating element materials. This enables, for example, the use of higher forming temperatures which, in turn, prevents devitrification of molten glass and mitigates defects in the glass ribbon drawn from the root 70 of the forming vessel 60. Additionally, with forming temperatures at the root 70 being equal, molybdenum disilicide heating elements advantageously achieve such forming temperatures with lower power input than used with conventional heating element materials.

While FIG. 4A depicts a single heating element 124 positioned on the heat directing surface 122 of the heating cartridge 110a, it should be understood that other configurations are contemplated and possible. For example, in some embodiments, the heating element 124 may be a segmented heating element which includes two or more separate heating elements, each of which may be separately powered and controlled. This allows the heat directing surface 122 of the heating cartridge 110a to be formed with individual heating zones which may be independently controlled, thereby providing more refined control of the temperature profile of the heat directing surface 122.

Still referring to FIGS. 4-5, located behind the face of the heat directing surface 122 are one or more blocks of refractory material 128 which insulate the heat directing surface 122 from the balance of the heating cartridge 110a. These blocks of refractory material 128 may be located within an enclosure 120 as depicted in FIGS. 4 and 5 or, alternatively, attached directly to the heat directing surface 122 without an enclosure. In certain embodiments the refractory materials 128 are oriented to minimize heat transfer from the heat directing surface 122. Specifically, in certain embodiments, the refractory materials 128 are oriented in alternating vertical stacks and horizontal stacks, as it is believed that alternating vertical stacks and horizontal stacks of refractory material 128 may assist in reducing heat at seams between the blocks. In certain embodiments, the refractory material 128 can be oriented at an angle approximately equal to the angle of the heat directing surface 122. In still other embodiments, such as where the heat directing surface 122 is formed from a refractory material such as SALI board or the like, the refractory material of the heat directing surface 122 may extend into the enclosure. In the embodiments described herein, the refractory material 128 may be commercially available refractory materials including, without limitation, SALI board, Insulating Fire Brick (IFB), DuraBoard® 3000 and/or DuraBoard® 2600. In certain embodiments, the refractory blocks may have a first layer closest to the heat directing surface 122 formed from SALI board and a second layer located behind the first layer formed from IFB.

A variety of attachment structures may be used to mount the heating cartridge 110a with respect to the root 70. In some embodiments, the heating cartridge 110a may be mounted on a bracket 114 engaged with the housing 14 and/or the housing seal plate 136, as depicted in FIG. 3. Additionally or alternatively, the heating cartridge 110a can rest on T-wall support brackets 116 that are attached to housing 14 and/or the housing seal plate 136, as depicted in FIG. 2. In some embodiments, each of the heating cartridges is removably mounted in the ports of the housing 14 of the glass forming apparatus 10. Each individual heating cartridge can be independently controlled so that using the plurality of heating cartridges one can reach a desired temperature distribution across the root of the forming wedge. Moreover, the separate nature of each heating cartridge minimizes the impact of a failed heating element and/or the replacement of a heating cartridge. That is, in the event that a single heating element fails during operation, the failure of that heating element results in the loss of only a fraction of the total heating. Moreover, because the heating cartridges are separately controlled, the adjacent heating cartridges may be individually adjusted to offset the loss of heating from a failed heating element. Further, the modular nature of the heating cartridges means that replacement of an individual cartridge impacts only a fraction of the total heating provided, thereby reducing production losses.

In certain embodiments, the apparatus may further include a controller 180 configured to control heating associated with the plurality of heating cartridges 110,111. In certain embodiments the controller 180 may be operably connected to each heating cartridge of the plurality of heating cartridges 110,111, as depicted in FIG. 1. In certain embodiments, control of individual ones of the plurality of heating cartridges 110,111 can be segmented. The term "segmented," as used herein, refers to the ability to independently control and adjust the temperature of each individual heating cartridge in order to provide managed control of the temperature of the glass ribbon during manufacture. The controller may include a processor and memory storing computer readable and executable instructions which, when executed by the processor, individually regulates the power to each heating cartridge, thereby individually increasing or decreasing the heat provided by each heating cartridge based on temperature feedback or other process parameters. Thus, the controller 180 may be used to differentially regulate the power that is provided to each heating cartridge of the plurality of heating cartridges 110,111 that span the width of the root 70 and the width of the draw plane 72 of the glass ribbon 12.

In certain embodiments, the controller 180 can be configured to individually operate each heating cartridge of the plurality of heating cartridges 110,111 based on thermal feedback from the glass forming apparatus. For example, in one embodiment the controller 180 is configured to obtain thermal feedback from a thermal sensor 182, as depicted in FIG. 1. The feedback obtained by the thermal sensor can be used by the controller 180 to individually adjust each heating cartridge of the plurality of heating cartridges 110, 111 in order to provide managed control of a thermal characteristic of the apparatus as the manufacture of glass ribbon proceeds. The thermal characteristic can include, for example, the temperature and/or heat loss associated with: a portion of the glass forming apparatus, such as the heat directing surface 122 of each heating cartridge of the plurality of heating cartridges 110,111; a portion of the edge directors 80a, 80b; a portion of the end of the forming vessel 60; portions of the molten glass; and/or other features of the glass forming apparatus 10.

In one embodiment, the thermal sensor 182 may detect a temperature above a target level and the controller 180 may reduce power to at least one heating cartridge of the plurality of heating cartridges 110,111 such that less heat is transferred to the target area, thereby reducing the temperature until the target level temperature is obtained. Alternatively, in certain embodiments the thermal sensor 182 may detect a temperature below a target level, wherein the controller 180 may increase power to at least one heating cartridge of the plurality of heating cartridges 110,111, such that more heat is transferred to the target area, thereby increasing the temperature until the target level temperature is obtained.

As noted above and in additional embodiments, one or more heating cartridges or similar devices can be provided proximate to the edge directors 80a, 80b or a portion thereof as well as a portion of the end of the forming vessel 60. For example and with reference to FIGS. 27 and 28, a first end of the forming vessel 60 can be provided with a first edge director 80a. Likewise, an opposing second end (not shown) of the forming vessel 60 can include a second edge director 80b that, in some embodiments, can be a mirror image of the first edge director 80a. The first edge director 80a will be described with reference to FIG. 27 with the understanding that such description can similarly or identically apply to the second edge director 80b as well. Indeed, in some embodiments, the second edge director 80b can be identical to the first edge director 80a. In some embodiments, at least a portion or the entire forming vessel 60 may be housed within a housing 14 (see, e.g., FIG. 1) designed to help maintain desired atmospheric conditions. For instance, in some embodiments, the housing 14 may be designed to help maintain the temperature of the atmosphere with in a desired temperature range. In some embodiments, as shown schematically in hidden lines in FIG. 28, the housing 14 may have opposed lower doors 142a, 142b defining an opening 202 below the root 70 for the glass ribbon 12 to be drawn through. The width of the opening 202 can be small enough to reduce heat loss through the opening but also large enough to prevent interference with the glass ribbon 12 being drawn through the opening 202.

Figure 27:
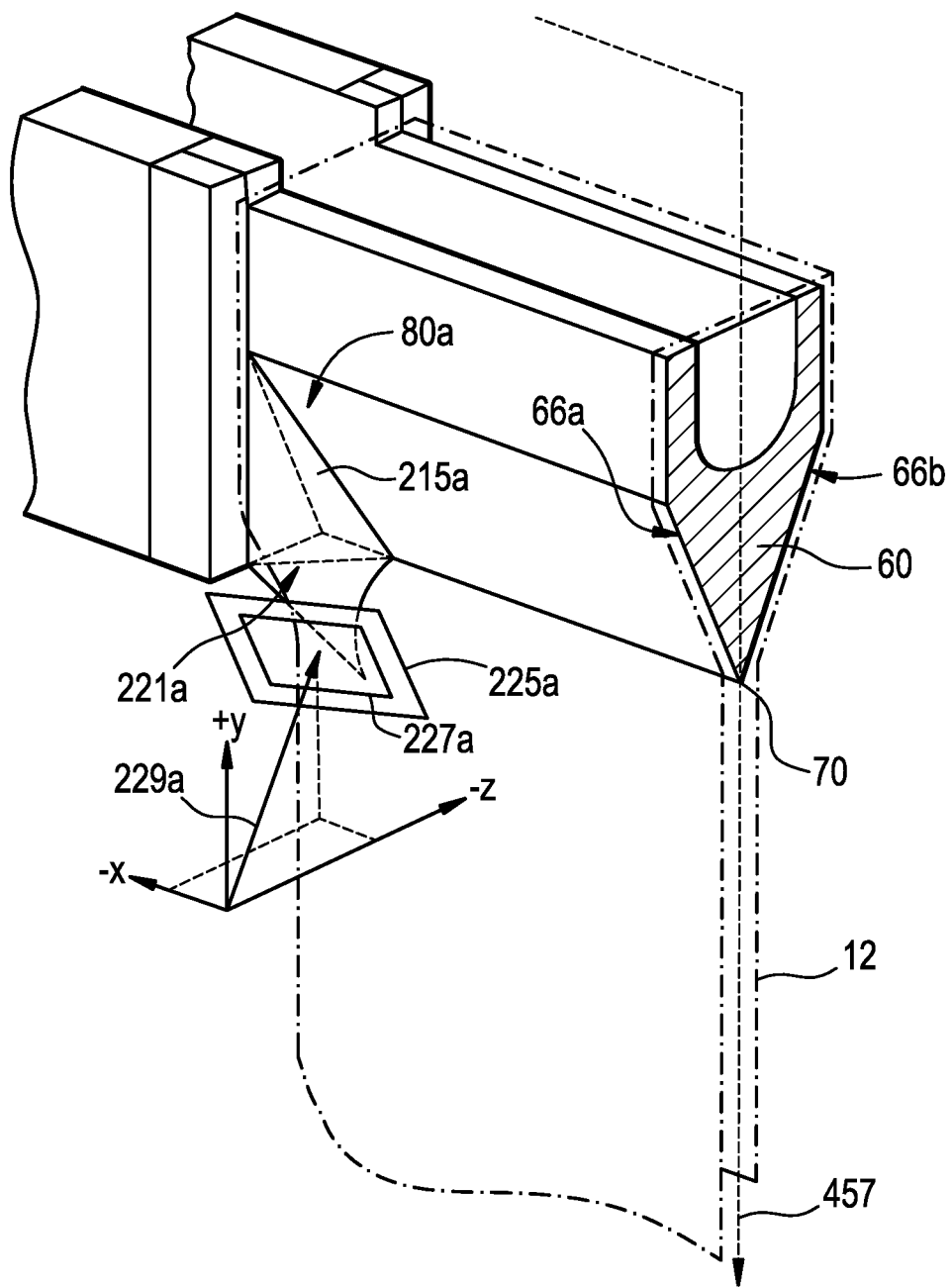
FIG. 27 is a perspective view of a cross-sectional view of the fusion down-draw apparatus of FIG. 2.
Figure 28:
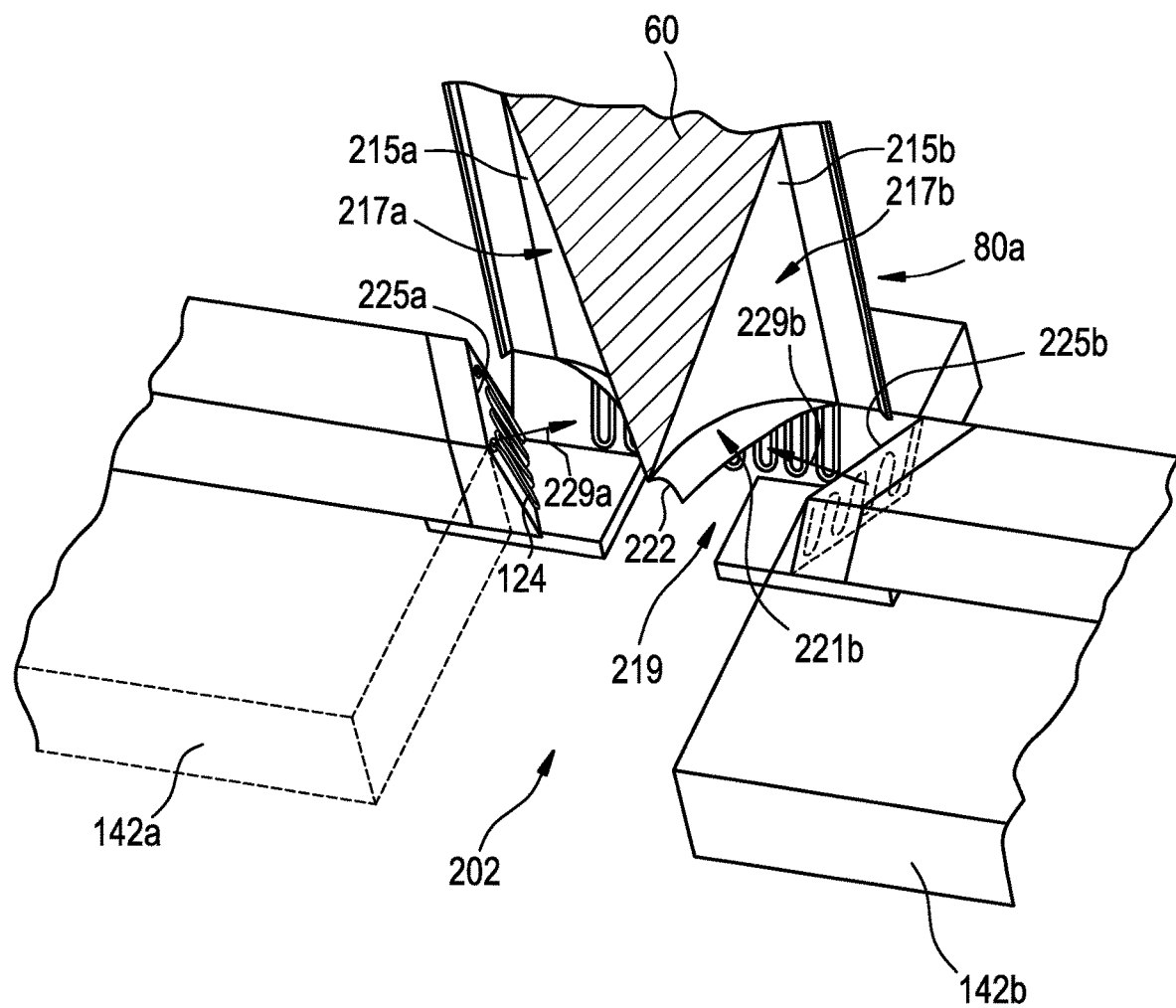
FIG. 28 is another perspective view of a cross-sectional view of the fusion down-draw apparatus of FIG. 2.

In some embodiments, the first edge director 80a and the second edge director 80b each intersect with at least one of the pair of downwardly inclined surface portions 66a, 66b. Indeed, as shown, a first outwardly facing contact surface 217a of a first upper portion 215a of the first edge director 80a can intersect with the first downwardly inclined surface portion 66a of the first edge director 80a, and a second outwardly contact surface 217b of a second upper portion 215b of the second edge director 80b can intersect the second downwardly inclined surface portion 66b of the second edge director 80b. Embodiments described herein can include a heating plane including a heat footprint facing the surface of a proximate edge director. As shown in FIGS. 27 and 28, a pair of heating planes may optionally be provided for one or both edge director 80a, 80b. For instance, the first edge director 80a can be provided with a first heating plane 225a and a second heating plane 225b with the understanding that the second edge director 80b may likewise be provided with a similar or identical first and second heating plane in some embodiments. While each edge director may be provided with a single heating plane, providing first and second heating planes, as shown, can allow heating of the outer contact surfaces that face away from one another and contact a corresponding portion of the converging streams of molten material upstream, such as immediately upstream of where the edges of the streams fuse together as they are drawn off an inner edge 222 of the edge director.

As shown, in some embodiments, the second heating plane 225b may be a mirror image of the first heating plane 225a about the draw plane 72 of the glass ribbon. For instance, in some embodiments, the second heating plane 225b can be an identical mirror image of the first heating plane 225a although different configurations may be provided in further embodiments. As such, a description of the first heating plane 225a and associated heat footprint 227a associated with the first outwardly facing contact surface 221a of the first edge director 80a will be described with the understanding that such description of the features and orientation may similarly or equally apply to the second heating plane 225b and associated heat footprint 227b associated with the second outwardly facing contact surface 221b of the first edge director 80a. Furthermore, in some embodiments, a first heating plane (not shown) and/or a second heating plane (not shown) associated with the second edge director 80*b* may be a mirror image of the first and second heating planes 225*a*, 225*b* associated with the first edge director 80*a*.

In some embodiments, the first heat footprint 227*a* of the first heating plane 225*a* may face at least the first outwardly facing contact surface 221*a* of the lower portion 219 of the first edge director 80*a*. A projection 228*a* of the first heat footprint 227*a* in a first resultant direction 229*a* of the first heating plane 225*a* within the first heat footprint 227*a* can intersect the first outwardly facing contact surface 221*a* of the first edge director 80*a* as shown by shaded contact area 403*a*.

As further illustrated in the figures, the second heat footprint 227*b* of the second heating plane 225*b* may face at least the second outwardly facing contact surface 221*b* of the lower portion 219 of the first edge director 211*a*. A projection 228*b* of the second heat footprint 227*b* in a second resultant direction 229*b* of the second heating plane 225*b* within the second heat footprint 227*b* can intersect the second outwardly facing contact surface 221*b* of the first edge director 211*a* as shown by shaded contact area 403*b*.

The first resultant direction 229*a* associated with the first heating plane 225*a* will be described with reference to FIG. 27 with the understanding that other resultant directions of the disclosure may have similar or identical features to the first resultant direction 229*a*. The resultant direction is considered the effective direction of all the directions normal (i.e., perpendicular) to the surface of the heating plane within the heat footprint. For instance, the first heating plane 225*a* within the heat footprint 227*a* of FIG. 27 is shown as a flat planar surface. Consequently, the resultant direction is the direction perpendicular to the flat planar surface. However, the heating plane within the heat footprint need not be planar in some embodiments. For instance, the heating plane within the heat footprint can also comprise a concave surface and in such embodiments, the resultant direction would be considered the sum of all the normal directional vectors (i.e., normal at a line or plane of tangency) at each point on the heating plane within the heat footprint. Likewise, a heating plane within a respective heat footprint may also comprise a convex surface. In such embodiments, the resultant direction would be considered the sum of all the normal directional vectors (i.e., normal at a line or plane of tangency) at each point on the heating plane within the heat footprint.

Providing the heating plane 225*a*, 225*b* with different shapes can help the heating plane more closely face the contact surfaces of the edge directors 80*a*, 80*b* to be heated. In some embodiments, the distance between all portions of the heating plane within the heat footprint can be positioned approximately the same distance, or within a distance range, from the corresponding contact surface of the edge director. As such, all portions of the heat footprint can effectively face the corresponding portions of the contact surface in the resultant direction to minimize the distance and thereby maximize radiative heat transfer between from the heating plane to the contact surface of the edge directors. Exemplary heating planes may be provided with a heating element such as a heating coil designed to provide radiative heat. The heating coil can be positioned on the heating plane with an outer periphery of the heating coil defining the heat footprint. Radiative heat projecting in the resultant direction from the heating element may intersect the facing contact surfaces of the edge directors. In other embodiments, the heating plane may comprise a heating plate or other heating element with the outer periphery of the heating plate or heating element defining the heat footprint of the heating plane. For instance, a heating plate may be heated on a hidden side by a torch with heat conducting through the plate and radiating from the facing surface of the plate to intersect the contact surfaces of the edge directors. Such a configuration can avoid exposing the molten material to a heated gas stream that may interrupt to the flow of molten material over the contact surfaces. Such targeting of radiative heat to the surface of the edge directors in contact with the molten material as described above and illustrated in FIGS. 27 and 28 can reduce undesired attenuation of the width of a low viscosity glass ribbon by reducing application of unnecessary heat to other portions of the molten material and/or edges of the glass ribbon being drawn from the root of the forming vessel.

Referring again to FIG. 2, typically, more heat is lost to the surrounding environment on the two outer ends (in the width-wise direction of the forming vessel, i.e., +/−y direction) of the draw plane 72 of the glass ribbon 12 than is lost to the surrounding environment in the middle of the draw plane 72. As such, the controller 180 may provide more power and heat to the heating cartridges of the plurality of heating cartridges 110, 111 that are located proximate the edges (the +/−y direction of the coordinate axes depicted in FIG. 2) of the draw plane 72 of the glass ribbon 12 than to the heating cartridges located in the middle of the draw plane 72 to compensate for both the heat lost in these areas as well as to account for the greater thickness of glass proximate the edges of the draw plane 72.

In certain embodiments, the controller can be configured to individually operate each heating cartridge of the plurality of heating cartridges 110, 111 based on thermal feedback from the glass forming apparatus 10. For example, in one embodiment the controller is configured to obtain thermal feedback from at least one thermal sensor (not shown) positioned proximate to the root 70 of the forming vessel 60. The feedback obtained by the at least one thermal sensor can be used by the controller to individually adjust each heating cartridge of the plurality of heating cartridges 110, 111 in order to provide managed control of a thermal characteristic of the apparatus as the manufacture of glass ribbon proceeds. The thermal characteristic can include, for example, the temperature and/or heat loss associated with: a portion of the glass forming apparatus 10, such as the heat directing surface 122 of a heating cartridge 110*a*; the root 70; a portion of the end of the forming vessel 60; portions of the molten glass; and/or other features of the glass forming apparatus 10.

In one embodiment, the at least one thermal sensor may detect a temperature above a target level and the controller may individually reduce power to at least one of heating cartridges of the plurality of heating cartridges 110, 111 such that less heat is transferred to the target area, thereby reducing the temperature until the target level temperature is obtained. Alternatively, in certain embodiments the at least one thermal sensor may detect a temperature below a target level, wherein the controller may individually increase power to at least one of the heating cartridges of the plurality of heating cartridges 110, 111, such that more heat is transferred to the target area, thereby increasing the temperature until the target level temperature is obtained.

While FIGS. 1-3 schematically depict one embodiment of a glass forming apparatus 10 in which heating cartridges 110*a*-110*e* are positioned proximate a root 70 of the forming wedge 62, it should be understood that other embodiments are contemplated and possible. Referring to FIGS. 4A-4B, 5, 7, and 8 by way of example, in one embodiment the plurality of heating cartridges may be positioned proximate the trough 61 of the forming vessel 60. Specifically, the forming vessel 60 is positioned in a housing (not shown) and may include a trough 61 for receiving molten glass and a pair of downwardly inclined forming surface portions 66a, 66b converging at a root 70, as described hereinabove. A plurality of heating cartridges 110a-110e may be removably positioned in ports formed in the housing, as described hereinabove, such that a heat directing surface 122 of each of the heating cartridges faces the forming vessel 60 and an upper edge 123 of the heat directing surface 122 and a top surface 127 of the heating cartridge are positioned above the trough 61 of the forming vessel 60 to direct heat from the heat directing surface 122 of the heating cartridge towards the trough 61 of the forming vessel 60, thereby heating the glass at the top of the weirs 63 of the trough 61 of the forming vessel 60 and preventing devitrification.

More specifically, in these embodiments, each heating cartridge may have substantially the same structure as shown and described herein with respect to FIGS. 4A-4B and 5. In these embodiments, the angle α of the heat directing surface 122 of the heating cartridge 110a with respect to a bottom surface 126 of the heating cartridge 110a may also be greater than or equal to 90°. For example, in certain embodiments, the angle α of the heat directing surface 122 may be from about 120° to about 150° relative to the bottom surface 126 of the heating cartridge 110a. In other embodiments, the angle α of the heat directing surface 122 may be from about 130° to about 140° relative to the bottom surface 126 of the heating cartridge 110a. In specific embodiments, the angle α of the heat directing surface 122 is about 135° relative to the bottom surface 126 of the heating cartridge 110a.

In some embodiments, the heating cartridges 110a-110e may be positioned at an elevation relative to the forming vessel 60 such that a lower edge 129 of the heat directing surface and the bottom surface 126 of the heating cartridge are positioned below the top of the weirs 63. In these embodiments, the angle α of the heat directing surface 122 of the heating cartridge 110a with respect to a bottom surface 126 of the heating cartridge 110a may be greater than or equal to 90° such that heat from the heating cartridge is directed towards the trough 61 of the forming vessel 60. In some other embodiments, the heating cartridges 110a-110e may be positioned at an elevation relative to the forming vessel 60 such that a lower edge 129 of the heat directing surface and the bottom surface 126 of the heating cartridge are positioned above the trough 61. In these embodiments, the angle α of the heat directing surface 122 of the heating cartridge 110a with respect to a bottom surface 126 of the heating cartridge 110a may be greater than 90° such that heat from the heating cartridge is directed downward, towards the trough 61 of the forming vessel 60.

Figure 7:
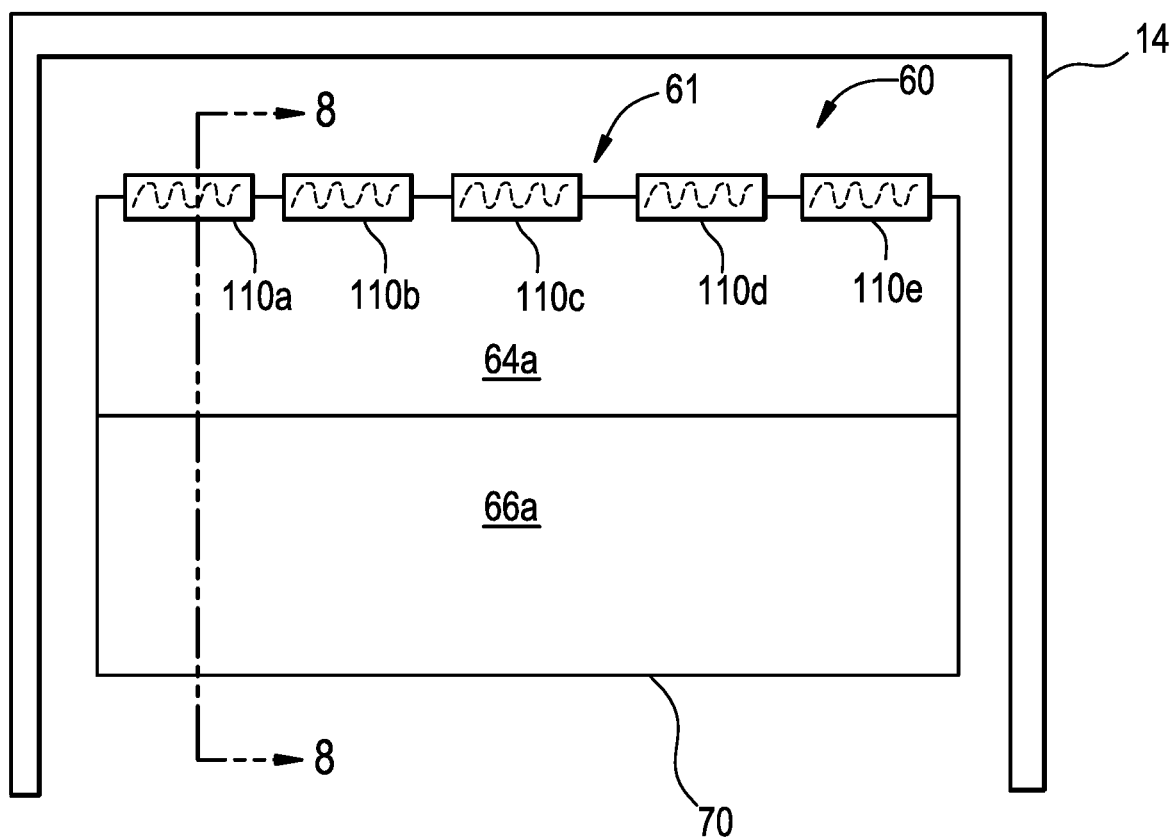
FIG. 7 schematically depicts another embodiment of a forming vessel of glass manufacturing apparatus with heating cartridges disposed proximate the trough of the forming vessel according to one or more embodiments shown and described herein.
Figure 8:
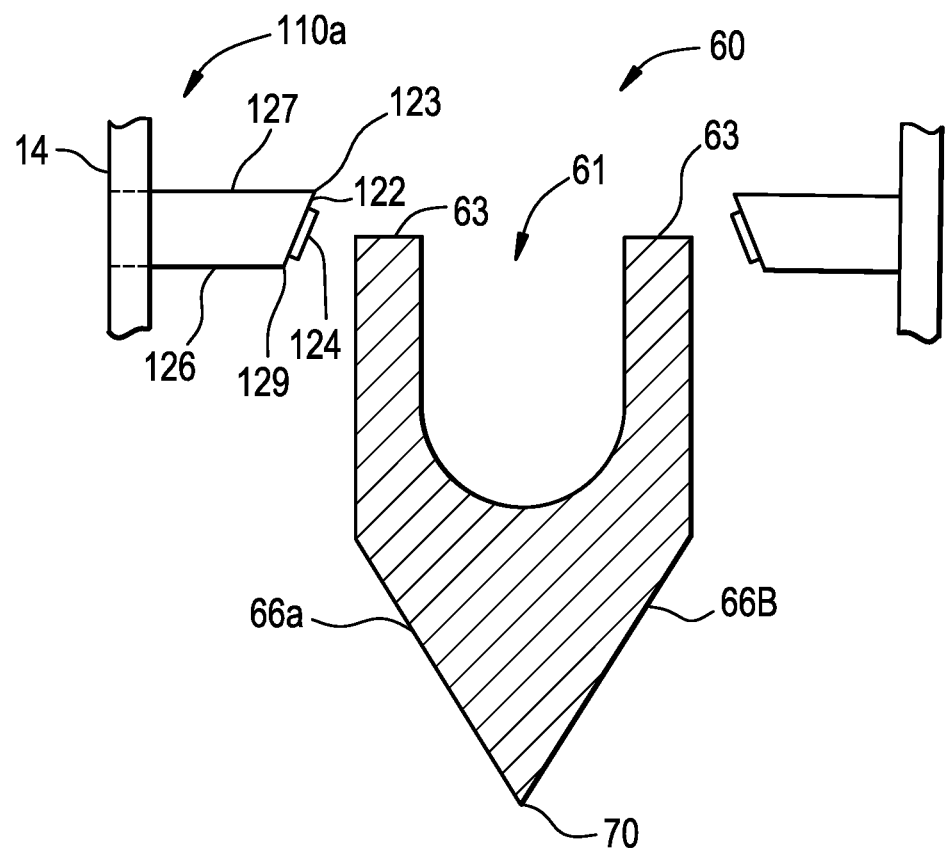
FIG. 8 schematically depicts a cross section, as taken along line 8-8 of the forming vessel of FIG. 7 according to one or more embodiments shown and described herein.
Figure 9:
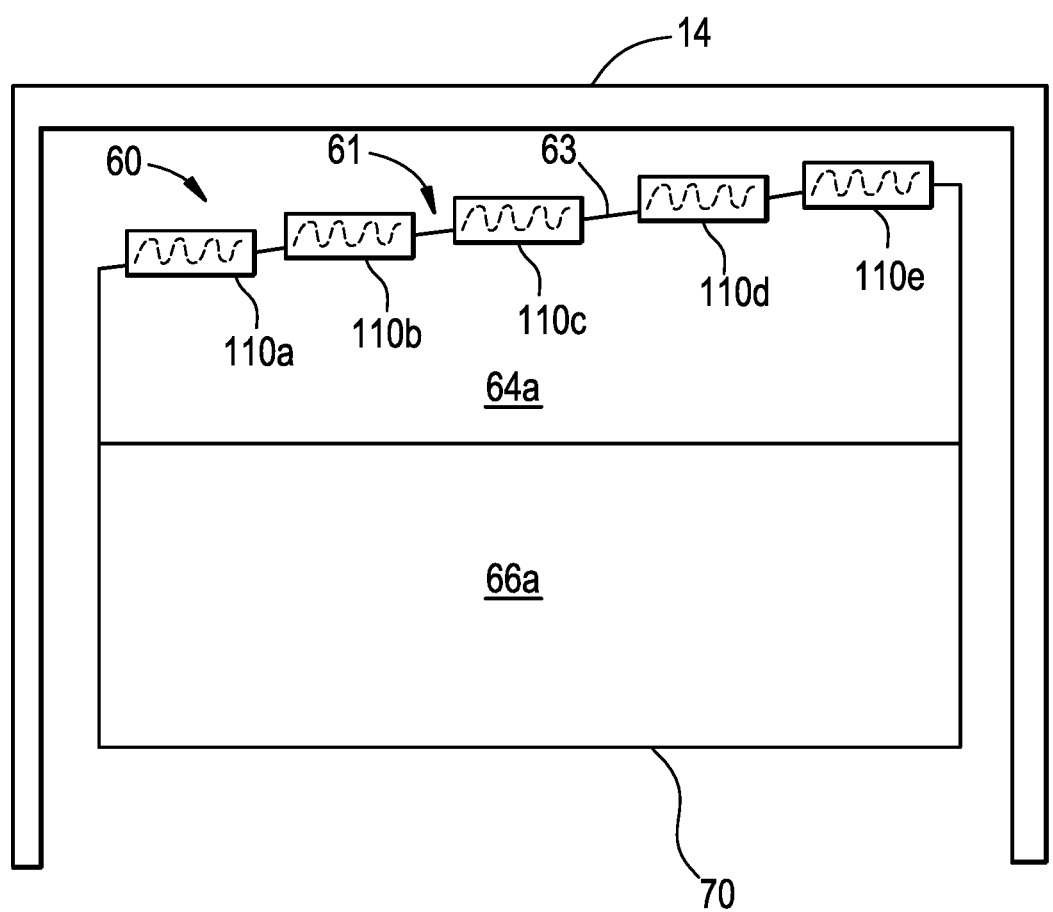
FIG. 9 schematically depicts another embodiment of a forming vessel of glass manufacturing apparatus with heating cartridges disposed proximate the trough of the forming vessel according to one or more embodiments shown and described herein.

In embodiments, the heating cartridges 110a-110e may be arranged across the width of the forming vessel 60 as depicted in FIG. 7. In some embodiments, each of the heating cartridges in the plurality of heating cartridges 110a-110e are positioned at substantially the same elevation in the +/−X-direction. However, in some embodiments, the plurality of heating cartridges 110a-110e may be arranged in a step-configuration, as depicted in FIG. 9. This configuration of heating cartridges may be used when the weirs 63 or sidewalls of the trough 61 have an angled configuration as depicted in FIG. 9.

In embodiments where the plurality of heating cartridges 110a-110e are positioned proximate the trough 61 of the forming vessel 60, the plurality of heating cartridges 110a-110e may be positioned in ports of the housing enclosing the forming vessel 60 and attached to the housing as described herein above with respect to FIGS. 2 and 3. In addition, the plurality of heating cartridges 110a-110e may be operated and controlled as described hereinabove with respect to FIGS. 2 and 3 to regulate the temperature of the molten glass proximate the trough 61 of the forming vessel 60 to prevent devitrification of the molten glass in the trough 61 and flowing over the forming body 61.

Figure 6:
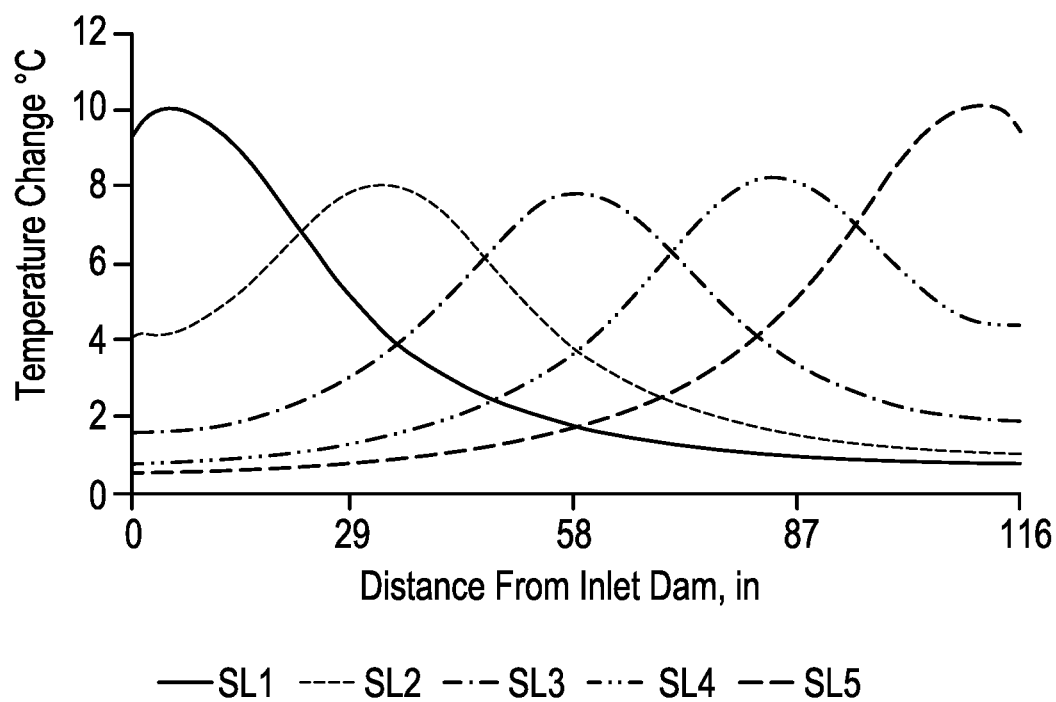
FIG. 6 graphically depicts a mathematical model of the root temperature response to individual power changes to heating cartridges comprising molybdenum disilicide heating elements as described herein.

As an example, FIG. 6 graphically depicts a mathematical model of the root temperature response to individual power changes to heating cartridges comprising molybdenum disilicide heating elements as described herein. The model is based on five replaceable heating cartridges (SL1, SL2, SL3, SL4, SL5), each having a heat directing surface 122 oriented at an angle α of about 135° relative to the bottom surface 126 of the heating cartridge. The heating cartridges were modeled as being positioned entirely upstream from the root 70 so as to effectively direct heat onto the root 70. The heating cartridges were configured to span across the width of the forming vessel. Each heating cartridge in the model was adjusted, one at a time, by 1000 W power increments provided to the molybdenum disilicide elements. The temperature responses from the 1000 W increment power changes in the model were measured in inches from the inlet dam of the forming vessel (i.e., proximate the end 64a of the forming vessel 60 depicted in FIG. 1.

The data of FIG. 6 indicates that individual power adjustments to each heating cartridge can provide a managed control of the temperature of localized areas across the width of the root. The temperature response of the root due to an incremental power change to a heating cartridge is highest in the localized area of the root closest to the adjusted heating cartridge. As the distance from the adjusted heating cartridge increases, the temperature response of the root decreases as show in FIG. 6. For example, the temperature response at the inlet dam due to the heating cartridge closest to the inlet dam (depicted as curve SL1 in FIG. 6) is greatest closest to the inlet dam and degrades with increasing distance from the inlet dam. Further, as shown in FIG. 6, variations in the temperature at the root can be mitigated through the use of multiple heating cartridges spaced across the width of the root. For example, as shown in FIG. 6, the heating cartridges can be spaced such that the effective heating area of each cartridge overlaps with another, thereby mitigating "cool spots" across the width of the root. That is, in FIG. 6, the temperature response curves SL1-SL5 overlap in the widthwise direction of the root, as indicated by the distance from the inlet dam depicted on the x-axis. This demonstrates that any thickness impact or temperature deviation that occurs across an area of root of the forming vessel can be easily corrected by individually adjusting/controlling the power to the heating cartridge that is correspondingly located in that area. Thus, the data indicates that the plurality of segmented and replaceable heating cartridges as disclosed herein can be easily adjusted to effectively reduce any devitrification of glass drawn across the root.

Figure 10:
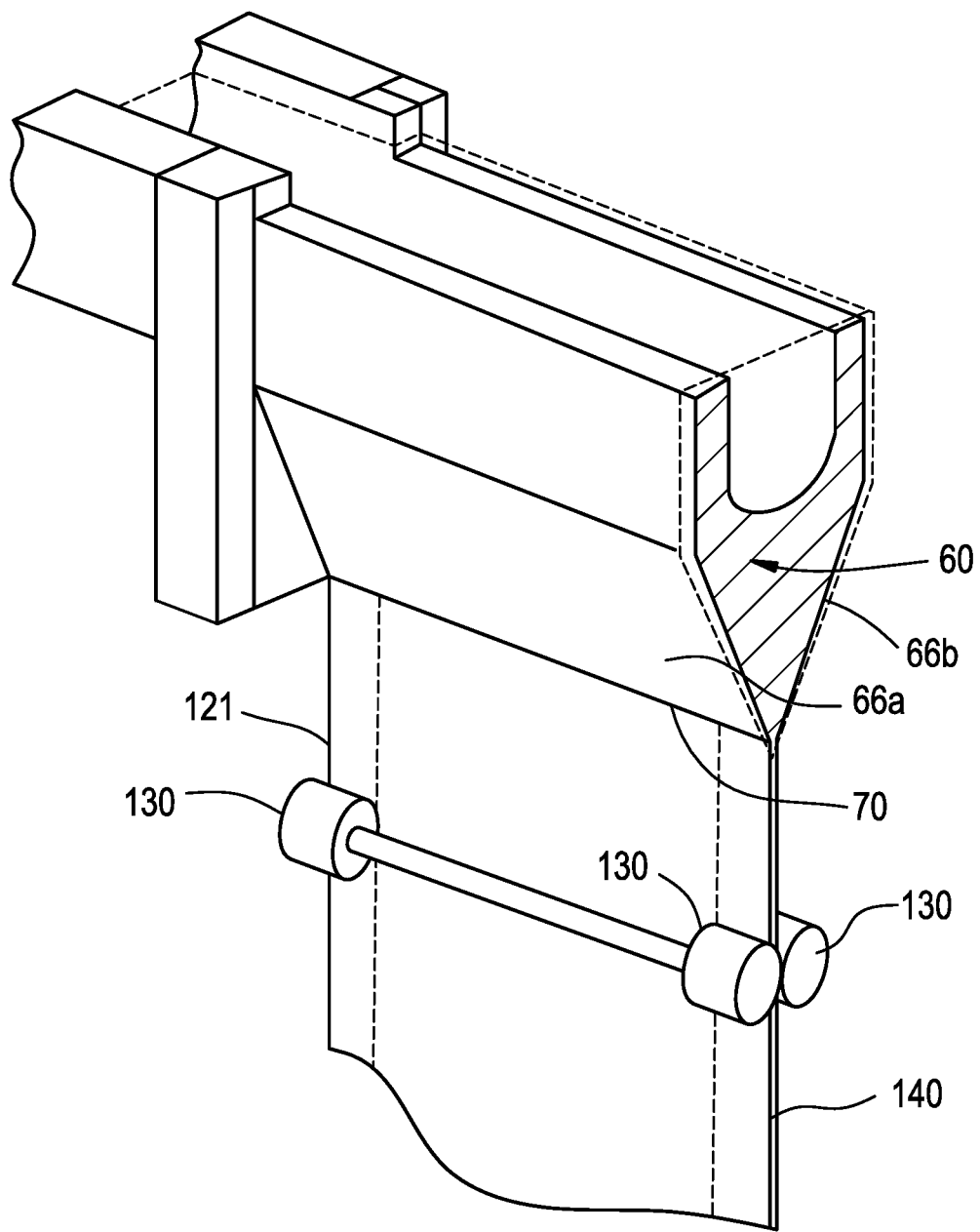
FIG. 10 is a perspective, partial cross sectional view of a fusion downdraw apparatus.

With continued reference to FIGS. 1-3 and with reference to FIG. 10, pulling rolls 130 may be placed downstream of the root 70 of the forming vessel 60 and may be used to adjust the rate at which the formed ribbon of glass leaves the converging forming surfaces and thus help determine the nominal thickness of the finished sheet. Suitable pulling rolls are described, for example, in U.S. Pat. No. 6,896,646, the content of which is incorporated in its entirety herein by reference.

The pulling rolls may be designed to contact the glass ribbon at its outer edges, specifically, in regions just inboard of the thickened beads which exist at the very edges of the ribbon. The glass edge portions 140, which are contacted by the pulling rolls, may be later discarded from the substrates after they are separated from the sheet.

In the drawing apparatus shown in FIG. 10, as a glass sheet (glass ribbon) travels down the drawing portion of the apparatus, the sheet experiences intricate structural changes, not only in physical dimensions but also on a molecular level. The change from a supple but thick liquid form at, for example, the root of the forming wedge, to a stiff glass sheet having a desired thickness may be achieved by a carefully chosen temperature field that delicately balances the mechanical and chemical requirements to complete the transformation from a liquid, or viscous, state to a solid, or elastic, state.

One advantage to the fusion forming process described above is that the glass sheet can be formed without the glass surface contacting any refractory forming surfaces. This provides for a smooth, contaminant-free surface. The fusion forming process also results in a glass sheet having a "fusion line" where the two glass ribbons overflowing each side of the forming vessel 60 meet and fuse together below the root 70. A fusion line is formed where the two flowing glass films fuse together. The presence of a fusion line is one manner of identifying a fusion drawn glass article. The fusion line may be seen as an optical distortion when the glass is viewed under an optical microscope. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact and such exemplary fusion forming techniques may be capable of forming flat, thin sheets within high tolerances. However, other sheet forming techniques may also benefit from the present disclosure, including, but not limited to, the slot draw and redraw forming techniques. In the slot draw technique, molten glass flows into a trough having a machined slot in the bottom. The sheets of glass may be pulled down through the slot. The quality of the glass may be dependent, among other things, on the accuracy of the machined slot. Redraw processes generally involve preforming a glass composition into a block, then reheating and drawing the glass into a thinner sheet product.

Figure 11:
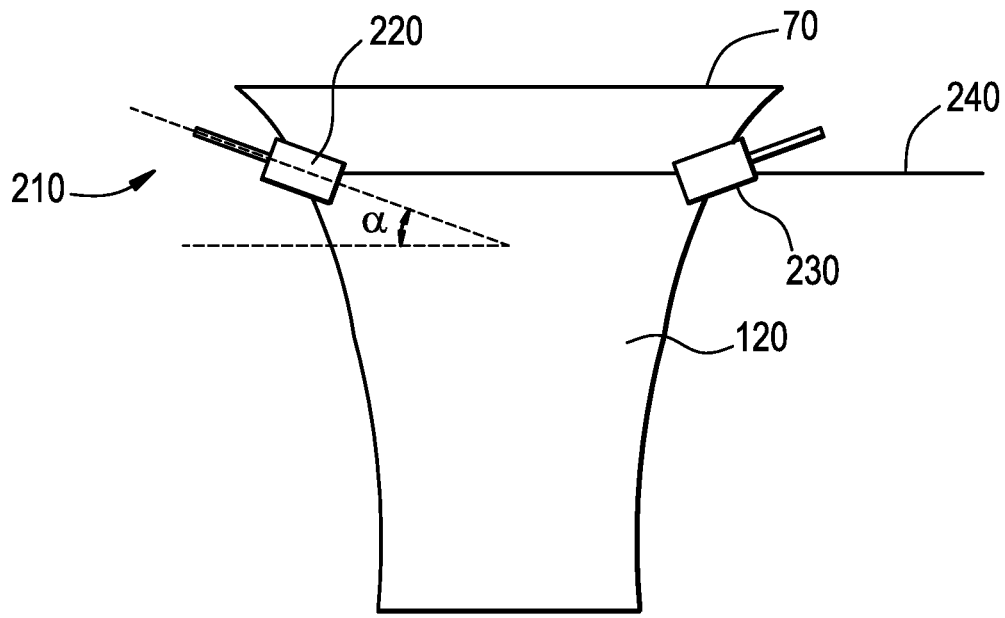
FIG. 11 is a side elevation view of an embodiment of a system for drawing sheet glass comprising a set of edge rolls.

Some embodiments of the system and method described herein can improve on the drawing apparatus shown in FIG. 10 by providing one or more sets of edge rolls 210 that may be configured to contact the edges of the glass ribbon while the glass ribbon may be in the viscous region of the drawing process. Of course, embodiments described herein are applicable to other glass forming processes such as a slot drawing process, a double fusion process, a float process, and the description of some embodiments with reference to the depicted drawing process should not limit the scope of the claims appended herewith. As shown in FIG. 11, at least one of the one or more sets of edge rolls may be oriented to provide a rotation axis that forms an angle α from horizontal in a fusion drawing process or from a line orthogonal to the direction of travel and parallel to a plane formed by the sheet of glass.

As used herein, each set of edge rolls 210 comprises a pair of edge rolls 220 configured to contact the first outer edge of the viscous ribbon of glass along both the front and back sides, or a first pair of edge rolls. The first pair of edge rolls 220 comprises an edge roll for contacting the front side of the glass ribbon and an edge roll for contacting the back side of the glass ribbon.

Each set of edge rolls 210 can also comprise a pair of edge rolls 230 configured to contact the second, or opposite, outer edge of the viscous ribbon of glass along both the front and back sides, or a second pair of edge rolls. The second pair of edge rolls 230 comprises an edge roll for contacting the front side of the glass ribbon and an edge roll for contacting the back side of the glass ribbon.

In some embodiments, any one the first pair of edge rolls 220 or the second pair of edge rolls 230 may be oriented to provide a rotation axis that forms an angle α from horizontal in a fusion drawing process or from a line orthogonal to the direction of travel and parallel to a plane formed by the sheet of glass. In other embodiments, both the first pair of edge rolls 220 and the second pair of edge rolls 230 may be oriented to provide a rotation axis that forms an angle from horizontal in a fusion drawing process or from a line orthogonal to the direction of travel and parallel to a plane formed by the sheet of glass. In further embodiments, neither the first or second pairs of edge rolls 220, 230 are oriented to provide a rotation axis forming such an angle. In other embodiments, both the first pair of edge rolls 220 and the second pair of edge rolls 230 may be oriented such that the angles α formed by each are substantially the same.

In some embodiments, the angle α may be between about 0 degrees and about 55 degrees, between about 0 degrees and about 45 degrees, between about 0 degrees and about 40 degrees, between about 0 degrees and about 35 degrees, between about 0 degrees and about 30 degrees, between about 0 degrees and about 25 degrees, between about 0 degrees and about 15 degrees, and all sub-ranges therebetween. Alternatively, in some embodiments, the angle α may be between about 3-7 degrees and about 55 degrees, between about 3-7 degrees and about 45 degrees, between about 3-7 degrees and about 40 degrees, between about 3-7 degrees and about 35 degrees, between about 3-7 degrees and about 30 degrees, between about 3-7 degrees and about 25 degrees, between about 5-7 degrees and about 15 degrees, and all sub-ranges therebetween.

The first pair of edge rolls 220 and the second pair of edge rolls 230 may be vertically aligned at a first position 240 below the root in a fusion drawing process or aligned with each other along the direction of travel of the sheet of glass. The position 240 may be based on a line extending horizontally between the center of the inward end of the first pair of edge rolls 220 and the center of the inward end of the second pair of edge rolls 230 in the exemplary fusion drawing embodiments or may be based on a line extending orthogonally to the direction of travel and parallel to a plane formed by the sheet of glass. The position 240 may be within the region within which the glass ribbon is in a viscous state.

In some embodiments, the vertical position 240 may be located close to the root 70. As used herein, the root 70 refers to the location where the separate glass streams converge to form a sheet or ribbon of pristine-surfaced glass 121 in a fusion drawn embodiment. Thus, in embodiments that comprise an edge director projection extending below the bottom of the inclined converging surface portions 66a, 66b, such as the sort described in U.S. Pat. No. 3,537,834, the entirety of which is incorporated herein by reference, the root 70 may be considered to be the tip of the edge director projection where the separate streams of glass converge at a fusion line.

In some embodiments, for example, the vertical or horizontal position 240 may be between about 3 cm and about 30 cm below the root 70. Alternatively, the vertical or horizontal position 240 may be between about 3 cm and about 25 cm below the root 70, between about 3 cm and about 20 cm below the root, between about 3 cm and about 18 cm below the root, between about 3 cm and about 16 cm below the root, between about 3 cm and about 14 cm below the root, between about 3 cm and about 12 cm below the root, between about 3 cm and about 10 cm below the root, and all sub-ranges therebetween.

The placement of a set of edge rolls 210 close to the root 70 may be particularly advantageous in preventing or minimizing sheet width variation as lateral contraction of the ribbon edge immediately below the root 70 is believed to be a primary factor in causing sheet width variation. Thus, by locating a set of edge rolls 210 close to the root 70, sheet width variation may be minimized or prevented altogether. Accordingly, in some embodiments, the vertical or horizontal position 240 may be less than 25 cm below the root 70, less than 20 cm below the root, less than 18 cm below the root, less than 16 cm below the root, less than 14 cm below the root, less than 14 cm below the root, less than 12 cm below the root, less than 10 cm below the root, and all sub-ranges therebetween.

Figure 12:
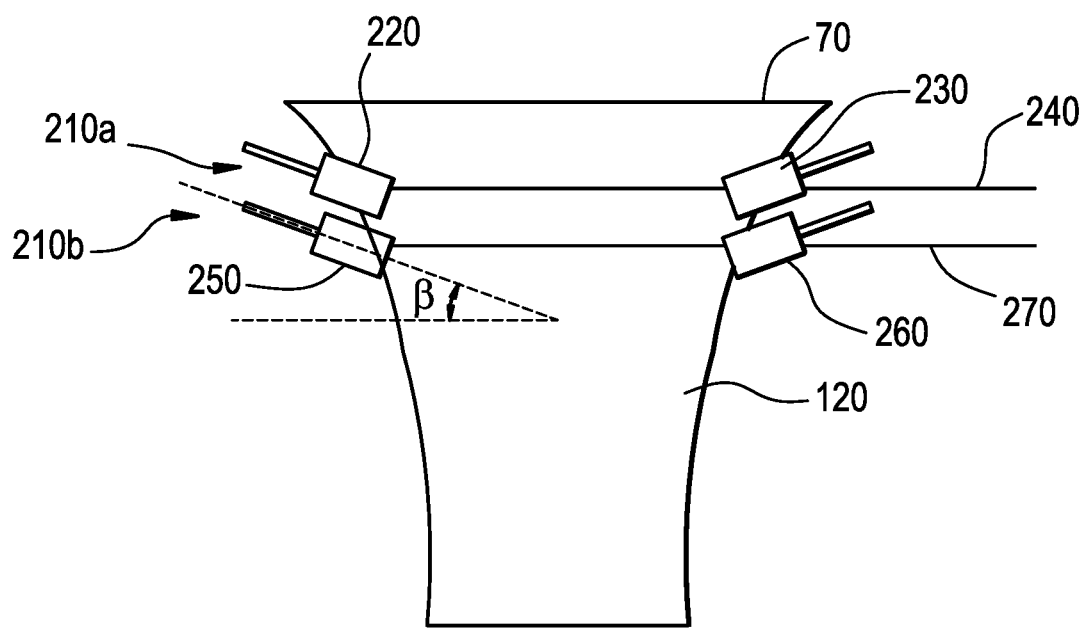
FIG. 12 is a side elevation view of an embodiment of a system for drawing sheet glass comprising a first set of edge rolls and a second set of edge rolls.

In some embodiments, more than one set of edge rolls 210 may be provided. For example, as shown in FIG. 12, a first set of edge rolls 210*a* and a second set of edge rolls 210*b* may be provided. Although not illustrated, it is contemplated that one may provide any number of additional sets of edge rolls in embodiments of the system and method described herein. For instance, embodiments may comprise three sets of edge rolls, four sets of edge rolls, etc.

As with the first set of edge rolls 210*a*, the second set of edge rolls 210*b* comprises a pair of edge rolls 250 configured to contact the first outer edge of the viscous ribbon of lass along both the front and back sides, or a third pair of edge rolls. The third pair of edge rolls 250 comprises an edge roll for contacting the front side of the glass ribbon and an edge roll for contacting the back side of the glass ribbon.

The second set of edge rolls 210*b* also comprises a pair of edge rolls 260 configured to contact the second, or opposite, outer edge of the viscous ribbon of glass along both the front and back sides, or a fourth pair of edge rolls. The fourth pair of edge rolls 260 comprises an edge roll for contacting the front side of the glass ribbon and an edge roll for contacting the back side of the glass ribbon.

Any one of the third pair of edge rolls 250 and/or the fourth pair of edge rolls 260 may be oriented to provide a rotation axis that forms an angle $\beta$ from horizontal in a fusion drawing process or from a line orthogonal to the direction of travel and parallel to a plane formed by the sheet of glass. In some embodiments both of the third pair of edge rolls 250 and the fourth pair of edge rolls 260 may be oriented to provide a rotation axis that forms an angle from horizontal in a fusion drawing process or from a line orthogonal to the direction of travel and parallel to a plane formed by the sheet of glass. In other embodiments neither of the third and fourth pairs of edge rolls 250, 260 are oriented in such a manner. In further embodiments, both of the third pair of edge rolls 250 and the fourth pair of edge rolls 260 are oriented such that the angles $\beta$ formed by each are substantially the same.

In some embodiments, the angle $\beta$ may be between about 0 degrees and about 55 degrees, between about 0 degrees and about 45 degrees, between about 0 degrees and about 40 degrees, between about 0 degrees and about 35 degrees, between about 0 degrees and about 30 degrees, between about 0 degrees and about 25 degrees, between about 0 degrees and about 15 degrees, and all sub-ranges therebetween. In other embodiments, the angle $\beta$ may be between about 3-7 degrees and about 55 degrees, between about 3-7 degrees and about 45 degrees, between about 3-7 degrees and about 40 degrees, between about 3-7 degrees and about 35 degrees, between about 3-7 degrees and about 30 degrees, between about 3-7 degrees and about 25 degrees, between about 3-7 degrees and about 15 degrees, and all sub-ranges therebetween. Alternatively, in further embodiments, the angle $\beta$ may be between about 15 degrees and about 55 degrees, between about 15 degrees and about 45 degrees, between about 15 degrees and about 40 degrees, between about 15 degrees and about 35 degrees, between about 15 degrees and about 30 degrees, between about 15 degrees and about 25 degrees, and all sub-ranges therebetween.

In some embodiments, the angle $\beta$ at which the second set of edge rolls 210*b* may be oriented is different from the angle $\alpha$ at which the first set of edge rolls 210*a* may be oriented. For example, it may be desirable to configure the second set of edge rolls 210*b* to form an angle $\beta$ which may be greater than the angle $\alpha$. In some embodiments, for example, the first set of edge rolls 210*a* may be oriented to form an angle between about 3 degrees and about 20 degrees and the second set of edge rolls 210*b* may be oriented to form an angle between about 15 degrees and about 40 degrees. Alternatively, the first set of edge rolls 210*a* may be oriented to form an angle between about 3 degrees and about 12 degrees and the second set of edge rolls 210*b* may be oriented to form an angle between about 15 degrees and about 30 degrees. Of course, these embodiments are exemplary only and should not limit the scope of the claims appended herewith.

The third pair of edge rolls 250 and the fourth pair of edge rolls 260 may be vertically aligned at a second position 270 in a fusion drawing process or aligned with each other along the direction of travel of the sheet of glass. The location of the second position 270 may be based on a line extending horizontally between the center of the inward end of the third pair of edge rolls 250 and the center of the inward end of the fourth pair of edge rolls 260 in the exemplary fusion drawing embodiments or may be based on a line extending orthogonally to the direction of travel and parallel to a plane formed by the sheet of glass. The location of the second position 270 may be within the region within which the glass ribbon is in a viscous state, but below the first position 240.

In some embodiments, the second position 270 may be between about 12 cm and about 50 cm below the root 70, between about 15 cm and about 50 cm below the root 70, between about 15 cm and about 45 cm below the root, between about 15 cm and about 40 cm, between about 15 cm and about 30 cm, between about 20 cm and about 45 cm below the root, between about 20 cm and about 40 cm below the root, between about 30 cm and about 45 cm below the root, between about 30 cm and about 50 cm below the root, and all sub-ranges therebetween.

In some embodiments, the second position 270 may be less than 24 cm below the first position 240, less than 22 cm below the first position, less than 20 cm below the first position, less than 18 cm below the first position, less than 16 cm below the first position, etc.

Each set of edge rolls 210 may independently be configured to run in either constant rotation speed mode or constant torque mode. For example, when sheet width variation/instability occurs, torque of edge rolls running in a constant-velocity mode can vary in a consistent manner with sheet width variation in terms of oscillation pattern and periods. Thus, a constant-torque mode can be used to maintain the tension applied by the edge rolls in a controllable manner, and in some embodiments, it may be desirable to have the first set of edge rolls 210a run in a constant torque mode and to have the second set of edge rolls 210b run in a constant speed mode.

Each set of edge rolls 210 may independently be configured to comprise a substantially smooth contact surface or a knurled contact surface. Knurls on exemplary edge rolls can be used to grip glass sheets and avoid slipping (as well as provide additional cooling). It was noted by Applicant, however, that when more than one set of edge rolls are used, concerns arise that when both sets of edge rolls have knurled patterns, gripping the glass sheet can become difficult for the second set of edge rolls. Thus, in some embodiments, it may be desirable to provide one of the first set of edge rolls 210a and the second set of edge rolls 210b with a knurled surface and the other of the first set of edge rolls and the second set of edge rolls with a substantially smooth surface.

By selecting the degree of incline and the position of the one or more sets of edge rolls 210, the sheet width attenuation of a drawn sheet glass may be reduced. Reducing sheet width attenuation of a drawn sheet glass can be performed in situations where the amount of lateral contraction of the glass ribbon has been mitigated such that the width of the resulting sheet glass is greater than it would have been using either conventionally oriented or no edge rolls. However, as used herein, reducing sheet width attenuation of a drawn sheet glass can also be performed in situations where (a) lateral contraction of the glass ribbon may be prevented altogether, such that the width of the resulting sheet glass is substantially the same as the width of the glass ribbon at the root (i.e. where there has been zero sheet width attenuation) and (b) where the sheet is stretched, such that the width of the resulting sheet glass is greater than the width of the glass ribbon at the root.

By selecting the degree of incline and the position of the one or more sets of edge rolls 210, sheet glass having a width that at least about 90% of the width of the viscous glass ribbon at the root may be produced. Alternatively, sheet glass having a width that is at least about 92% of the width of the viscous glass ribbon at the root, at least about 94% of the width of the viscous glass ribbon at the root, at least about 95% of the width of the viscous glass ribbon at the root, at least about 96% of the width of the viscous glass ribbon at the root, at least about 97% of the width of the viscous glass ribbon at the root, at least about 98% of the width of the viscous glass ribbon at the root, at least about 99% of the width of the viscous glass ribbon at the root, or the same width as the viscous glass ribbon at the root may be produced, thus effectively preventing sheet width attenuation.

In some embodiments, by selecting the degree of incline and the position of the one or more sets of edge rolls 210, sheet glass having a width that is greater than the width of the viscous glass ribbon at the root may be produced. In addition to effectively preventing sheet width attenuation, the sheet width may be stretched by control of the degree of incline and position of the one or more set of edge rolls 210. For example, sheet glass having a width that is at least about 100% of the width of the viscous glass ribbon at the root, at least about 102%, at least about 104%, or at least about 105% of the width of the viscous glass ribbon at the root may be produced.

Additionally, by selecting the degree of incline and the position of the one or more sets of edge rolls 210, thickness of the beads that are known to form along the edges of the glass sheet may be reduced. As described previously, a number of problems with sheet stability may result from an increased thickness of the edge beads and any slower cooling that the increased thickness gives rise to. Accordingly, reducing the thickness of the edge beads can produce increased ribbon and glass sheet stability.

In some embodiments, the ratio between the thickness of the bead and the thickness of the sheet center can be used as an indication as to the degree to which the bead thickness has been reduced. Using embodiments of the disclosure described herein, a selection of the degree of incline and the position of the one or more sets of edge rolls 210, glass sheets may be produced having a ratio of bead thickness to center thickness less than 12:1. Alternatively, glass sheets may be produced having a ratio of bead thickness to center thickness less than 10:1, less than 8:1, less than 6:1, less than 5:1, less than 4:1, less than 3:1, less than 2.5:1, less than 2:1, less than 1.5:1, and all sub-ranges therebetween.

Sheet width variation can also be reduced through selection of the degree of incline and the position of the one or more sets of edge rolls 210 as well as the relative distances between different sets of edge rolls and the relative speed of the different sets of edge rolls. For example, as described previously, it may often be desirable to place at least one set of edge rolls 210 close to the root to prevent any attenuation occurring immediately beyond the root and may be a key driver of sheet width variation. In another example, first set of edge roll speed can be scaled to the root condition instead of to the pulling speed to avoid excessive tension to the glass near the root which may lead to flow separation for glass flow on edge directors particularly when forming ultrathin glass (e.g., <200 microns, <100 microns, etc.). The second set of edge rolls can also be used to decouple any impact of pulling rolls to the first set of edge rolls.

As used herein, reduction of sheet width variation can include those embodiments where sheet width variation is effectively eliminated. In some embodiments, sheet width variation can be measured for example by cameras installed typically at the bottom of the draw to record the location of the very outer edge of the sheet. Sheet width variation can also be indicated by tracking the vertical velocities of the viscous glass at various points within the drawing glass ribbon. This can be achieved, for example, by plotting the vertical velocity at various points to obtain vertical velocity contours across the width, or a portion of the width, of the glass ribbon in the viscous region. Of course, these plots showing vertical velocity are analogous to horizontal velocity in embodiments (float processes) having a horizontal direction of travel. Where vertical velocity contours are continuously increasing in a generally parallel manner across the width of the glass ribbon, sheet width variation can be reduced or avoided.

By selecting the degree of incline and the position of the one or more sets of edge rolls 210, generally parallel vertical velocity contours within the viscous region of the drawing process can be obtained. These contours indicate a substantially smooth and continuous glass velocity increase in the direction. Accordingly, by selecting the degree of incline and the vertical position of the one or more sets of edge rolls 210, sheet width variation may be reduced or eliminated.

It has also been found that even without an angling of the edge rolls, the addition of a second set of edge rolls 210b a short distance below the first set of edge rolls 210a can itself be beneficial in reducing sheet width attenuation, sheet width variation, and edge beading. Accordingly, in some embodiments, any of the first set of edge rolls 210a and the second set of edge rolls 210b may be oriented such that the rotation axis is horizontal in a fusion drawing process or on a line orthogonal to the direction of travel and parallel to a plane formed by the sheet of glass. The second set of edge rolls 210b may be positioned before the final sheet width and/or thickness is settled in order to generate an effective cross-draw tension.

Figure 13:
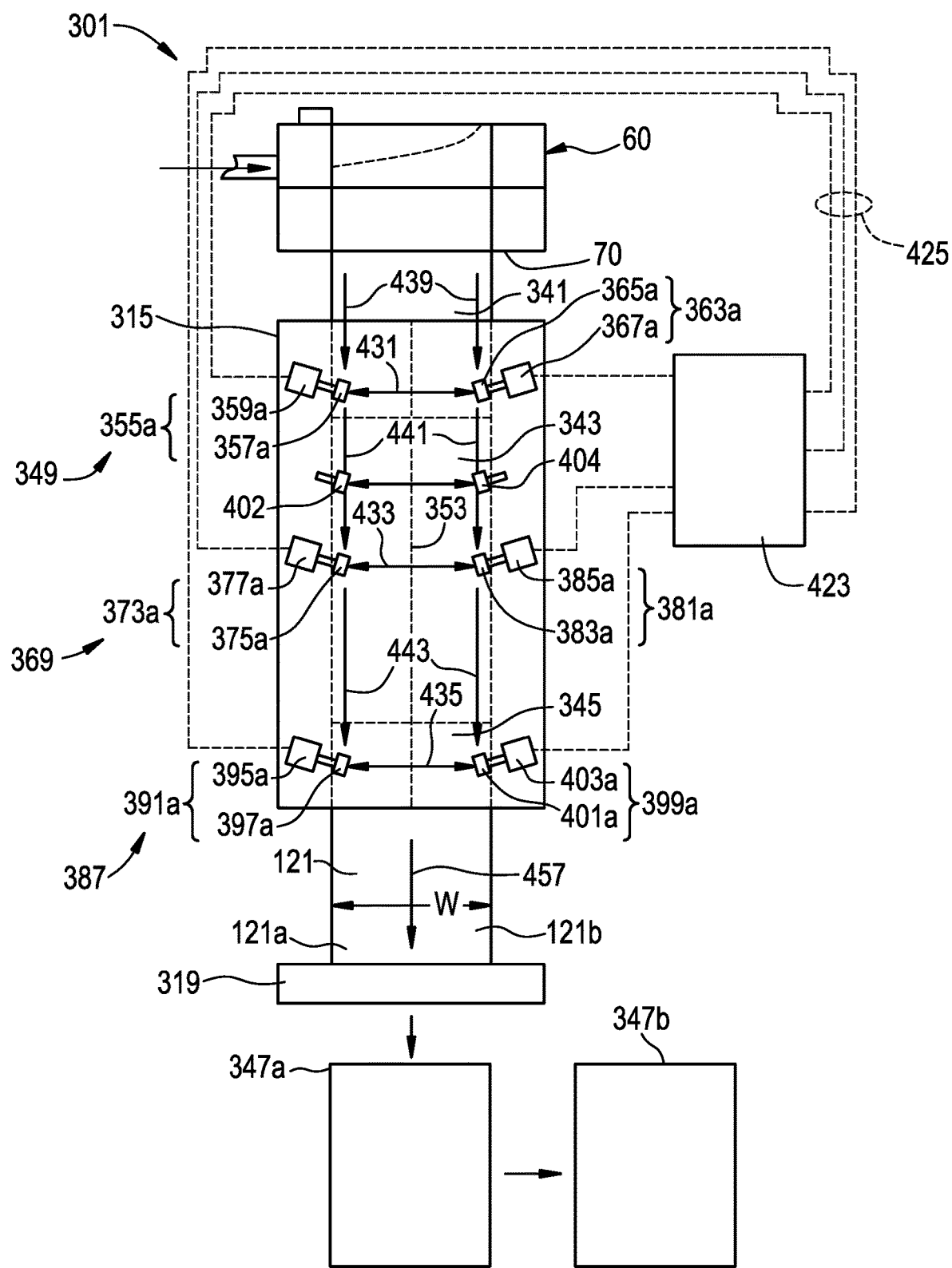
FIG. 13 illustrates a glass manufacturing apparatus according to an exemplary embodiment of the disclosure.
Figure 14:
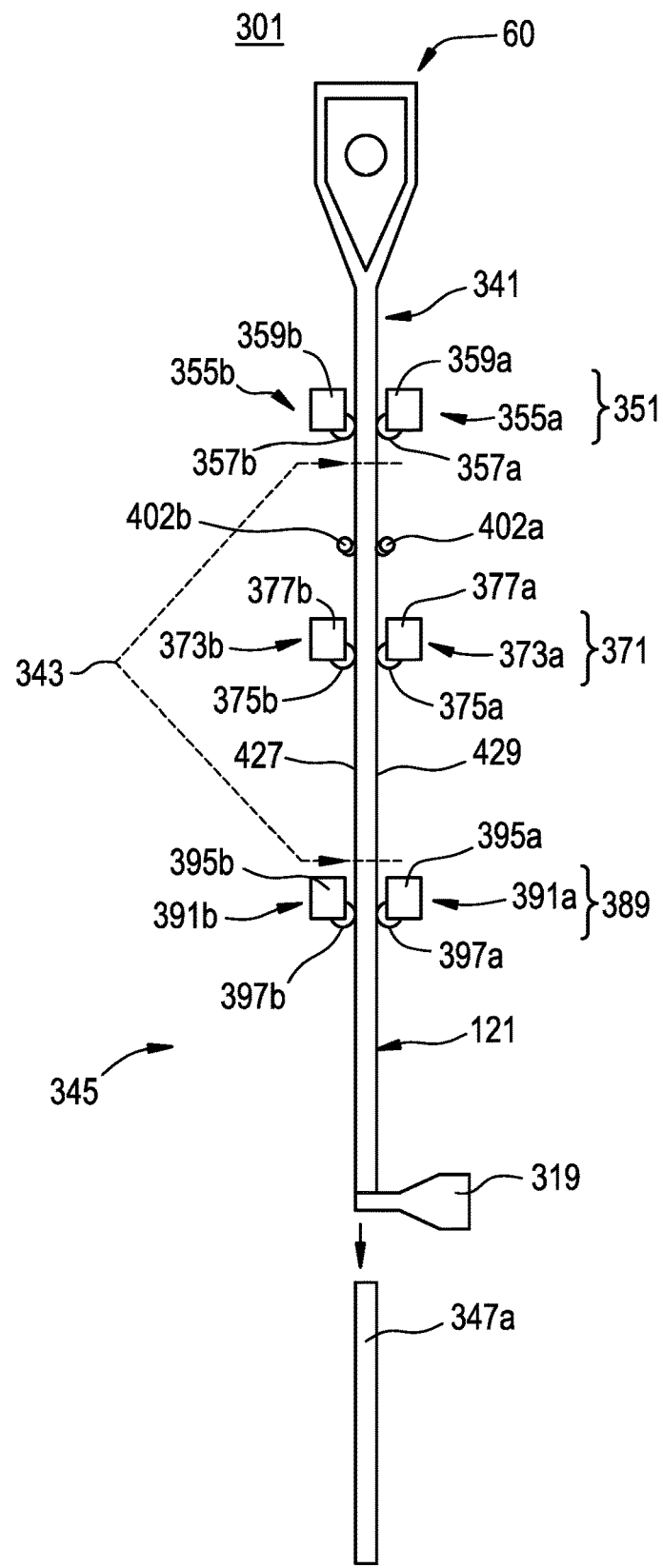
FIG. 14 is a side view of the glass manufacturing apparatus of FIG. 13 according to an exemplary embodiment of the disclosure.

Referring now to FIGS. 13 and 14, there is shown schematic front and side views of an exemplary embodiment of a glass manufacturing apparatus 301 that may be used in accordance with aspects of the disclosure. The glass manufacturing apparatus 301 is illustrated as a down draw fusion apparatus although other forming apparatus may be used in further examples. In one example, the glass manufacturing apparatus 301 can include a forming vessel 60 to produce a glass ribbon 121 including a width "W" extending between a first edge portion 121a and a second edge portion 121b of the glass ribbon 121.

As further illustrated in FIGS. 13 and 14, the glass manufacturing apparatus 301 can include a pull roll device 315 and a separating device 319. A portion of the glass ribbon 121 is drawn off the root 70 of the forming vessel 60 into a viscous zone 341 wherein the glass ribbon 121 begins thinning to a final thickness. The portion of the glass ribbon 121 is then drawn from the viscous zone 341 into a setting zone 343 (visco-elastic zone). In the setting zone 343, the portion of the glass ribbon 121 is set from a viscous state to an elastic state with the desired profile. The portion of the glass ribbon 121 is then drawn from the setting zone 343 to an elastic zone 345. Once in the elastic zone 345, the glass ribbon 121 may be deformed, within limits, without permanently changing the profile of the glass ribbon 121.

After the portion of the glass ribbon 121 enters the elastic zone 345, a separating device 319 may be provided to sequentially separate a plurality of glass sheets 347a, 347b from the glass ribbon 121 over a period of time. The separating device 319 may comprise the illustrated traveling anvil machine although further separating devices may be provided in further examples.

The glass manufacturing apparatus 301 further includes a pull roll device 315 schematically illustrated in FIGS. 13 and 14. As discussed more fully below, the pull roll device 315 may be provided to help draw the glass ribbon 121 from the root 70 and may isolate transmission of forces up the glass ribbon 121 from the elastic zone 345 to the setting zone 343. As such, the pull roll devices of the present disclosure can draw the glass ribbon to the desired thickness while also reducing residual stress within the glass sheet. As shown, the pull roll device 315 can be located within the viscous zone 341, the setting zone 343, and the elastic zone 345. Indeed, as illustrated in the drawings, the first pull roll apparatus (discussed more fully below) is located within the viscous zone 341 or may be located at the top of the setting zone 343 adjacent to the viscous zone 341. The second pull roll apparatus (discussed more fully below) is located within the setting zone 343 and the third pull roll apparatus (discussed more fully below) is located within the elastic zone 345.

Figure 15:
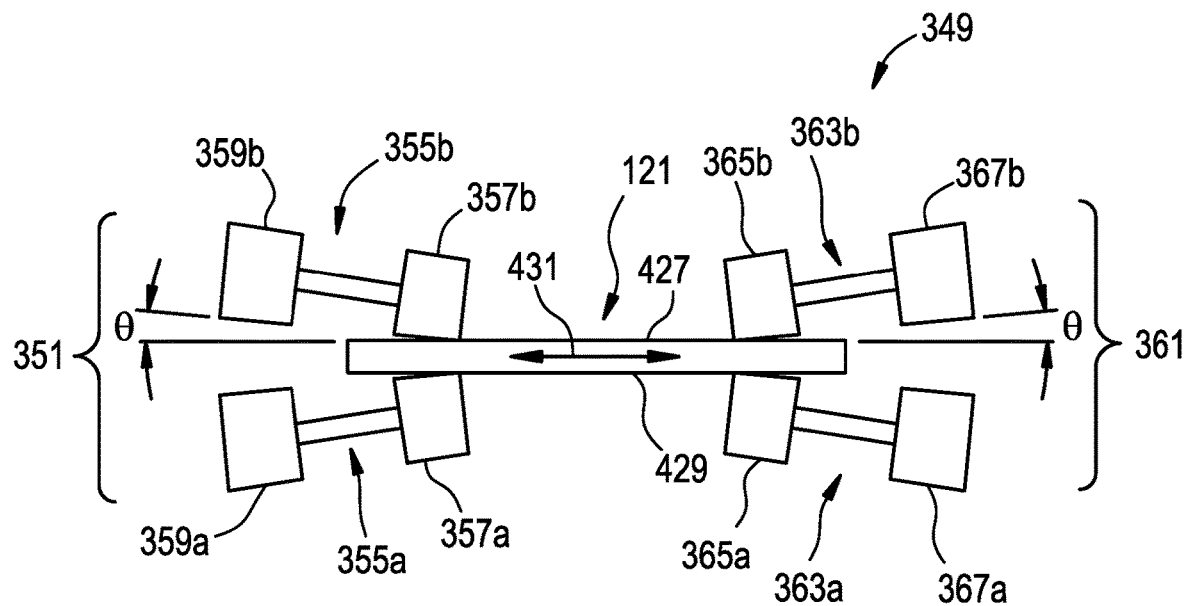
FIG. 15 is a top view of the glass manufacturing apparatus of FIG. 13 at a first elevation according to an exemplary embodiment of the disclosure.

FIG. 13, FIG. 14, and FIG. 15 illustrate a first example of the pull roll device 315 in accordance with one exemplary embodiment of the disclosure although other pull roll device 315 constructions may be provided in further examples. The pull roll device 315 can include a first pull roll apparatus 349 including a first upstream pair of draw rolls 351 configured to draw the first edge portion 121a of the glass ribbon 121 from the forming vessel 60 along a draw path 353 extending transverse to the width "W" of the glass ribbon 121.

As shown, the first upstream pair of draw rolls 351 can include a first pull roll member 355a and a second pull roll member 355b. The first and second pull roll members 355a, 355b can each be provided with a respective refractory roll covering 357a, 357b configured to engage the first edge portion 121a of the glass ribbon 121 therebetween. At least one of the first and second pull roll members 355a, 355b may be provided with a respective motor 359a, 359b. For example, as shown, both the first and second pull roll members 355a, 355b are provided with a respective motor 359a, 359b. In further examples, only one of the first and second pull roll members 355a, 355b is provided with a motor wherein the other pull roll member may be provided with a bearing such that only one of the first and second pull roll members 355a, 355b is driven.

In another example, in addition or in alternative to the first upstream pair of draw rolls 351, the first pull roll apparatus 349 can include a second upstream pair of draw rolls 361 configured to draw the second edge portion 121b of the glass ribbon 121 from the forming vessel 70 along the draw path 353. As shown, the second upstream pair of draw rolls 361 can include a first pull roll member 363a and a second pull roll member 363b. The first and second pull roll members 363a, 363b can each be provided with a respective refractory roll covering 365a, 365b configured to engage the second edge portion 121b of the glass ribbon 121 therebetween. At least one of the first and second pull roll members 363a, 363b may be provided with a respective motor 367a, 367b. For example, as shown, both the first and second pull roll members 363a, 363b are provided with a respective motor 367a, 367b. In further examples, only one of the first and second pull roll members 367a, 367b is provided with a motor wherein the other pull roll member may be provided with a bearing such that only one of the first and second pull roll members 367a, 367b is driven.

Figure 16:
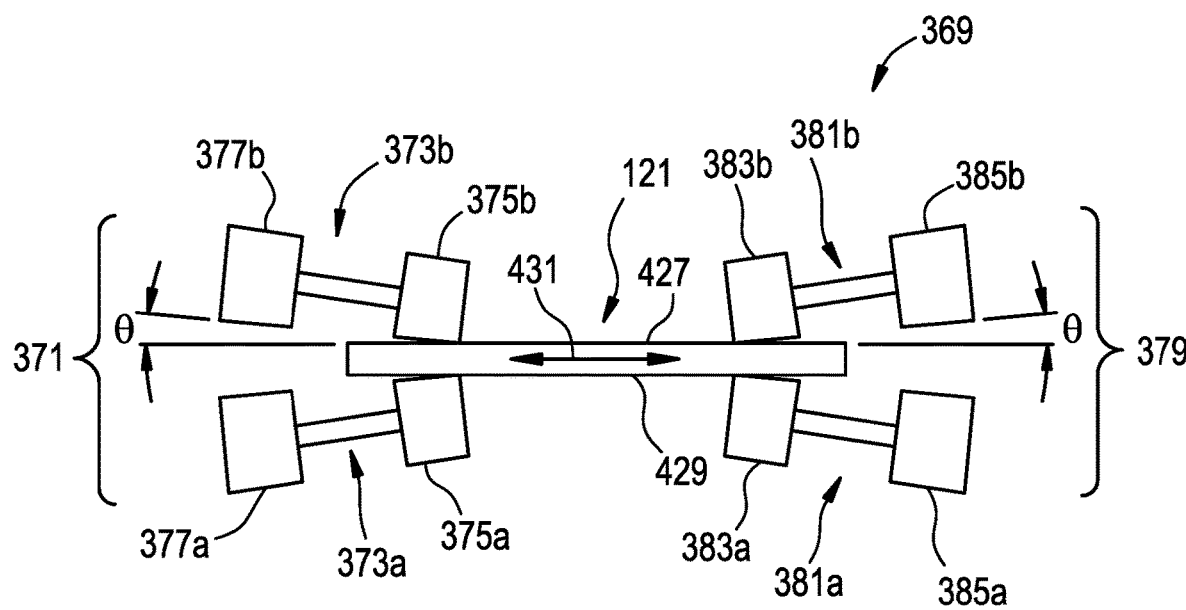
FIG. 16 is a top view of the glass manufacturing apparatus of FIG. 13 at a second elevation according to an exemplary embodiment of the disclosure.

As shown in FIG. 13, FIG. 14, and FIG. 16, the pull roll device 315 further includes a second pull roll apparatus 369 including a first midstream pair of draw rolls 371 positioned downstream along the draw path 353 from the first upstream pair of draw rolls 351, wherein the first midstream pair of draw rolls 371 are configured to further draw the first edge portion 121a of the glass ribbon 121 along the draw path 353. As shown, the first midstream pair of draw rolls 371 can include a first pull roll member 373a and a second pull roll member 373b. The first and second pull roll members 373a, 373b can each be provided with a respective refractory roll covering 375a, 375b configured to engage the first edge portion 121a of the glass ribbon 121 therebetween. At least one of the first and second pull roll members 373a, 373b may be provided with a respective motor 377a, 377b. For example, as shown, both the first and second pull roll members 373a, 373b are provided with a respective motor 377a, 377b. In further examples, only one of the first and second pull roll members 373a, 373b is provided with a motor wherein the other pull roll member may be provided with a bearing such that only one of the first and second pull roll members 373a, 373b is driven.

In another example, in addition or in alternative to the first midstream pair of draw rolls 371, the second pull roll apparatus 369 can include a second midstream pair of draw rolls 379 positioned downstream along the draw path 353 from the second upstream pair of draw rolls 361, wherein the second midstream pair of draw rolls 379 are configured to further draw the second edge portion 121b of the glass ribbon 121 along the draw path 353. As shown, the second midstream pair of draw rolls 379 can include a first pull roll member 381a and a second pull roll member 381b. The first and second pull roll members 381a, 381b can each be provided with a respective refractory roll covering 383a, 383b configured to engage the second edge portion 121b of the glass ribbon 121 therebetween. At least one of the first and second pull roll members 381a, 381b may be provided with a respective motor 385a, 385b. For example, as shown, both the first and second pull roll members 381a, 381b are provided with a respective motor 385a, 385b. In further examples, only one of the first and second pull roll members 381a, 381b is provided with a motor wherein the other pull roll member may be provided with a bearing such that only one of the first and second pull roll members 381a, 381b is driven.

Figure 17:
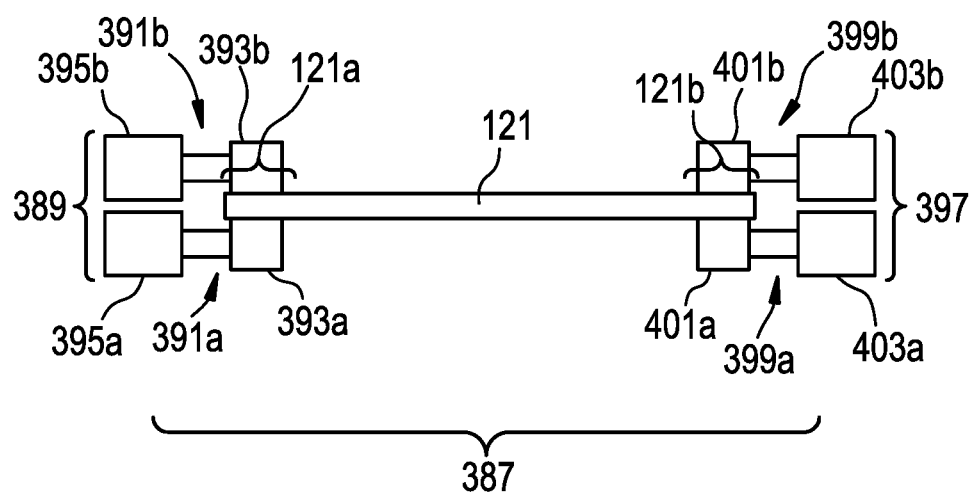
FIG. 17 is a top view of the glass manufacturing apparatus of FIG. 13 at a third elevation according to an exemplary embodiment of the disclosure.

As shown in FIG. 13, FIG. 14, and FIG. 17, the pull roll device 315 further includes a third pull roll apparatus 387 including a first downstream pair of draw rolls 389 positioned downstream along the draw path 353 from the first midstream pair of draw rolls 371, wherein the first downstream pair of draw rolls 389 are configured to further draw the first edge portion 121a of the glass ribbon 121 along the draw path 353. As shown, the first downstream pair of draw rolls 389 can include a first pull roll member 391a and a second pull roll member 391b. The first and second pull roll members 391a, 391b can each be provided with a respective refractory roll covering 393a, 393b configured to engage the first edge portion 121a of the glass ribbon 121 therebetween. At least one of the first and second pull roll members 391a, 391b may be provided with a respective motor 395a, 395b. For example, as shown, both the first and second pull roll members 391a, 391b are provided with a respective motor 395a, 395b. In further examples, only one of the first and second pull roll members 391a, 391b is provided with a motor wherein the other pull roll member may be provided with a bearing such that only one of the first and second pull roll members 391a, 391b is driven.

In another example, in addition or in alternative to the first downstream pair of draw rolls 389, the third pull roll apparatus 387 can include a second downstream pair of draw rolls 397 positioned downstream along the draw path 353 from the second midstream pair of draw rolls 379, wherein the second downstream pair of draw rolls 397 are configured to further draw the second edge portion 121b of the glass ribbon 121 along the draw path 353. As shown, the second downstream pair of draw rolls 397 can include a first pull roll member 399a and a second pull roll member 399b. The first and second pull roll members 399a, 399b can each be provided with a respective refractory roll covering 401a, 401b configured to engage the second edge portion 121b of the glass ribbon 121 therebetween. At least one of the first and second pull roll members 399a, 399b may be provided with a respective motor 403a, 403b. For example, as shown, both the first and second pull roll members 399a, 399b are provided with a respective motor 403a, 403b. In further examples, only one of the first and second pull roll members 399a, 399b is provided with a motor wherein the other pull roll member may be provided with a bearing such that only one of the first and second pull roll members 399a, 399b is driven. It should be appreciated that the pulling roll device 315 may also include optional pair(s) of edge rolls 402 (402a, 402b) and 404 and/or optional pair(s) of idle stub rolls 406, 408 (See FIGS. 13, 14, and 18).

Figure 18:
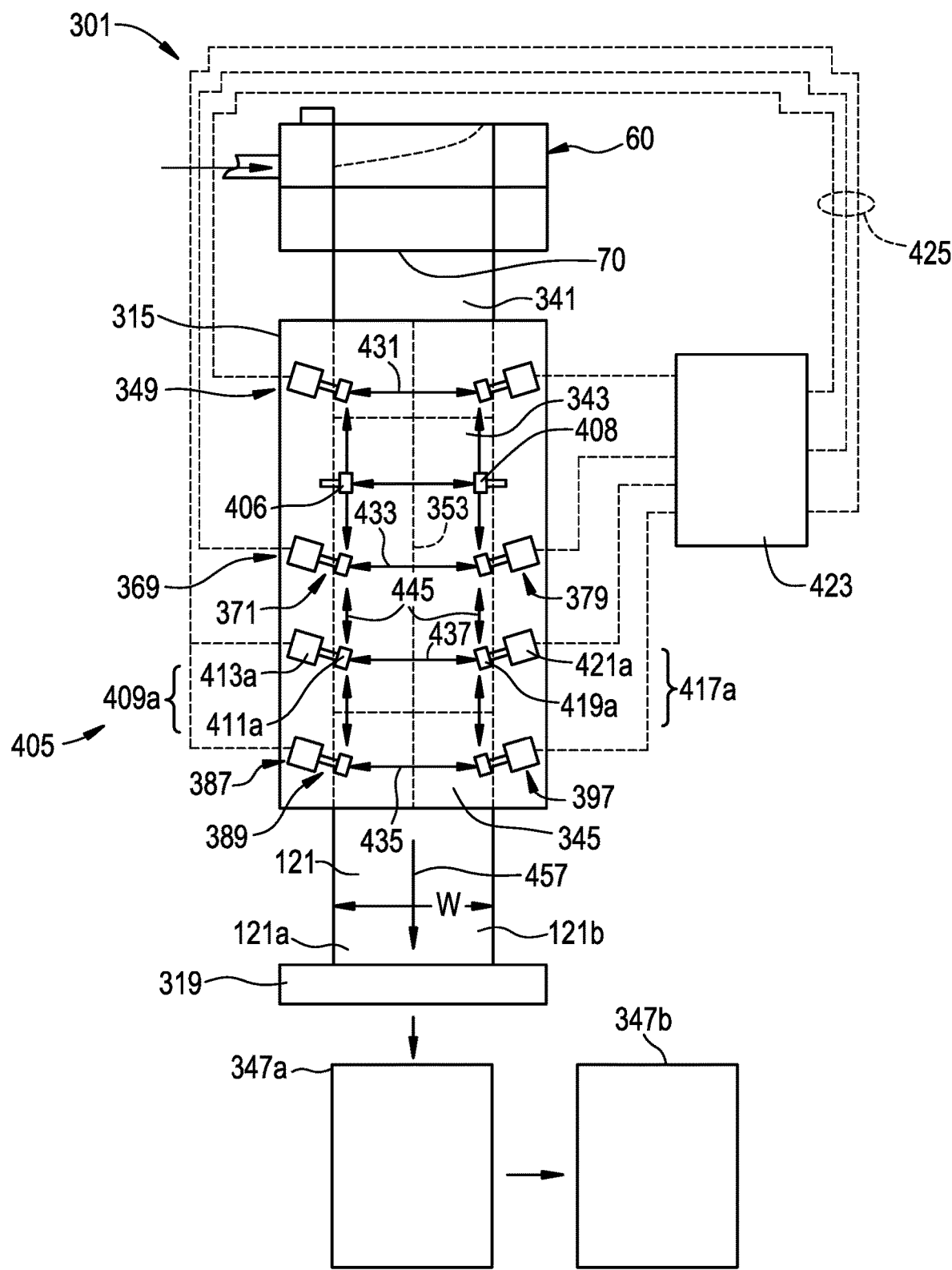
FIG. 18 illustrates a glass manufacturing apparatus according to an exemplary embodiment of the disclosure.
Figure 19:
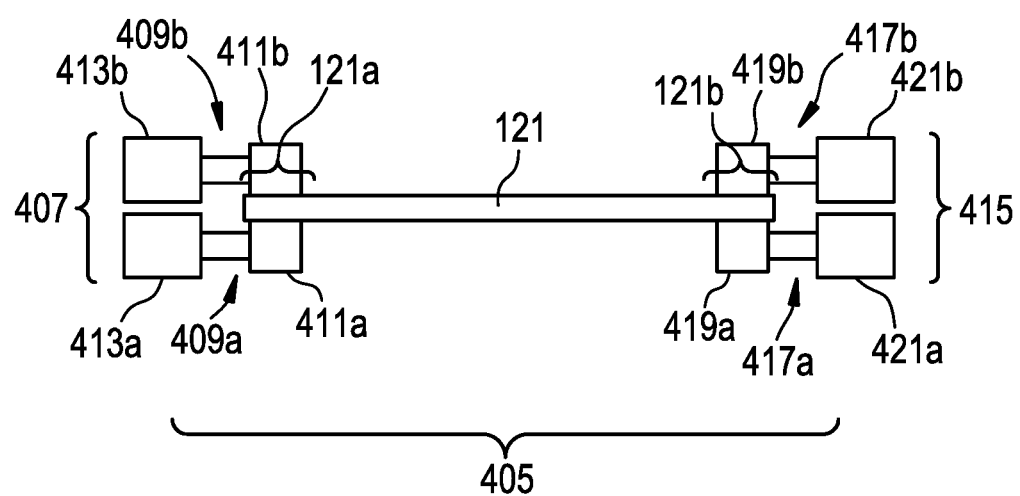
FIG. 19 is a top view of the glass manufacturing apparatus of FIG. 18 at an intermediate elevation according to an exemplary embodiment of the disclosure.

As shown in FIG. 18 and FIG. 19, the pull roll device 315 can further include an intermediate pull roll apparatus 405 including a first intermediate pair of draw rolls 407 positioned downstream along the draw path 353 from the first midstream pair of draw rolls 371 and upstream along the draw path from the first downstream pair of draw rolls 389. The first intermediate pair of draw rolls 407 are configured to further draw the first edge portion 121a of the glass ribbon 121 along the draw path 353. As shown, the first intermediate pair of draw rolls 407 can include a first pull roll member 409a and a second pull roll member 409b. The first and second pull roll members 409a, 409b can each be provided with a respective refractory roll covering 411a, 411b configured to engage the first edge portion 121a of the glass ribbon 121 therebetween. At least one of the first and second pull roll members 409a, 409b may be provided with a respective motor 413a, 413b. For example, as shown, both the first and second pull roll members 413a, 413b are provided with a respective motor 413a, 413b. In further examples, only one of the first and second pull roll members 409a, 409b is provided with a motor wherein the other pull roll member may be provided with a bearing such that only one of the first and second pull roll members 409a, 409b is driven.

In another example, in addition or in alternative to the first intermediate pair of draw rolls 407, the intermediate pull roll apparatus 405 can include a second intermediate pair of draw rolls 415 positioned downstream along the draw path 353 from the second midstream pair of draw rolls 379 and upstream along the draw path 353 from the second downstream pair of draw rolls 397. The second midstream pair of draw rolls 415 are configured to further draw the second edge portion 121b of the glass ribbon 121 along the draw path 353. As shown, the second intermediate pair of draw rolls 415 can include a first pull roll member 417a and a second pull roll member 417b. The first and second pull roll members 417a, 417b can each be provided with a respective refractory roll covering 419a, 419b configured to engage the second edge portion 121b of the glass ribbon 121 therebetween. At least one of the first and second pull roll members 417a, 417b may be provided with a respective motor 421a, 421b. For example, as shown, both the first and second pull roll members 417a, 417b are provided with a respective motor 421a, 421b. In further examples, only one of the first and second pull roll members 417a, 417b is provided with a motor wherein the other pull roll member may be provided with a bearing such that only one of the first and second pull roll members 417a, 417b is driven.

Although the intermediate pull roll apparatus 405 is described and illustrated as positioned at a fourth elevation between the second pull roll apparatus 369 and the third pull roll apparatus 387, the disclosure is not limited to these exemplary embodiments. The intermediate pull roll apparatus 405 may be positioned at various elevations of the pull roll device 315. Further, the intermediate pull roll apparatus 405 may be modular such that multiple pull roll apparatus 405 may be included in the pull roll device 315 and positioned along the draw path 353 at various elevations.

While each pair of draw rolls has been described as including a first and second pull roll member, the first and second pull roll members can also be referred to as a draw roll of the pair of draw rolls.

The pull roll device 315 of the glass manufacturing apparatus 301 can further include a control device 423 (e.g., programmable logic controller) configured to independently operate the first pull roll apparatus 349, the second pull roll apparatus 369, and the third pull roll apparatus 387 such that at least one of the first upstream pair of draw rolls 351 rotates with a substantially constant torque, at least one of the first midstream pair of draw rolls 371 rotates with a substantially constant torque, and at least one of the first downstream pair of draw rolls 389 rotates with a substantially constant angular velocity. The control device 423 can communicate 425 with the pull roll apparatus 349, 369, 387, 405 through cables, wireless networks, wired networks, combinations thereof, and the like. Independent operation of the first, second, and third pull roll apparatus 349, 369, 387, for purposes of this disclosure, means that one of the first, second, and third pull roll apparatus may be operated without being affected by operation of the other of the first, second, and third pull roll apparatus. As such, for example, independently operating the first pull roll apparatus 349 with the control device 423 provides for the control device to operate the first pull roll apparatus 349 without considering changes in operating parameters of the second pull roll apparatus 369 or the third pull roll apparatus 387. Also, for example, independently operating the second pull roll apparatus 369 with the control device 423 provides for the control device to operate the second pull roll apparatus 369 without considering changes in operating parameters of the first pull roll apparatus 349 or the third pull roll apparatus 387. Further, for example, independently operating the third pull roll apparatus 387 with the control device 423 provides for the control device to operate the third pull roll apparatus 387 without considering changes in operating parameters of the first pull roll apparatus 349 or the second pull roll apparatus 369.

As mentioned previously, the first upstream pair of draw rolls 351 can include a single motor associated with one of the first or second pull roll members 355a, 355b. In such an example, the control device 423 can operate the single motor such that the associated first or second pull roll members 355a, 355b is rotated with a substantially constant torque. As further described above, each of the first and second pull roll members 355a, 355b may be provided with a corresponding motor 359a, 359b. In such examples, the control device 423 may operate the motors 359a, 359b such that at least one, such as both, of the first upstream pair of draw rolls 351 rotate with a substantially constant torque. Rotating both pull roll members 359a, 359b of the first upstream pair of draw rolls 351 with a substantially constant torque may be desirable to apply force equally at both sides of the first edge portion 121a of the glass ribbon 121.

As mentioned previously, first pull roll apparatus 349 may also include an optional second upstream pair of draw rolls 361. In such examples, the second upstream pair of draw rolls 361 can include a single motor associated with one of the first or second pull roll members 363a, 363b. In such an example, the control device 423 can operate the single motor such that the associated first or second pull roll members 363a, 363b is rotated with a substantially constant torque. As further described above, each of the first and second pull roll members 363a, 363b may be provided with a corresponding motor 367a, 367b. In such examples, the control device 423 may operate the motors 367a, 367b such that at least one, such as both, of the second upstream pair of draw rolls 361 rotate with a substantially constant torque. Rotating both pull roll members 363a, 363b of the second upstream pair of draw rolls 361 with a substantially constant torque may be desirable to apply force equally at both sides of the second edge portion 121b of the glass ribbon 121.

Although not required, in some examples, the control device 423 can operate one or both of the motors associated with the first upstream pair of draw rolls 351 with a substantially constant first torque and can simultaneously operate one or both of the motors associated with the second upstream pair of draw rolls 361 to rotate with a substantially constant second torque that is substantially equal to the first torque. Providing substantially equal first and second torques can be desired, for example, to apply substantially the same force to the glass ribbon 121 and the first and second edge portions 121a, 121b.

As mentioned previously, second pull roll apparatus 369 may also include an optional second midstream pair of draw rolls 379. In such examples, the second midstream pair of draw rolls 379 can include a single motor associated with one of the first or second pull roll members 381a, 381b. In such an example, the control device 423 can operate the single motor such that the associated first or second pull roll members 381a, 381b is rotated with a substantially constant torque. As further described above, each of the first and second pull roll members 381a, 381b may be provided with a corresponding motor 385a, 385b. In such examples, the control device 423 may operate the motors 385a, 385b such that at least one, such as both, of the second midstream pair of draw rolls 379 rotate with a substantially constant torque. Rotating both pull roll members 381a, 381b of the second midstream pair of draw rolls 379 with a substantially constant torque may be desirable to apply force equally at both sides of the second edge portion 121b of the glass ribbon 121.

Although not required, in some examples, the control device 423 can operate one or both of the motors associated with the first midstream pair of draw rolls 371 with a substantially constant first torque and can simultaneously operate one or both of the motors associated with the second midstream pair of draw rolls 379 to rotate with a substantially constant second torque that is substantially equal to the first torque. Providing substantially equal first and second torques can be desired, for example, to apply substantially the same force to the glass ribbon 121 and the first and second edge portions 121a, 121b.

As mentioned previously, first downstream pair of draw rolls 389 can include a single motor associated with one of the first or second pull roll members 391a, 391b. In such an example, the control device 423 can operate the single motor such that the associated first or second pull roll members 391a, 391b rotates with a substantially constant angular velocity. As further described above, each of the first and second pull roll members 391a, 391b may be provided with a corresponding motor 395a, 395b. In such examples, the control device 423 may operate the motors 395a, 395b such that at least one, such as both, of the first downstream pair of draw rolls 389 rotate with a substantially constant angular velocity. Rotating both pull roll members 391a, 391b of the first downstream pair of draw rolls 389 with a substantially constant angular velocity may be desirable to draw the glass ribbon equally at both sides of the first edge portion 121a of the glass ribbon 121.

As mentioned previously, third pull roll apparatus 387 may also include an optional second downstream pair of draw rolls 397. In such examples, the second downstream pair of draw rolls 397 can include a single motor associated with one of the first or second pull roll members 399a, 399b. In such an example, the control device 423 can operate the single motor such that the associated first or second pull roll members 399a, 399b is rotated with a substantially constant angular velocity. As further described above, each of the first and second pull roll members 399a, 399b may be provided with a corresponding motor 403a, 403b. In such examples, the control device 423 may operate at least one, such as both, of the second downstream pair of draw rolls 397 to rotate with a substantially constant angular velocity. Rotating both pull roll members 399a, 399b of the second downstream pair of draw rolls 397 with a substantially constant angular velocity may be desirable to draw the glass ribbon equally at both sides of the second edge portion 121b of the glass ribbon 121.

Although not required, in some examples, the control device 423 can operate one or both of the motors associated with the first downstream pair of draw rolls 389 with a substantially constant first angular velocity and can simultaneously operate one or both of the motors associated with the second downstream pair of draw rolls 397 to rotate with a substantially constant second angular velocity that is substantially equal to the first angular velocity. Providing substantially equal first and second angular velocities can be desired, for example, to draw the glass ribbon equally at the first and second edge portions 121*a*, 121*b*.

As mentioned, the control device 423 can be configured to independently operate the first pull roll apparatus 349 such that at least one of the first and second upstream pair of draw rolls 351, 361 rotates with a substantially constant torque; however, the embodiments are not so limited. That is, the control device 423 can be configured in an exemplary embodiment to independently operate the first pull roll apparatus 349 such that at least one of the first and second upstream pair of draw rolls 351, 361 rotates not with constant torque, but with a substantially constant angular velocity. Further, the control device 423 can be configured to independently operate the second pull roll apparatus 369 such that at least one of the first and second midstream pair of draw rolls 371, 379 rotates not with constant torque, but with a substantially constant angular velocity.

The control device 423 can further be configured to independently operate the intermediate pull roll apparatus 405 such that at least one of the first and second intermediate pair of draw rolls 407, 415 rotates with a substantially constant torque. Alternatively, the control device 423 can be configured to independently operate the intermediate pull roll apparatus 405 such that at least one of the first and second intermediate pair of draw rolls 407, 415 rotates not with constant torque, but with a substantially constant angular velocity.

Table 1 provides five different independent Control schemes according to exemplary embodiments of the disclosure. For example, as shown in Table 1, Control scheme "A" includes the control device 423 configured to independently operate the first pull roll apparatus 349 such that at least one of the first and second upstream pair of draw rolls 351, 361 rotates with a substantially constant torque, to independently operate the second pull roll apparatus 369 such that at least one of the first and second midstream pair of draw rolls 371, 379 rotates with a substantially constant torque, to independently operate the third pull roll apparatus 387 such that at least one of the first and second downstream pair of draw rolls 389, 397 rotates with a substantially constant angular velocity, and the control device 423 configured to independently operate the intermediate pull roll apparatus 405, if provided, such that at least one of the first and second intermediate pair of draw rolls 407, 415, rotates with a substantially constant torque or such that at least one of the first and second intermediate pair of draw rolls 407, 415, rotates not with constant torque, but with a substantially constant angular velocity.

As another example shown in Table 1, Control scheme "E" includes the control device 423 configured to independently operate the first pull roll apparatus 349 such that at least one of the first and second upstream pair of draw rolls 351, 361 rotates with a substantially constant torque, to independently operate the second pull roll apparatus 369 such that at least one of the first and second midstream pair of draw rolls 371, 379 rotates with a substantially constant torque, to independently operate the third pull roll apparatus 387 such that at least one of the first and second downstream pair of draw rolls 389, 397 rotates with a substantially constant torque, and the control device 423 configured to independently operate the intermediate pull roll apparatus 405, if provided, such that at least one of the first and second intermediate pair of draw rolls 407, 415, rotates with a substantially constant torque.

TABLE 1

| Pull Roll Apparatus | | Control | | | | |
|---|---|---|---|---|---|---|
| Elevation | Position | A | B | C | D | E |
| 1 | upstream | torque | torque | torque | velocity | torque |
| 2 | midstream | torque | torque | velocity | velocity | torque |
| intermediate (optional) | intermediate (various) | torque/ velocity | torque/ velocity | velocity | velocity | torque |
| 3 | downstream | velocity | velocity | velocity | velocity | torque |

In some examples, the pairs of draw rolls discussed throughout the application may have similar constructions and orientations as set forth in U.S. Patent Application Publication No. 2009/0107182 that published on Apr. 30, 2009 to Anderson et al., which is herein incorporated by reference in its entirety. For example, any of the pairs of draw rolls may be vertically downtilted or horizontally level rolls with respect to the glass ribbon. Moreover, as shown in FIGS. 15 and 16, any of the pairs of rolls (horizontally level or downtilted) may be positioned to have a predetermined horizontal angle θ that a respective face of the rolls would be positioned relative to a respective major surface 427, 429 of the glass ribbon 121. The horizontal angle θ can be desirable to provide an appropriate level of cross-draw tension 431 and/or accommodate a taper effect that may occur during normal roll wear.

FIGS. 13 and 18 illustrate examples where each of the first pull roll members 355*a*, 363*a*, 373*a*, 381*a*, 391*a*, 399*a*, 409*a*, 417*a* of the pairs of draw rolls can comprise vertically downtilted rolls with respect to the glass ribbon 121. The second pull roll members 355*b*, 363*b*, 373*b*, 381*b*, 391*b*, 399*b*, 409*b*, 417*b* of the pairs of draw rolls can likewise comprise vertically downtilted rolls with respect to the glass ribbon 121. The downtilt angle of any pair of the draw rolls may be different or the same as any other pair of draw rolls depending on process considerations. Downtilting of the first and/or second upstream pair of draw rolls 351, 361 can provide a desired level of cross-draw tension 431 between the two pairs of draw rolls 351, 361. Downtilting of the first and/or second midstream pair of draw rolls 371, 379 can provide a desired level of cross-draw tension 433 between the two pairs of draw rolls 371, 379. Downtilting of the first and/or second downstream pair of draw rolls 389, 397 can provide a desired level of cross-draw tension 435 between the two pairs of draw rolls 389, 397. Likewise, downtilting the first and/or second intermediate pair of draw rolls 407, 415 can provide a desired level of cross-draw tension 437 between the two pairs of draw rolls 407, 415.

In some examples, the control device 423 may be configured to activate an automatic positioner (not shown) or a manual mechanism may be used to adjust the downtilt position of the vertically downtilted rolls so as to control (or tune) the average cross-draw tension 431, 433, 435, 437 across the glass ribbon 121.

In further examples, one or more of the pairs of draw rolls 351, 361, 371, 379, 389, 397, 407, 415 may be horizontally level rolls with respect to the glass ribbon wherein the rotation axis of the draw rolls extend substantially perpendicular to the draw path of the glass ribbon 121. Providing one or both of the pairs of rolls of the pull roll device as horizontally level rolls may be desired if cross-wise tension is not necessary across the width of the glass ribbon along the pairs of rolls.

Methods of manufacturing the glass ribbon 121 will now be described with respect to the pull roll device 315 illustrated in FIGS. 13-19.

Referring to FIGS. 13, 14, and 15, the method can include the steps of providing the first pull roll apparatus 349 including the first upstream pair of draw rolls 351. In another example, the first pull roll apparatus 349 may optionally be provided with a second upstream pair of draw rolls 361.

Referring to FIGS. 13, 14, and 16, the method further includes the step of providing the second pull roll apparatus 369 including the first midstream pair of draw rolls 371 positioned downstream along the draw path 353 from the first upstream pair of draw rolls 351. In a further example, the second pull roll apparatus 369 may optionally be provided with a second midstream pair of draw rolls 379 positioned downstream along the draw path 353 from the second upstream pair of draw rolls 361.

The method further includes the step of providing the third pull roll apparatus 387 including the first downstream pair of draw rolls 389 positioned downstream along the draw path 353 from the first midstream pair of draw rolls 371. In a further example, the third pull roll apparatus 387 may optionally be provided with a second downstream pair of draw rolls 397 positioned downstream along the draw path 353 from the second midstream pair of draw rolls 379.

Optionally, the method further includes the step of providing the intermediate pull roll apparatus 405 including the first intermediate pair of draw rolls 407 positioned downstream along the draw path 353 from the first midstream pair of draw rolls 371 and upstream along the draw path 353 from the first downstream pair of draw rolls 389. In a further example, the intermediate pull roll apparatus 405 may optionally be provided with a second intermediate pair of draw rolls 415 positioned downstream along the draw path 353 from the second midstream pair of draw rolls 379 and upstream along the draw path 353 from the second downstream pair of draw rolls 397.

The method further includes the step of forming the glass ribbon 121 with the width "W" extending between the first edge portion 105a and the second edge portion 121b. The first pull roll apparatus 349 can be independently operated, for example, with the control device 423 without input from the second pull roll apparatus 369 or input from the third pull roll apparatus 387, or, when any intermediate pull roll apparatus 405 is provided, without input from the intermediate pull roll apparatus 405. For instance, the first pull roll apparatus 349 can be independently operated such that at least one draw roll (pull roll member 355a, 355b) of the first upstream pair of draw rolls 351 rotates with a substantially constant torque to draw the first edge portion 121a of the glass ribbon 121 along the draw path 353. In one example, the first pull roll apparatus 349 can be operated such that both draw rolls (pull roll members 355a, 355b) of the first upstream pair of draw rolls 351 rotate with a substantially constant torque.

The second upstream pair of draw rolls 361, if provided, can also be independently operated such that at least one draw roll (pull roll member 363a, 363b) of the second upstream pair of draw rolls 361 rotates with a substantially constant torque to draw the second edge portion 121b of the glass ribbon 121 along the draw path 353. In one example, the first pull roll apparatus 349 can be operated such that both of the draw rolls (pull roll members 363a, 363b) of the second upstream pair of draw rolls 361 rotate with a substantially constant torque. As such, a desired tension 439 along the draw path 353 may be maintained in the glass ribbon 121 between the root 70 and the first pull roll apparatus 349.

The method further independently operates the second pull roll apparatus 369 such that at least one draw roll (pull roll member 373a, 373b) of the first midstream pair of draw rolls 371 rotates with a substantially constant torque to further draw the first edge portion 121a of the glass ribbon 121 along the draw path 353. In one example, the method can include the step of operating the second pull roll apparatus 369 such that both draw rolls (pull roll members 373a, 373b) of the first midstream pair of draw rolls 371 rotate with a substantially constant torque.

The second midstream pair of draw rolls 379, if provided, can also be independently operated such that at least one draw roll (pull roll member 381a, 381b) of the second midstream pair of draw rolls 379 rotates with a substantially constant torque to draw the second edge portion 121b of the glass ribbon 121 along the draw path 353. In one example, the second pull roll apparatus 369 can be operated such that both of the draw rolls (pull roll members 381a, 381b) of the second midstream pair of draw rolls 379 rotate with a substantially constant torque. As such, a desired tension 441 along the draw path 353 may be maintained in the glass ribbon 121 between the first pull roll apparatus 349 and the second pull roll apparatus 369.

The method further independently operates the third pull roll apparatus 387 such that at least one draw roll (pull roll member 391a, 391b) of the first downstream pair of draw rolls 389 rotates with a substantially constant angular velocity to further draw the first edge portion 121a of the glass ribbon 121 along the draw path 353. In one example, the method can include the step of operating the third pull roll apparatus 387 such that both draw rolls (pull roll members 391a, 391b) of the first downstream pair of draw rolls 389 rotate with a substantially constant angular velocity.

The second downstream pair of draw rolls 397, if provided, can also be independently operated such that at least one draw roll (pull roll member 399a, 399b) of the second downstream pair of draw rolls 397 rotates with a substantially constant angular velocity to further draw the second edge portion 121b of the glass ribbon 121 along the draw path 353. In one example, the method can include the step of operating the third pull roll apparatus 387 such that both draw rolls (pull roll members 399a, 399b) of the second downstream pair of draw rolls 397 rotate with a substantially constant angular velocity. As such, a desired tension 443 along the draw path 353 may be maintained in the glass ribbon 121 between the second pull roll apparatus 369 and the third pull roll apparatus 387.

When provided, the method further independently operates the intermediate pull roll apparatus 405 such that at least one draw roll (pull roll member 409a, 409b) of the first intermediate pair of draw rolls 407 rotates with a substantially constant torque to further draw the first edge portion 121a of the glass ribbon 121 along the draw path 353 (FIGS. 18 and 19). In one example, the method can include the step of operating the intermediate pull roll apparatus 405 such that both draw rolls (pull roll members 409a, 409b) of the first intermediate pair of draw rolls 407 rotate with a substantially constant torque.

The second intermediate pair of draw rolls 415, if provided, can also be independently operated such that at least one draw roll (pull roll member 417a, 417b) of the second intermediate pair of draw rolls 415 rotates with a substantially constant torque to further draw the second edge portion 121b of the glass ribbon 121 along the draw path 353. In one example, the method can include the step of operating the intermediate pull roll apparatus 405 such that both draw rolls (pull roll members 417a, 417b) of the second intermediate pair of draw rolls 415 rotate with a substantially constant torque. As such, a desired tension 445 along the draw path 353 may be maintained in the glass ribbon 121 between the second pull roll apparatus 169 and the intermediate pull roll apparatus 405 and a desired tension 447 along the draw path 353 may be maintained in the glass ribbon 121 between the intermediate pull roll apparatus 405 and the third pull roll apparatus 387.

While the exemplary embodiments describe the first pull roll apparatus 349 operated in constant torque mode, the second pull roll apparatus 369 operated in constant torque mode, the third pull roll apparatus 387 operated in constant angular velocity mode, and the intermediate pull roll apparatus 405 operated in constant torque mode, the disclosure is not so limited. That is, each one of the pull roll apparatus can be operated in a constant torque mode or a constant angular velocity mode. For example, the pull roll apparatus can be operated in the Control schemes of Table 1. For example, the first pull roll apparatus 349 can be operated in constant torque mode, the second pull roll apparatus 369 can be operated in constant angular velocity mode, the third pull roll apparatus 387 operated in constant angular velocity mode, and the intermediate pull roll apparatus 405, if provided, operated in constant angular velocity mode in Control scheme "C" of Table 1.

The method can further include the step of sequentially separating a plurality of glass sheets 347a, 347b from the glass ribbon 121 over a period of time at a location downstream along the draw path 353 from the first downstream pair of draw rolls 389. For example, as shown in FIGS. 13 and 14, the separating device 319 may be periodically activated to sequentially separate a plurality of glass sheets 347a, 347b as the glass ribbon 121 is drawn from the forming vessel 60.

Figure 20:
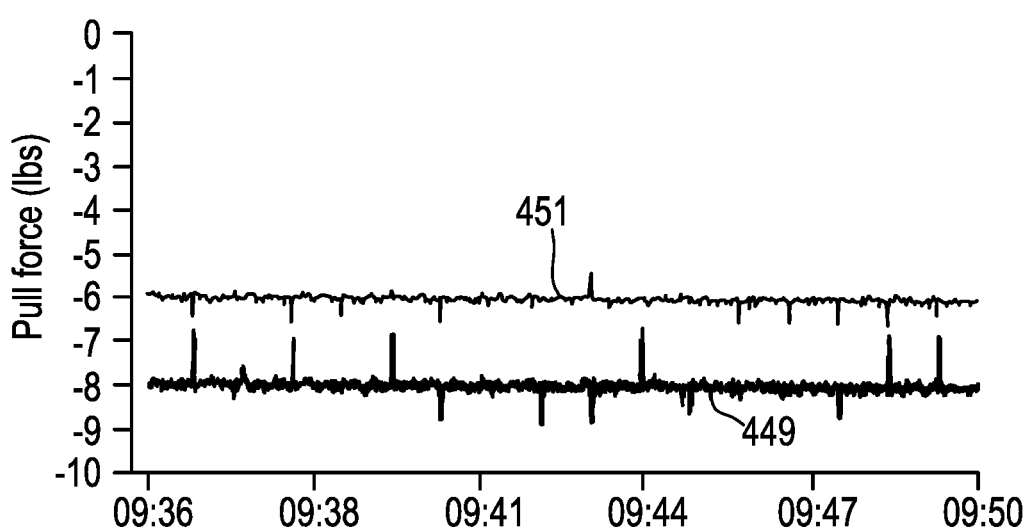
FIG. 20 illustrates an exemplary graph of independent constant force input control at two different elevations according to exemplary embodiments of the disclosure.

FIG. 20 shows constant force at two different elevations, for example, curve 449 shows the constant force at the first pull roll apparatus 349 in the viscous zone 341 in FIG. 13 and curve 451 shows the constant force at the second pull roll apparatus 369 in the setting (visco-elastic) zone 343 in FIG. 13. The control device 423 can be configured by a user to independently operate the first pull roll apparatus 349 and the second pull roll apparatus 369 at constant force over time. Hence, the glass ribbon 121 experiences constant vertical forces from the root 70 to the lowest roll, the third pull roll apparatus 387.

As shown in FIG. 13, the lowest roll, the third pull roll apparatus 387, operates as the master roll and operates at constant velocity to control the speed of the glass ribbon 121.

Figure 21:
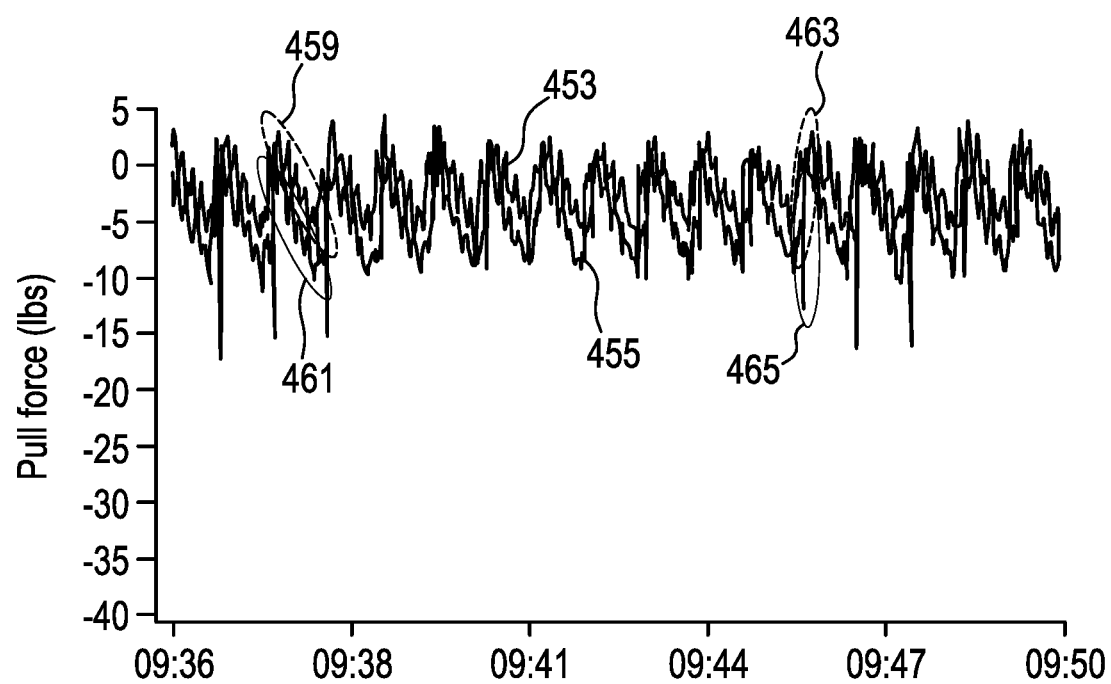
FIG. 21 illustrates an exemplary graph of the forces experienced at the lowest draw rolls according to exemplary embodiments of the disclosure.

FIG. 21 shows an example graph of the forces applied to the glass ribbon 121 by the first and second downstream pair of draw rolls 389, 397. The Y-axis is force (pounds) and the X-axis is time (hours: minutes). One plot 453 represents the force being applied to the glass ribbon 121 by the first downstream pair of draw rolls 389 at the first edge portion 121a while the other plot 455 represents the force being applied to the glass ribbon 121 by the second downstream pair of draw rolls 397 at the second edge portion 121b. The force diagram shows a saw tooth pattern associated with the gradual change in glass ribbon 121 weight due to growth and the abrupt change in glass ribbon 121 weight due to snap-off of a glass sheet 347a from the glass ribbon 121. Since the third pull roll apparatus 387 is located downstream of the visco-elastic zone 343 as described by the viscosity equation (Equation 1), in the elastic zone 345 as shown in FIG. 13, the first and second downstream pair of draw rolls 389, 397 isolate propagation of perturbations into the visco-elastic (setting) zone 343.

$$\frac{\eta(T)}{G} = 10000 \text{ sec} \qquad \text{[Equation 1]}$$

Where Viscosity ($\eta$) has units of Pa·s and Shear Modulus (G) has units of Pa. Therefore $\eta/G$ has units of time.

As shown in FIGS. 20 and 21, throughout a period of time, the first and second upstream pair of draw rolls 351, 361 and the first and second midstream pair of draw rolls 371, 379 apply a substantially constant force to the first and second edge portions 121a, 121b of the glass ribbon 121 along the draw path 353 and the first and second downstream pair of draw rolls 389, 397 apply a varying force to the first and second edge portions 121a, 121b of the glass ribbon 121 along the draw path 353.

Figure 22:
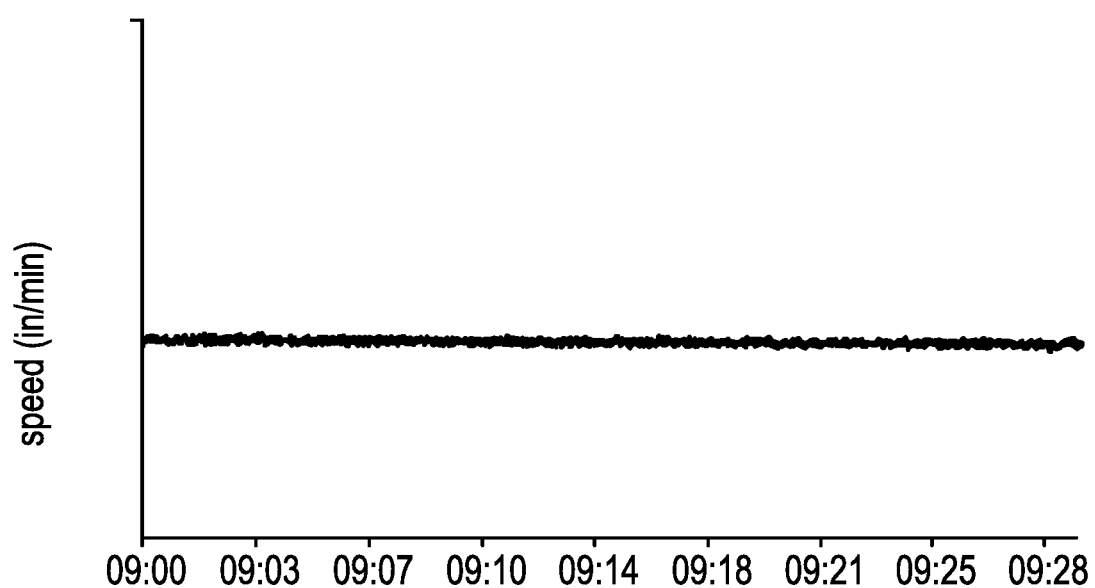
FIG. 22 illustrates an exemplary graph of the speed of the lowest draw rolls according to exemplary embodiments of the disclosure.

FIG. 22 shows the first and second downstream pairs of draw rolls 389, 397 of the third pull roll apparatus 387, which is the lowest (or master) pull roll apparatus, speed as a function of time (hours: minutes) and shows that the constant speed (each tick mark is 0.2 in/min (50.8 mm/min)) controls glass ribbon 121 thickness and maintains superior attributes. This speed is readily adjusted via the control device 423 to obtain the desired product specifications, such as thickness.

As shown in FIG. 13, the glass ribbon 121 is drawn in a draw direction 457 along the draw path 353. Turning back to FIGS. 20, 21, and 22, throughout the period of time, first and second upstream pair of draw rolls 351, 361 each applies a substantially constant force (e.g., 8 pounds) to the respective first and second edge portions 121a, 121b of the glass ribbon 121 in a direction opposite the draw direction 457. Throughout the period of time, first and second midstream pair of draw rolls 371, 379 also each applies a substantially constant force (e.g., 6 pounds) to the respective first and second edge portions 121a, 121b of the glass ribbon 121 in a direction opposite the draw direction 457. As further illustrated, the first and second downstream pair of draw rolls 389, 397 each applies a varying force to the respective first and second edge portions 121a, 121b of the glass ribbon 121 from in a direction of the draw direction 457 (e.g., from about 5 pounds) to in a direction opposite the draw direction 457 (e.g., to about 18 pounds). As such, the first edge portion 121a is constantly maintained in tension between the first upstream pair of draw rolls 351, the first midstream pair of draw rolls 371, and the first downstream pair of draw rolls 389 throughout the period of time. Likewise, the second edge portion 121b is constantly maintained in tension between the second upstream pair of draw rolls 361, the second midstream pair of draw rolls 379, and the second downstream pair of draw rolls 397 throughout the period of time. In further examples, all forces on both edges 121a, 121b may act in the positive or negative direction with respect to the draw direction 457 depending on the apparatus set up.

As further shown in FIG. 21, the first and second downstream pairs of draw rolls 389, 397 each applies a varying force due to the constant angular velocity associated with the draw rolls 389, 397. The patterns 459, 461 of the plots 453, 455 represents the changing force as the glass ribbon 121 increases in length while the patterns 463, 465 represent the sudden change in force that occurs during separation of a glass sheet 347a from the glass ribbon 121. During the same period of time, the constant torque of the first and second upstream pair of draw rolls 351, 361 can maintain a substantially constant force to the glass ribbon 121, and the constant torque of the first and second midstream pair of draw rolls 371, 379 can also maintain a substantially constant force to the glass ribbon 121. As such, force disturbances can be prevented from being transmitted up the glass ribbon into the setting zone 343 where stress concentrations and corresponding surface defects may be undesirably frozen into the glass ribbon 121.

As such, methods of the present disclosure can independently operate the first pull roll apparatus 349 over a period of time such that the first upstream pair of draw rolls 351 apply a substantially constant force to the first edge portion 121a of the glass ribbon 121 along the draw path 353. The method can further include the step of independently operating the second pull roll apparatus 369 over the period of time such that at least one of the first downstream pair of draw rolls 371 apply a substantially constant force to the first edge portion 121a of the glass ribbon 121 along the draw path 353. The method can further include the step of independently operating the third pull roll apparatus 387 over the period of time such that at least one of the first downstream pair of draw rolls 389 rotates with a substantially constant angular velocity and the first downstream pair of draw rolls 389 apply a varying force to the first edge portion 121a of the glass ribbon 121 along the draw path 353. The method can further include the step of sequentially separating a plurality of glass sheets 347a from the glass ribbon 121 over the period of time at a location downstream along the draw path 353 from the first downstream pair of draw rolls 389.

As discussed above, the first pull roll apparatus 349 can be provided with a second upstream pair of draw rolls 361. In such examples, the method can further include the step of operating the first pull roll apparatus 349 such that the second upstream pair of draw rolls 361 apply a substantially constant force to the second edge portion 121b of the glass ribbon 121 along the draw path 353. As mention previously, the second pull roll apparatus 369 can include a second midstream pair of draw rolls 379 positioned downstream along the draw path 353 from the second upstream pair of draw rolls 361. The method can further include the step of operating the second pull roll apparatus 369 such that the second midstream pair of draw rolls 379 apply a substantially constant force to the second edge portion 121b of the glass ribbon 121 along the draw path 353. Still further, as mention previously, the third pull roll apparatus 387 can include a second downstream pair of draw rolls 397 positioned downstream along the draw path 353 from the second midstream pair of draw rolls 379. In such examples, the method can further include the step of operating the third pull roll apparatus 387 such that at least one of the second downstream pair of draw rolls 397 rotates with a substantially constant angular velocity and the second downstream pair of draw rolls 397 apply a varying force to the second edge portion 121b of the glass ribbon 121 along the draw path 353.

The method can further include the step of independently operating the intermediate pull roll apparatus 405, when provided, over the period of time such that at least one of the first intermediate pair of draw rolls 407 apply a substantially constant force to the first edge portion 121a of the glass ribbon 121 along the draw path 353. As discussed above, the intermediate pull roll apparatus 405 can be provided with a second intermediate pair of draw rolls 415. In such examples, the method can further include the step of operating the intermediate pull roll apparatus 405 such that the second intermediate pair of draw rolls 415 apply a substantially constant force to the second edge portion 121b of the glass ribbon 121 along the draw path 353.

The pull roll device 315 can be used to improve the consistency of a cross-draw tension and/or down-draw sheet tension in the glass ribbon which reduces residual stress and improves glass flatness on the manufactured glass ribbon. More specifically, the pull roll device 315 can be used to control and improve the consistency of the cross-draw tension and/or down-draw sheet tension in the area where the glass ribbon is passing through the setting zone where the product stress and flatness are set in the glass ribbon.

In a comparative exemplary embodiment, a pull roll device may only have an upper pull roll apparatus and a lower pull roll apparatus. In such a comparative pull roll device, a pinch force to achieve the necessary constant torque or constant velocity at the upper pull roll apparatus and the lower pull roll apparatus, respectively, would have to be too great for large weight glass ribbon, such that the pinch force between a pair of draw rolls would crack the glass ribbon. Large weight glass ribbon may be present when manufacturing large glass sheets of large width and large length and a small thickness.

Moreover, operating the upstream pairs of draw rolls, the midstream pairs of draw rolls, and when provided, the intermediate pairs of draw rolls, in substantially constant torque mode as set forth by exemplary embodiments of the present application and as shown by plots 449, 451 provides further advantages over operating the upstream pairs of draw rolls and the midstream pairs of draw rolls with a substantially constant angular velocity. First, a constant angular velocity of the upstream and midstream pairs of draw rolls, and when provided, the intermediate pairs of draw rolls, may provide different tensions at different diameters in the rolls. In contrast, operating the upstream and midstream pairs of draw rolls, and when provided, the intermediate pairs of draw rolls, at substantially constant torques allows consistent vertical tension to be achieved over time. Indeed, operating with substantially constant torques nearly compensates for wear of the rolls. Forces change slightly with roll diameter as the roll wears at constant torque, but the effect is very small. Velocity control has a much higher sensitivity to roll diameter. Second, a constant angular velocity of the upstream and midstream pairs of draw rolls, and when provided, the intermediate pairs of draw rolls, may prove difficult to correlate with the sheet speed due to the diameter uncertainty of the roll. In contrast, operating the upstream and midstream pairs of draw rolls, and when provided, the intermediate pairs of draw rolls, with substantially constant torque removes the need to correlate to obtain the proper angular velocity of the roller. Third, operating the upstream and midstream pairs of draw rolls, and when provided, the intermediate pairs of draw rolls, with substantially constant torque can avoid the risk of buckling or crack out that may occur when trying to adjust the speed of the upstream or midstream pairs of draw rolls, or when provided, the intermediate pairs of draw rolls, to compensate for roll wear. Fourth, operating the upstream and midstream pairs of draw rolls, and when provided, the intermediate pairs of draw rolls, with a substantially constant torque can avoid the risk of the rolls skipping if the constant angular velocity is too slow. Fifth, operating the upstream and midstream pairs of draw rolls, and when provided, the intermediate pairs of draw rolls, can avoid excess pull force variability that may occur due to roll run-out in constant angular velocity mode.

Thus, exemplary embodiments of the disclosure enable increased traction on the glass ribbon due to the use of multiple elevations of driven rolls. Accordingly, larger, heavier sheets, and thinner sheets with flatter surfaces may be manufactured. Exemplary embodiments of the disclosure enable application of modular design that readily extends into four or more elevations. Exemplary embodiments of the disclosure enable the placement of driven rolls at the desired elevations to provide the vertical and cross draw forces required to maintain flat glass ribbon through the visco-elastic zone. Accordingly, longer and wider visco-elastic zones can be achieved. Exemplary embodiments of the disclosure enable placement of the lowest roll below the visco-elastic zone to maintain constant vertical force from the root through the visco-elastic zone as well as to isolate the visco-elastic zone from perturbations downstream, for example, perturbations such as impact of ribbon growth and snap-off of the ribbon into sheet.

Some of the functional units, such as the control device, described in this specification have been labeled as modules, in order to emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like. A module may also be implemented with valves, pistons, gears, connecting members, and springs, or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

A module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. Operational data may be collected as a single data set, or may be distributed over different locations including over different storage devices.

Glass Compositions

Alkali aluminosilicate glasses have good ion exchangeability, and chemical strengthening processes have been used to achieve high strength and high toughness properties in alkali aluminosilicate glasses. Alkalki aluminosilicate glasses are highly ion exchangeable glasses with high glass formability and quality. The substitution of $Al_2O_3$ into the silicate glass network increases the interdiffusivity of monovalent cations during ion exchange. By chemical strengthening in a molten salt bath (e.g., $KNO_3$ or $NaNO_3$), glasses with high strength, high toughness, and high indentation cracking resistance can be achieved.

Therefore, alkali aluminosilicate glasses with good physical properties, chemical durability, and ion exchangeability have drawn attention for use as cover glass and/or as a portion of consumer electronic devices. In particular, lithium containing aluminosilicate glasses, which have lower annealing and softening temperatures, lower coefficient of thermal expansion (CTE) values, and fast ion exchangeability, are provided herein. Through different ion exchange processes, greater central tension (CT), depth of compression (DOC), and high compressive stress (CS) can be achieved. However, the addition of lithium in the alkali aluminosilicate glass may reduce the melting point or softening point of the glass. Accordingly, a balance of the various glass components that allows the glass to realize the benefits of adding lithium to the glass composition, but that does not negatively impact the glass composition are provided herein.

In embodiments of glass compositions described herein, the concentration of constituent components (e.g., $SiO_2$, $Al_2O_3$, $Li_2O$, and the like) are given in mole percent (mol %) on an oxide basis, unless otherwise specified. Components of the Li containing aluminosilicate glass composition according to embodiments are discussed individually below. It should be understood that any of the variously recited ranges of one component may be individually combined with any of the variously recited ranges for any other component.

In an exemplary Li containing aluminosilicate glass composition, $SiO_2$ is the largest constituent and, as such, $SiO_2$ is the primary constituent of the glass network formed from the glass composition. Pure $SiO_2$ has a relatively low CTE and is alkali free. However, pure $SiO_2$ has a high melting point. Accordingly, if the concentration of $SiO_2$ in the glass composition is too high, the formability of the glass composition may be diminished as higher concentrations of $SiO_2$ increase the difficulty of melting the glass, which, in turn, adversely impacts the formability of the glass. In embodiments, the glass composition generally comprises $SiO_2$ in an amount from greater than or equal to 60% to less than or equal to 74 mol % and all ranges and sub-ranges between the foregoing values. In some embodiments, the glass composition comprises $SiO_2$ in amounts greater than or equal to 62 mol %, greater than or equal to 64 mol %, greater than or equal to 66 mol %, greater than or equal to 68 mol %, greater than or equal to 70 mol %, or greater than or equal to 72 mol %. In some embodiments, the glass composition comprises $SiO_2$ in amounts less than or equal to 72 mol %, less than or equal to 70 mol %, less than or equal to 68 mol %, less than or equal to 66 mol %, less than or equal to 64 mol %, or less than or equal to 62 mol %. In other embodiments, the glass composition comprises $SiO_2$ in an amount from greater than or equal to 60 mol % to less than or equal to 66 mol %, or from greater than or equal to 65 mol % to less than or equal to 74 mol %, or from greater than or equal to 66 mol % to less than or equal to 70 mol %, and all ranges and sub-ranges between the foregoing values.

The glass composition of embodiments may further comprise $Al_2O_3$. $Al_2O_3$ may serve as a glass network former, similar to $SiO_2$. $Al_2O_3$ may increase the viscosity of the glass composition due to its tetrahedral coordination in a glass melt formed from a properly designed glass composition, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes, such as the fusion forming process. In embodiments, the glass composition generally comprises $Al_2O_3$ in a concentration of from greater than or equal to 7 mol % to less than or equal to 18 mol % and all ranges and sub-ranges between the foregoing values. In some embodiments, the glass composition comprises $Al_2O_3$ in amounts greater than or equal to 8 mol %, greater than or equal to 9 mol %, greater than or equal to 10 mol %, greater than or equal to 11 mol %, greater than or equal to 12 mol %, greater than or equal to 13 mol %, greater than or equal to 14 mol %, greater than or equal to 15 mol %, greater than or equal to 16 mol %, or greater than or equal to 17 mol %. In some embodiments, the glass composition comprises $Al_2O_3$ in amounts less than or equal to 18 mol %, less than or equal to 17 mol %, less than or equal to 16 mol %, less than or equal to 15 mol %, less than or equal to 14 mol %, less than or equal to 13 mol %, less than or equal to 12 mol %, less than or equal to 11 mol %, less than or equal to 10 mol %, less than or equal to 9 mol %, or less than or equal to 8 mol %. In other embodiments, the glass composition comprises $Al_2O_3$ in an amount from greater than or equal to 8 mol % to less than or equal to 17 mol %, such as from greater than or equal to 9 mol % to less than or equal to 16 mol %, from greater than or equal to 10 mol % to less than or equal to 15 mol %, or from greater than or equal to 11 mol % to less than or equal to 14 mol % and all ranges and sub-ranges between the foregoing values. In yet other embodiments, the glass composition comprises $Al_2O_3$ in an amount from greater than or equal to 11.5 mol % to less than or equal to 18 mol %, or from greater than or equal to 7 mol % to less than or equal to 12 mol %, and all ranges and sub-ranges between the foregoing values.

Like $SiO_2$ and $Al_2O_3$, $P_2O_5$ may be added to the glass composition as a network former, thereby reducing the meltability and formability of the glass composition. Thus, $P_2O_5$ may be added in amounts that do not overly decrease these properties. In embodiments, the glass composition may comprise $P_2O_5$ in amounts from greater than or equal to 0 mol % to less than or equal to 5 mol % and all ranges and sub-ranges between the foregoing values. In some embodiments, the glass composition may comprise $P_2O_5$ in amounts greater than or equal to 0.5 mol %, greater than or equal to 1 mol %, greater than or equal to 1.5 mol %, greater than or equal to 2 mol %, greater than or equal to 2.5 mol %, greater than or equal to 3 mol %, greater than or equal to 3.5 mol %, greater than or equal to 4 mol %, or greater than or equal to 4.5 mol %. In other embodiments, the glass composition may comprise $P_2O_5$ in an amount less than or equal to 5 mol %, less than or equal to 4.5 mol %, less than or equal to 4 mol %, less than or equal to 3.5 mol %, less than or equal to 3 mol %, less than or equal to 2.5 mol %, less than or equal to 2 mol %, less than or equal to 1.5 mol %, less than or equal to 1 mol %, less than or equal to 0.5 mol %. In yet other embodiments, the glass composition may comprise $P_2O_5$ in amounts from greater than or equal to 0.5 mol % to less than or equal to 4.5 mol %, from greater than or equal to 1 mol % to less than or equal to 4 mol %, from greater than or equal to 1.5 mol % to less than or equal to 3.5 mol %, or from greater than or equal to 2 mol % to less than or equal to 3 mol %, and all ranges and sub-ranges between the foregoing values.

Like $SiO_2$, $Al_2O_3$, and $P_2O_5$, $B_2O_3$ may be added to the glass composition as a network former, thereby reducing the meltability and formability of the glass composition. Thus, $B_2O_3$ may be added in amounts that do not overly decrease these properties. In embodiments, the glass composition may comprise $B_2O_3$ in amounts from greater than or equal to 3 mol % $B_2O_3$ to less than or equal to 16 mol % $B_2O_3$ and all ranges and sub-ranges between the foregoing values. In some embodiments, the glass composition may comprise $B_2O_3$ in amounts greater than or equal to 3.5 mol %, greater than or equal to 4 mol %, greater than or equal to 4.5 mol %, greater than or equal to 5 mol %, greater than or equal to 5.5 mol %, greater than or equal to 6 mol %, greater than or equal to 6.5 mol %, greater than or equal to 7 mol %, greater than or equal to 7.5 mol %, greater than or equal to 8 mol %, greater than or equal to 8.5 mol %, greater than or equal to 9 mol %, greater than or equal to 9.5 mol %, greater than or equal to 10 mol %, greater than or equal to 10.5 mol %, greater than or equal to 11 mol %, greater than or equal to 11.5 mol %, greater than or equal to 12 mol %, greater than or equal to 12.5 mol %, greater than or equal to 13 mol %, greater than or equal to 13.5 mol %, greater than or equal to 14 mol %, greater than or equal to 14.5 mol %, greater than or equal to 15 mol %, or greater than or equal to 15.5 mol %. In other embodiments, the glass composition may comprise $B_2O_3$ in an amount less than or equal to 15.5 mol %, less than or equal to 15 mol %, less than or equal to 14.5 mol %, less than or equal to 14 mol %, less than or equal to 13.5 mol %, less than or equal to 13 mol %, less than or equal to 12.5 mol %, less than or equal to 12 mol %, less than or equal to 11.5 mol %, less than or equal to 11 mol %, less than or equal to 10.5 mol %, less than or equal to 10 mol %, less than or equal to 9.5 mol %, less than or equal to 9 mol %, less than or equal to 8.5 mol %, less than or equal to 8 mol %, less than or equal to 7.5 mol %, less than or equal to 7 mol %, less than or equal to 6.5 mol %, less than or equal to 6 mol %, less than or equal to 5.5 mol %, less than or equal to 5 mol %, less than or equal to 4.5 mol %, less than or equal to 4 mol %, or less than or equal to 3.5 mol %. In yet other embodiments, the glass composition comprises $B_2O_3$ in amounts from greater than or equal to 3.5 mol % to less than or equal to 15.5 mol %, greater than or equal to 4 mol % to less than or equal to 15 mol %, greater than or equal to 4.5 mol % to less than or equal to 14.5 mol %, greater than or equal to 5 mol % to less than or equal to 14 mol %, greater than or equal to 5.5 mol % to less than or equal to 13.5 mol %, greater than or equal to 6 mol % to less than or equal to 13 mol %, greater than or equal to 6.5 mol % to less than or equal to 12.5 mol %, greater than or equal to 7 mol % to less than or equal to 12 mol %, greater than or equal to 7.5 mol % to less than or equal to 11.5 mol %, greater than or equal to 8 mol % to less than or equal to 11 mol %, greater than or equal to 8.5 mol % to less than or equal to 10.5 mol %, greater than or equal to 9 mol % to less than or equal to 10 mol %, from greater than or equal to 3 mol % to less than or equal to 8 mol %, from greater than or equal to 5 mol % to less than or equal to 16 mol %, and all ranges and sub-ranges between the foregoing values.

The effects of $Li_2O$ in the glass composition are discussed above and discussed in further detail below. In part, the addition of lithium in the glass allows for better control of an ion exchange process and further reduces the softening point of the glass. In embodiments, the glass composition generally comprises $Li_2O$ in an amount from greater than or equal to 5 mol % to less than or equal to 11 mol % and all ranges and sub-ranges between the foregoing values. In some embodiments, the glass composition comprises $Li_2O$ in amounts greater than or equal to 5.5 mol %, greater than or equal to 6 mol %, greater than or to 6.5 mol %, greater than or equal to 7 mol %, greater than or equal to 7.5 mol %, greater than or equal to 8 mol %, greater than or equal to 8.5 mol %, greater than or equal to 9 mol %, greater than or equal to 9.5 mol %, greater than or equal to 10 mol %, or greater than or equal to 10.5 mol %. In some embodiments, the glass composition comprises $Li_2O$ in amounts less than or equal to 10.5 mol %, less than or equal to 10 mol %, less than or to 9.5 mol %, less than or equal to 9 mol %, less than or equal to 8.5 mol %, less than or equal to 8 mol %, less than or equal to 7.5 mol %, less than or equal to 7 mol %, less than or equal to 6.5 mol %, less than or equal to 6 mol %, or less than or equal to 5.5 mol %. In yet other embodiments, the glass composition comprises $Li_2O$ in an amount from greater than or equal to 5.5 mol % to less than or equal to 10.5 mol %, such as from greater than or equal to 6 mol % to less than or equal to 10 mol %, from greater than or equal to 6.5 mol % to less than or equal to 9.5 mol %, from greater than or equal to 7 mol % to less than or equal to 9 mol %, or from greater than or equal to 7.5 mol % to less than or equal to 8.5 mol %, and all ranges and sub-ranges between the foregoing values.

According to embodiments, the glass composition may also comprise alkali metal oxides other than $Li_2O$, such as $Na_2O$ and $K_2O$, for example. $Na_2O$ aids in the ion exchangeability of the glass composition, and also increases the melting point of the glass composition and improves formability of the glass composition. However, if too much $Na_2O$ is added to the glass composition, the coefficient of thermal expansion (CTE) may be too low, and the melting point may be too high. In embodiments, the glass composition generally comprises $Na_2O$ in an amount from greater than 0 mol % to less than or equal to 6 mol % or from greater than or equal to 0 mol % to less than or equal to 6 mol % and all ranges and sub-ranges between the foregoing values. In some embodiments, the glass composition comprises $Na_2O$ in amounts greater than or equal to 0.5 mol %, greater than or equal to 1 mol %, greater than or to 1.5 mol %, greater than or equal to 2 mol %, greater than or equal to 2.5 mol %, greater than or equal to 3 mol %, greater than or equal to 3.5 mol %, greater than or equal to 4 mol %, greater than or equal to 4.5 mol %, greater than or equal to 5 mol %, greater than or equal to 5.5 mol %. In some embodiments, the glass composition comprises $Na_2O$ in amounts less than or equal to 5.5 mol %, less than or equal to 5 mol %, less than or to 4.5 mol %, less than or equal to 4 mol %, less than or equal to 3.5 mol %, less than or equal to 3 mol %, less than or equal to 2.5 mol %, less than or equal to 2 mol %, less than or equal to 1.5 mol %, less than or equal to 1 mol %, or less than or equal to 0.5 mol %. In other embodiments, the glass composition comprises $Na_2O$ in an amount from greater than or equal to 0.5 mol % to less than or equal to 5.5 mol %, such as from greater than or equal to 1 mol % to less than or equal to 5 mol %, from greater than or equal to 1.5 mol % to less than or equal to 4.5 mol %, from greater than or equal to 2 mol % to less than or equal to 4 mol %, or from greater than or equal to 2.5 mol % to less than or equal to 3.5 mol %, from greater than or equal to 2 mol % to less than or equal to 6 mol %, from greater than or equal to 0 mol % to less than or equal to 4 mol %, and all ranges and sub-ranges between the foregoing values.

Like $Na_2O$, $K_2O$ also promotes ion exchange and increases the DOC of a compressive stress layer. However, the CTE may be too low, and the melting point may be too high. In embodiments, the glass composition is substantially free of potassium. As used herein, the term "substantially free" means that the component is not added as a component of the batch material even though the component may be present in the final glass in very small amounts as a contaminate, such as less than 0.1 mol %. In other embodiments, $K_2O$ may be present in the glass composition in amounts less than 1 mol %.

MgO lowers the viscosity of a glass, which enhances the formability, the strain point and the Young's modulus, and may improve the ion exchange ability. However, when too much MgO is added to the glass composition, the density and the CTE of the glass composition increase. In embodiments, the glass composition generally comprises MgO in a concentration of from greater than or equal to 0 mol % to less than or equal to 6.5 mol % and all ranges and sub-ranges between the foregoing values. In some embodiments, the glass composition comprises MgO in amounts greater than or equal to 0.5 mol %, greater than or equal to 1 mol %, greater than or to 1.5 mol %, greater than or equal to 2 mol %, greater than or to 2.5 mol %, greater than or equal to 3 mol %, greater than or to 3.5 mol %, greater than or equal to 4 mol %, greater than or equal to 4.5 mol %, greater than or equal to 5 mol %, greater than or equal to 5.5 mol %, or greater than or equal to 6 mol %. In some embodiments, the glass composition comprises MgO in amounts less than or equal to 6 mol %, less than or equal to 5.5 mol %, less than or equal to 5 mol %, less than or equal to 4.5 mol %, less than or equal to 4 mol %, less than or equal to 3.5 mol % less than or equal to 3 mol %, less than or equal to 2.5 mol %, less than or equal to 2 mol %, less than or equal to 1.5 mol %, or less than or equal to 1 mol %. In other embodiments, the glass composition comprises MgO in an amount from greater than or equal to 0.5 mol % to less than or equal to 6 mol %, such as from greater than or equal to 1 mol % to less than or equal to 5.5 mol %, from greater than or equal to 1.5 mol % to less than or equal to 5 mol %, from greater than or equal to 2 mol % to less than or equal to 4.5 mol %, from greater than or equal to 2.5 mol % to less than or equal to 4 mol %, or from greater than or equal to 3 mol % to less than or equal to 3.5 mol %, and all ranges and sub-ranges between the foregoing values.

CaO lowers the viscosity of a glass, which enhances the formability, the strain point and the Young's modulus, and may improve the ion exchange ability. However, when too much CaO is added to the glass composition, the density and the CTE of the glass composition increase. In embodiments, the glass composition generally comprises CaO in a concentration of from greater than or equal to 0 mol % to less than or equal to 5 mol % and all ranges and sub-ranges between the foregoing values. In some embodiments, the glass composition comprises CaO in amounts greater than or equal to 0.5 mol %, greater than or equal to 1 mol %, greater than or to 1.5 mol %, greater than or equal to 2 mol %, greater than or to 2.5 mol %, greater than or equal to 3 mol %, greater than or to 3.5 mol %, greater than or equal to 4 mol %, or greater than or equal to 4.5 mol %. In some embodiments, the glass composition comprises CaO in amounts less than or equal to 4.5 mol %, less than or equal to 4 mol %, less than or equal to 3.5 mol %, less than or equal to 3 mol %, less than or equal to 2.5 mol %, less than or equal to 2 mol %, less than or equal to 1.5 mol %, less than or equal to 1 mol %, or less than or equal to 0.5 mol %. In other embodiments, the glass composition comprises CaO in an amount from greater than or equal to 0.5 mol % to less than or equal to 4.5 mol %, such as from greater than or equal to 1 mol % to less than or equal to 4 mol %, from greater than or equal to 1.5 mol % to less than or equal to 3 mol %, or from greater than or equal to 2 mol % to less than or equal to 3 mol %, and all ranges and sub-ranges between the foregoing values.

In embodiments, the glass composition may optionally include one or more fining agents. In some embodiments, the fining agents may include, for example, $SaO_2$. In such embodiments, $SnO_2$ may be present in the glass composition in an amount less than or equal to 0.2 mol %, such as from greater than or equal to 0 mol % to less than or equal to 0.11 mol % and all ranges and sub-ranges between the foregoing values. In other embodiments, $SnO_2$ may be present in the glass composition in an amount from greater than or equal to 0 mol % to less than or equal to 0.2 mol %, or greater than or equal to 0.1 mol % to less than or equal to 0.2 mol %, and all ranges and sub-ranges between the foregoing values.

ZnO enhances the ion exchange performance of a glass, such as by increasing the compressive stress of the glass. However, adding too much ZnO may increase density and cause phase separation. In embodiments, the glass composition may comprise ZnO in amounts from greater than or equal to 0 mol % to less than or equal to 2 mol %, such from greater than or equal to 0.5 mol % to less than or equal to 1.5 mol % and all ranges and sub-ranges between the foregoing values. In some embodiments, the glass composition may comprise ZnO in amounts greater than or equal to 0.5 mol %, greater than or equal to 1 mol %, or greater than or equal to 1.5 mol %. In other embodiments, the glass composition may comprise ZnO in amounts less than or equal to 1.5 mol %, less than or equal to 1 mol %, or less than or equal to 0.5 mol %.

SrO lowers the liquidus temperature of glass articles disclosed herein. In embodiments, the glass composition may comprise SrO in amounts from greater than or equal to 0.5 mol % to less than or equal to 2 mol %, such as from greater than or equal to 1 mol % to less than or equal to 1.5 mol % and all ranges and sub-ranges between the foregoing values. In some embodiments, the glass composition may comprise SrO in amounts greater than or equal to 1 mol % or greater than or equal to 1.5 mol %. In other embodiments, the glass composition may comprise SrO in amounts less than or equal to 1.5 mol %, less than or equal to 1 mol %, or less than or equal to 0.5 mol %.

In addition to the above individual components, glass compositions according to embodiments disclosed herein may comprise divalent cation oxides in amounts from greater than or equal to 0.5 mol % to less than or equal to 6.5 mol % and all ranges and sub-ranges between the foregoing values. As used herein, divalent cation oxides include, but are not limited to MgO, CaO, SrO, BaO, FeO, and ZnO. In some embodiments, the glass composition may comprise divalent cation oxides in an amount greater than or equal to 1 mol %, greater than or equal to 1.5 mol %, greater than or equal to 2 mol %, greater than or equal to 2.5 mol %, greater than or equal to 3 mol %, greater than or equal to 3.5 mol %, greater than or equal to 4 mol %, greater than or equal to 4.5 mol %, greater than or equal to 5 mol %, greater than or equal to 5.5 mol %, or greater than or equal to 6 mol %. In other embodiments, the glass composition may comprise divalent cation oxides in an amount less than or equal to 5.5 mol %, less than or equal to 5 mol %, less than or equal to 4.5 mol %, less than or equal to 4 mol %, less than or equal to 3.5 mol %, less than or equal to 3 mol %, less than or equal to 2.5 mol %, less than or equal to 2 mol %, less than or equal to 1.5 mol %, or less than or equal to 1 mol %. In yet other embodiments, the glass composition may comprise divalent cation oxides in amounts from greater than or equal to 1 mol % to less than or equal to 6 mol %, greater than or equal to 1.5 mol % to less than or equal to 5.5 mol %, greater than or equal to 2 mol % to less than or equal to 5 mol %, greater than or equal to 2.5 mol % to less than or equal to 4.5 mol %, or greater than or equal to 3.2 mol % to less than or equal to 3 mol %, and all ranges and sub-ranges between the foregoing values.

In embodiments, a molar ratio of $Li_2O:R_2O$ is greater than or equal to 0.4, where $R_2O$ is the sum of alkali metal oxides present in the glass composition (e.g., $Li_2O+Na_2O+K_2O$). The amount of $Li_2O$ in the glass composition increases the CT, and improves the compressive stress profile of the glass article, which may lead to improved mechanical performance, such as improved damage resistance. Therefore, having a high ratio of $Li_2O$ to other alkali metal oxides, such as greater than or equal to 0.4, provides these improvements. In some embodiments, the molar ratio of $Li_2O:R_2O$ is greater than or equal to 0.5, greater than or equal to 0.6, greater than or equal to 0.7, greater than or equal to 0.8, greater than or equal to 0.9, or equal to about 1. In some embodiments, the molar ratio of $Li_2O:R_2O$ is less than or equal to 1, less than or equal to 0.9, less than or equal to 0.8, less than or equal to 0.7, less than or equal to 0.6, or less than or equal to 0.5. In yet other embodiments, the molar ratio of $Li_2O:R_2O$ is from greater than or equal to 0.4 to less than or equal to 1, greater than or equal to 0.5 to less than or equal to 1, greater than or equal to 0.6 to less than or equal to 1, greater than or equal to 0.7 to less than or equal to 1, greater than or equal to 0.8 to less than or equal to 1, or greater than or equal to 0.9 to less than or equal to 1 and all ranges and sub-ranges between the foregoing values. In still other embodiments, the molar ratio of $Li_2O:R_2O$ is from greater than or equal to 0.4 to less than or equal to 0.9, greater than or equal to 0.4 to less than or equal to 0.8, greater than or equal to 0.4 to less than or equal to 0.7, greater than or equal to 0.4 to less than or equal to 0.6, or greater than or equal to 0.4 to less than or equal to 0.5.

In embodiments, a molar ratio of $Al_2O_3:(R_2O+RO)$ is greater than or equal to 0.9, where RO is the sum of divalent cation oxides and $R_2O$ is the sum of alkali metal oxides present in the glass composition. Having an increased ratio of $Al_2O_3$ to $R_2O+RO$ improves the liquidus temperature and viscosity of the glass article. Having this ratio greater than or equal to 0.9 results in a more dense glass that is less brittle and has higher damage resistance. In some embodiments, the molar ratio of $Al_2O_3:(R_2O+RO)$ is greater than or equal to 1, greater than or equal to 1.1, greater than or equal to 1.2, greater than or equal to 1.3, greater than or equal to 1.4, or greater than or equal to 1.5. In other embodiments, a molar ratio of $Al_2O_3:(R_2O+RO)$ is less than or equal to 1.5, less than or equal to 1.4, less than or equal to 1.3, less than or equal to 1.2, less than or equal to 1.1, or less than or equal to 1. In yet other embodiments, the molar ratio of $Al_2O_3:(R_2O+RO)$ is from greater than or equal to 0.9 to less than or equal to 1.5, from greater than or equal to 1 to less than or equal to 1.5, from greater than or equal to 1.1 to less than or equal to 1.5, from greater than or equal to 1.2 to less than or equal to 1.5, from greater than or equal to 1.3 to less than or equal to 1.5, or from greater than or equal to 1.4 to less than or equal to 1.5 and all ranges and sub-ranges between the foregoing values. In still other embodiments, the molar ratio of $Al_2O_3:(R_2O+RO)$ is from greater than or equal to 0.9 to less than or equal to 1.4, greater than or equal to 0.9 to less than or equal to 1.3, greater than or equal to 0.9 to less than or equal to 1.2, greater than or equal to 0.9 to less than or equal to 1.1, or greater than or equal to 0.9 to less than or equal to 1 and all ranges and sub-ranges between the foregoing values.

In embodiments, the total amount of network forming components $Al_2O_3+SiO_2+B_2O_3+P_2O_5$ is greater than or equal to 80 mol %, such as greater than or equal to 82 mol, greater than or equal to 84 mol %, greater than or equal to 86 mol %, greater than or equal to 88 mol %, greater than or equal to 90 mol %, greater than or equal to 92 mol %, or greater than or equal to 94 mol %. Having a high amount of network forming agents increases the density of the glass, which makes it less brittle and improves the damage resistance. In other embodiments, the total amount of network forming components is less than or equal to 94 mol %, less than or equal to 92 mol %, less than or equal to 90 mol %, less than or equal to 88 mol %, less than or equal to 86 mol %, less than or equal to 84 mol %, or less than or equal to 82 mol %. In yet other embodiments, the total amount of network forming components is from greater than or equal to 80 mol % to less than or equal to 94 mol %, greater than or equal to 82 mol % to less than or equal to 92 mol %, greater than or equal to 84 mol % to less than or equal to 90 mol %, or greater than or equal to 86 mol % to less than or equal to 88 mol %, and all ranges and sub-ranges between the foregoing values.

Without limiting compositions possibly chosen from each of the various components recited above, in some embodiments, the glass composition may comprise from greater than or equal to 60 mol % to less than or equal to 74 mol % $SiO_2$; from greater than or equal to 7 mol % to less than or equal to 18 mol % $Al_2O_3$; from greater than or equal to 3 mol % to less than or equal to 16 mol % $B_2O_3$; from greater than 0 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; less than or equal to 0.2 mol % $SnO_2$; and from greater than or equal to 0.5 mol % to less than or equal to 6.5 mol % divalent cation oxides, wherein a molar ratio of $Al_2O_3$:($R_2O$+RO) is greater than or equal to 0.9. In other embodiments, the glass composition may comprise from greater than or equal to 60 mol % to less than or equal to 66 mol % $SiO_2$; from greater than or equal to 11.5 mol % to less than or equal to 18 mol % $Al_2O_3$; from greater than or equal to 3 mol % to less than or equal to 8 mol % $B_2O_3$; from greater than or equal to 2 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; and from greater than or equal to 0.5 mol % to less than or equal to 6.5 mol % divalent cation oxides, wherein a molar ratio of $Al_2O_3$:($R_2O$+RO) is greater than or equal to 0.9. In still other embodiments, the glass may comprise from greater than or equal to 65 mol % to less than or equal to 74 mol % $SiO_2$; from greater than or equal to 7 mol % to less than or equal to 12 mol % $Al_2O_3$; from greater than or equal to 5 mol % to less than or equal to 16 mol % $B_2O_3$; from greater than or equal to 0 mol % to less than or equal to 4 mol % $Na_2O$; from greater than or equal to 0 mol % to less than or equal to 5 mol % $P_2O_5$; from greater than or equal to 5 mol % to less than or equal to 11 mol % $Li_2O$; and from greater than or equal to 0.5 mol % to less than or equal to 6.5 mol % divalent cation oxides, wherein a molar ratio of $Al_2O_3$:($R_2O$+RO) is greater than or equal to 0.9.

In embodiments, the glass article may be substantially free of one or both of arsenic and antimony. In other embodiments, the glass article may be free of one or both of arsenic and antimony.

Physical properties of Li containing aluminosilicate glass compositions as disclosed above will now be discussed. The properties discussed below show the results of adding lithium to aluminosilicate glasses or alkali aluminosilicate glasses. These physical properties can be achieved by modifying the component amounts of the Li containing aluminosilicate glass composition, as will be discussed in more detail with reference to the examples. Heretofore, the effect that lithium has on the physical properties of glass compositions was not clearly understood.

Glass compositions according to embodiments may have a density from greater than or equal to 2.20 $g/cm^3$ to less than or equal to 2.50 $g/cm^3$, such as from greater than or equal to 2.25 $g/cm^3$ to less than or equal to 2.50 $g/cm^3$, or from greater than or equal to 2.30 $g/cm^3$ to less than or equal to 2.50 $g/cm^3$, from greater than or equal to 2.35 $g/cm^3$ to less than or equal to 2.50 $g/cm^3$, from greater than or equal to 2.40 $g/cm^3$ to less than or equal to 2.50 $g/cm^3$, or from greater than or equal to 2.45 $g/cm^3$ to less than or equal to 2.50 $g/cm^3$. In other embodiments, the glass composition may have a density from greater than or equal to 2.20 $g/cm^3$ to less than or equal to 2.45 $g/cm^3$, from greater than or equal to 2.20 $g/cm^3$ to less than or equal to 2.40 $g/cm^3$, from greater than or equal to 2.20 $g/cm^3$ to less than or equal to 2.35 $g/cm^3$, from greater than or equal to 2.20 $g/cm^3$ to less than or equal to 2.30 $g/cm^3$, or from greater than or equal to 2.20 $g/cm^3$ to less than or equal to 2.25 $g/cm^3$ and all ranges and sub-ranges between the foregoing values. Generally, as larger, denser alkali metal cations, such as $Na^+$ or $K^+$, are replaced with smaller alkali metal cations, such as $Li^+$, in an alkali aluminosilicate glass composition, the density of the glass composition decreases. Accordingly, the higher the amount of lithium in the glass composition, the less dense the glass composition will be. The density values recited in this disclosure refer to a value as measured by the buoyancy method of ASTM C693-93 (2013).

The strain point, annealing point, and softening point of glass compositions may also be affected by the amount of lithium in the glass composition. As the amount of lithium in the glass composition increases, the amount of other, larger alkali metal cations, such as $Na^+$ and $K^+$, decreases. In embodiments, the strain point of glass compositions may be from greater than or equal to 450° C. to less than or equal to 625° C., such as from greater than or equal to 475° C. to less than or equal to 600° C., from greater than or equal to 500° C. to less than or equal to 575° C., from greater than or equal to 515° C. to less than or equal to 560° C., or from greater than or equal to 530° C. to less than or equal to 550° C. and all ranges and sub-ranges between the foregoing values. In other embodiments, the strain point of the glass composition may be from greater than or equal to 500° C. to less than or equal to 560° C., such as from greater than or equal to 510° C. to less than or equal to 560° C., from greater than or equal to 520° C. to less than or equal to 560° C., from greater than or equal to 530° C. to less than or equal to 560° C., or from greater than or equal to 540° C. to less than or equal to 560° C. In yet other embodiments, the strain point of the glass composition may be from greater than or equal to 500° C. to less than or equal to 555° C., from greater than or equal to 500° C. to less than or equal to 550° C., from greater than or equal to 500° C. to less than or equal to 540° C., from greater than or equal to 500° C. to less than or equal to 530° C., or from greater than or equal to 500° C. to less than or equal to 520° C. and all ranges and sub-ranges between the foregoing values. The strain point values recited in this disclosure refer to a value as measured by the fiber elongation method of ASTM C336-71 (2015).

In embodiments, the annealing point of glass compositions may be from greater than or equal to 500° C. to less than or equal to 675° C., such as from greater than or equal to 525° C. to less than or equal to 650° C., from greater than or equal to 550° C. to less than or equal to 625° C., from greater than or equal to 565° C. to less than or equal to 615°

C., or from greater than or equal to 580° C. to less than or equal to 600° C. and all ranges and sub-ranges between the foregoing values. In other embodiments, the annealing point of the glass composition may be from greater than or equal to 550° C. to less than or equal to 625° C., such as from greater than or equal to 560° C. to less than or equal to 625° C., from greater than or equal to 570° C. to less than or equal to 625° C., from greater than or equal to 580° C. to less than or equal to 625° C., or from greater than or equal to 590° C. to less than or equal to 625° C. and all ranges and sub-ranges between the foregoing values. In yet other embodiments, the annealing point of the glass composition may be from greater than or equal to 550° C. to less than or equal to 615° C., from greater than or equal to 550° C. to less than or equal to 610° C., from greater than or equal to 550° C. to less than or equal to 600° C., from greater than or equal to 550° C. to less than or equal to 590° C., or from greater than or equal to 550° C. to less than or equal to 580° C. and all ranges and sub-ranges between the foregoing values. The annealing point values recited in this disclosure refer to a value as measured by the fiber elongation method of ASTM C336-71 (2015).

In embodiments, the softening point of glass compositions may be from greater than or equal to 725° C. to less than or equal to 950° C., such as from greater than or equal to 750° C. to less than or equal to 925° C., from greater than or equal to 775° C. to less than or equal to 900° C., from greater than or equal to 800° C. to less than or equal to 875° C., or from greater than or equal to 825° C. to less than or equal to 850° C. and all ranges and sub-ranges between the foregoing values. In other embodiments, the softening point of the glass composition may be from greater than or equal to 750° C. to less than or equal to 925° C., such as from greater than or equal to 775° C. to less than or equal to 925° C., from greater than or equal to 800° C. to less than or equal to 925° C., from greater than or equal to 825° C. to less than or equal to 925° C., or from greater than or equal to 850° C. to less than or equal to 925° C. and all ranges and sub-ranges between the foregoing values. In yet other embodiments, the softening point of the glass composition may be from greater than or equal to 725° C. to less than or equal to 900° C., from greater than or equal to 725° C. to less than or equal to 875° C., from greater than or equal to 725° C. to less than or equal to 850° C., from greater than or equal to 725° C. to less than or equal to 825° C., or from greater than or equal to 725° C. to less than or equal to 800° C. and all ranges and sub-ranges between the foregoing values. The softening point values recited in this disclosure refer to a value as measured by the fiber elongation method of ASTM C338-93 (2013).

The amount of lithium in a glass composition also has an effect on the liquidus viscosity of the glass composition. In embodiments, the liquidus viscosity is less than or equal to 300 kP, such as less than or equal to 275 kP, less than or equal to 250 kP, less than or equal to 225 kP, less than or equal to 200 kP, less than or equal to 175 kP, or less than or equal to 150 kP. In other embodiments, the liquidus viscosity is greater than or equal to 100 kP, greater than or equal to 125 kP, greater than or equal to 150 kP, greater than or equal to 175 kP, greater than or equal to 200 kP, greater than or equal to 225 kP, greater than or equal to 250 kP, or greater than or equal to 275 kP. In yet other embodiments, the liquidus viscosity is from greater than or equal to 100 kP to less than or equal to 300 kP, greater than or equal to 125 kP to less than or equal to 275 kP, greater than or equal to 150 kP to less than or equal to 250 kP, or greater than or equal to 175 kP to less than or equal to 225 kP and all ranges and sub-ranges between the foregoing values. The liquidus viscosity values are determined by the following method. First the liquidus temperature of the glass is measured in accordance with ASTM C829-81 (2015), titled "Standard Practice for Measurement of Liquidus Temperature of Glass by the Gradient Furnace Method". Next the viscosity of the glass at the liquidus temperature is measured in accordance with ASTM C965-96 (2012), titled "Standard Practice for Measuring Viscosity of Glass Above the Softening Point".

The addition of lithium to the glass composition also affects the Young's modulus, shear modulus, and Poisson's ratio of the glass composition. In embodiments, the Young's modulus of a glass composition may be from greater than or equal to 65 GPa to less than or equal to 85 GPa, such as from greater than or equal to 67 GPa to less than or equal to 82 GPa, from greater than or equal to 70 GPa to less than or equal to 80 GPa, from greater than or equal to 72 GPa to less than or equal to 78 GPa, or from greater than or equal to 74 GPa to less than or equal to 76 GPa and all ranges and sub-ranges between the foregoing values. In other embodiments, the Young's modulus of the glass composition may be from greater than or equal to 66 GPa to less than or equal to 85 GPa, from greater than or equal to 68 GPa to less than or equal to 85 GPa, from greater than or equal to 70 GPa to less than or equal to 85 GPa, from greater than or equal to 72 GPa to less than or equal to 85 GPa, from greater than or equal to 74 GPa to less than or equal to 85 GPa, from greater than or equal to 76 GPa to less than or equal to 85 GPa, from greater than or equal to 78 GPa to less than or equal to 85 GPa, from greater than or equal to 80 GPa to less than or equal to 85 GPa, or from greater than or equal to 82 GPa to less than or equal to 85 GPa and all ranges and sub-ranges between the foregoing values. In yet other embodiments, the Young's modulus may be from greater than or equal to 65 GPa to less than or equal to 84 GPa, from greater than or equal to 65 GPa to less than or equal to 82 GPa, from greater than or equal to 65 GPa to less than or equal to 80 GPa, from greater than or equal to 65 GPa to less than or equal to 78 GPa, from greater than or equal to 65 GPa to less than or equal to 76 GPa, from greater than or equal to 65 GPa to less than or equal to 74 GPa, from greater than or equal to 65 GPa to less than or equal to 72 GPa, from greater than or equal to 65 GPa to less than or equal to 70 GPa, from greater than or equal to 65 GPa to less than or equal to 68 GPa, or from greater than or equal to 65 GPa to less than or equal to 66 GPa and all ranges and sub-ranges between the foregoing values. The Young's modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

According to some embodiments, the glass composition may have a shear modulus of from greater than or equal to 25 GPa to less than or equal to 35 GPa, such as from greater than or equal to 26 GPa to less than or equal to 34 GPa, from greater than or equal to 27 GPa to less than or equal to 33 GPa, from greater than or equal to 28 GPa to less than or equal to 32 GPa, or from greater than or equal to 29 GPa to less than or equal to 31 Gpa and all ranges and sub-ranges between the foregoing values. In other embodiments the glass composition may have a shear modulus from greater than or equal to 26 GPa to less than or equal to 35 GPa, from greater than or equal to 27 GPa to less than or equal to 35 GPa, from greater than or equal to 28 GPa to less than or equal to 35 GPa, from greater than or equal to 29 GPa to less than or equal to 35 GPa, from greater than or equal to 30 GPa to less than or equal to 35 GPa, from greater than or equal to 31 GPa to less than or equal to 35 GPa, from greater than or equal to 32 GPa to less than or equal to 35 GPa, from greater than or equal to 33 GPa to less than or equal to 35 GPa, or from greater than or equal to 34 GPa to less than or equal to 35 GPa and all ranges and sub-ranges between the foregoing values. In yet other embodiments, the glass composition may have a shear modulus from greater than or equal to 25 GPa to less than or equal to 34 GPa, from greater than or equal to 25 GPa to less than or equal to 33 GPa, from greater than or equal to 25 GPa to less than or equal to 32 GPa, from greater than or equal to 25 GPa to less than or equal to 31 GPa, from greater than or equal to 25 GPa to less than or equal to 30 GPa, from greater than or equal to 25 GPa to less than or equal to 29 GPa, from greater than or equal to 25 GPa to less than or equal to 28 GPa, from greater than or equal to 25 GPa to less than or equal to 27 GPa, or from greater than or equal to 25 GPa to less than or equal to 26 GPa and all ranges and sub-ranges between the foregoing values. The shear modulus values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

In one or more embodiments, the glass articles described herein may exhibit an amorphous microstructure and may be substantially free of crystals or crystallites. In other words, the glass articles exclude glass-ceramic materials.

In some embodiments, the refractive index measured at a wavelength of 589 nm of the as formed glasses disclosed herein ("$RI_{as\ formed}$") is lower than the refractive index at a wavelength of 589 nm of the glass when heated at the annealing point for 1 hour ("$RI_{annealed}$"). In some embodiments, $RI_{annealed}-RI_{as\ formed}$ is greater than or equal to 0.0003, greater than or equal to 0.0004, greater than or equal to 0.0005, greater than or equal to 0.0006, greater than or equal to 0.0007, greater than or equal to 0.0008, greater than or equal to 0.0009. In some embodiments, $RI_{annealed}-RI_{as\ formed}$ is in a range from 0.0003 to 0.001, from 0.0003 to 0.0009, from 0.0003 to 0.0008, from 0.0003 to 0.0007, from 0.0003 to 0.0006, from 0.0003 to 0.0005, from 0.0003 to 0.0004, from 0.0004 to 0.001, from 0.0004 to 0.0009, from 0.0004 to 0.0008, from 0.0004 to 0.0007, from 0.0004 to 0.0006, from 0.0004 to 0.0005, from 0.0005 to 0.001, from 0.0005 to 0.0009, from 0.0005 to 0.0008, from 0.0005 to 0.0007, from 0.0005 to 0.0006, from 0.0006 to 0.001, from 0.0006 to 0.0009, from 0.0006 to 0.0008, from 0.0006 to 0.0007, from 0.0007 to 0.001, from 0.0007 to 0.0009, from 0.0007 to 0.0008, from 0.0008 to 0.001, from 0.0008 to 0.0009, or from 0.0009 to 0.001. As used herein the term "as formed" refers to the glass after it is formed (i.e., after the float process or down-draw process) and before additional heat treatments are performed on the glass.

Figure 23:
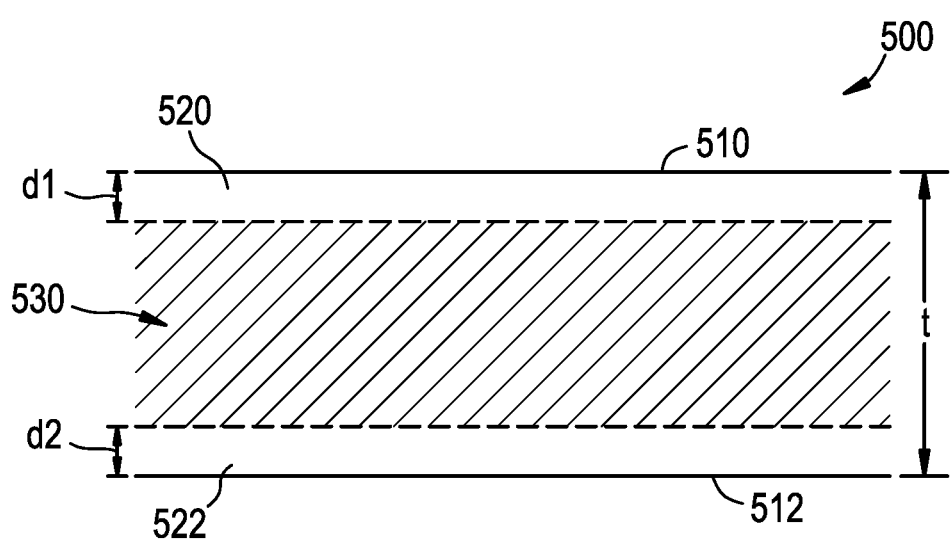
FIG. 23 schematically depicts a cross section of a glass having compressive stress layers on surfaces thereof according to embodiments disclosed and described herein.

As mentioned above, in embodiments, the Li containing aluminosilicate glass compositions can be strengthened, such as by ion exchange, making a glass that is damage resistant for applications such as, but not limited to, glass for display covers. With reference to FIG. 23, the glass has a first region under compressive stress (e.g., first and second compressive layers 520, 522 in FIG. 23) extending from the surface to a depth of compression (DOC) of the glass and a second region (e.g., central region 530 in FIG. 23) under a tensile stress or central tension (CT) extending from the DOC into the central or interior region of the glass. As used herein, DOC refers to the depth at which the stress within the glass article changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) has a maximum at the surface of the glass, and the CS varies with distance d from the surface according to a function. Referring again to FIG. 23, a first segment 520 extends from first surface 510 to a depth $d_1$ and a second segment 522 extends from second surface 512 to a depth $d_2$. Together, these segments define a compression or CS of glass 500. Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

In some embodiments, the CS is from greater than or equal to 300 Pa to less than or equal to 950 MPa, such as from greater than or equal to 325 MPa to less than or equal to 950 MPa, from greater than or equal to 350 MPa to less than or equal to 950 MPa, from greater than or equal to 375 MPa to less than or equal to 950 MPa, from greater than or equal to 400 MPa to less than or equal to 950 MPa, from greater than or equal to 425 MPa to less than or equal to 950 MPa, from greater than or equal to 450 MPa to less than or equal to 950 MPa, from greater than or equal to 475 MPa to less than or equal to 950 MPa, from greater than or equal to 500 MPa to less than or equal to 950 MPa, from greater than or equal to 525 MPa to less than or equal to 950 MPa, from greater than or equal to 550 MPa to less than or equal to 950 MPa, from greater than or equal to 575 MPa to less than or equal to 950 MPa, from greater than or equal to 600 MPa to less than or equal to 950 MPa, from greater than or equal to 625 MPa to less than or equal to 950 MPa, from greater than or equal to 650 MPa to less than or equal to 950 MPa, or from greater than or equal to 675 MPa to less than or equal to 950 MPa and all ranges and sub-ranges between the foregoing values. In other embodiments, the CS is from greater than or equal to 300 MPa to less than or equal to 925 MPa, than or equal to 300 MPa to less than or equal to 900 MPa, than or equal to 300 MPa to less than or equal to 875 MPa, than or equal to 300 MPa to less than or equal to 850 MPa, than or equal to 300 MPa to less than or equal to 825 MPa, than or equal to 300 MPa to less than or equal to 800 MPa, than or equal to 300 MPa to less than or equal to 775 MPa, than or equal to 300 MPa to less than or equal to 750 MPa, than or equal to 300 MPa to less than or equal to 725 MPa, than or equal to 300 MPa to less than or equal to 700 MPa, than or equal to 300 MPa to less than or equal to 675 MPa, than or equal to 300 MPa to less than or equal to 650 MPa, than or equal to 300 MPa to less than or equal to 625 MPa, than or equal to 300 MPa to less than or equal to 600 MPa, than or equal to 300 MPa to less than or equal to 575 MPa, than or equal to 300 MPa to less than or equal to 550

MPa, or than or equal to 300 MPa to less than or equal to 525 MPa and all ranges and sub-ranges between the foregoing values.

In one or more embodiments, Na+ and K+ ions are exchanged into the glass article and the Na+ ions diffuse to a deeper depth into the glass article than the K+ ions. The depth of penetration of K+ ions ("Potassium DOL") is distinguished from DOC because it represents the depth of potassium penetration as a result of an ion exchange process. In some embodiments, the Potassium DOL is typically less than the DOC for the articles described herein Potassium DOL is measured using a surface stress meter such as the commercially available FSM-6000 surface stress meter, manufactured by Orihara Industrial Co., Ltd. (Japan), which relies on accurate measurement of the stress optical coefficient (SOC), as described above with reference to the CS measurement. In some embodiments, the Potassium DOL of each of first and second compressive layers 520, 522 is from greater than or equal to 5 μm to less than or equal to 30 μm, such as from greater than or equal to 6 μm to less than or equal to 25 μm, from greater than or equal to 7 μm to less than or equal to 20 μm, from greater than or equal to 8 μm to less than or equal to 15 μm, or from greater than or equal to 9 μm to less than or equal to 10 μm and all ranges and sub-ranges between the foregoing values. In other embodiments, the Potassium DOL of each of the first and second compressive layers 520, 522 is from greater than or equal to 6 μm to less than or equal to 30 μm, from greater than or equal to 10 μm to less than or equal to 30 μm, from greater than or equal to 15 μm to less than or equal to 30 μm, from greater than or equal to 20 μm to less than or equal to 30 μm, or from greater than or equal to 25 μm to less than or equal to 30 μm and all ranges and sub-ranges between the foregoing values. In yet other embodiments, the Potassium DOL of each of the first and second compressive layers 520, 522 is from greater than or equal to 5 μm to less than or equal to 25 μm, from greater than or equal to 5 μm to less than or equal to 20 μm, from greater than or equal to 5 μm to less than or equal to 15 μm, or from greater than or equal to 5 μm to less than or equal to 10 μm and all ranges and sub-ranges between the foregoing values.

The compressive stress of both major surfaces (510, 512 in FIG. 23) is balanced by stored tension in the central region (530) of the glass. The maximum central tension (CT) and DOC values are measured using a scattered light polariscope (SCALP) technique known in the art. The Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

In embodiments, the glass composition may have a maximum CT from greater than or equal to 30 MPa to less than or equal to 150 MPa, such as from greater than or equal to 35 MPa to less than or equal to 125 MPa, from greater than or equal to 40 MPa to less than or equal to 120 MPa, from greater than or equal to 45 MPa to less than or equal to 115 MPa, from greater than or equal to 50 MPa to less than or equal to 110 MPa, from greater than or equal to 55 MPa to less than or equal to 105 MPa, from greater than or equal to 60 MPa to less than or equal to 100 MPa, from greater than or equal to 65 MPa to less than or equal to 95 MPa, or from greater than or equal to 70 MPa to less than or equal to 90 MPa and all ranges and sub-ranges between the foregoing values. In other embodiments, the glass composition may have a maximum CT from greater than or equal to 30 MPa to less than or equal to 150 MPa, from greater than or equal to 35 MPa to less than or equal to 150 MPa, from greater than or equal to 40 MPa to less than or equal to 150 MPa, from greater than or equal to 45 MPa to less than or equal to 150 MPa, from greater than or equal to 50 MPa to less than or equal to 150 MPa, from greater than or equal to 55 MPa to less than or equal to 150 MPa, from greater than or equal to 60 MPa to less than or equal to 150 MPa, from greater than or equal to 65 MPa to less than or equal to 150 MPa, from greater than or equal to 70 MPa to less than or equal to 150 MPa, from greater than or equal to 75 MPa to less than or equal to 150 MPa, from greater than or equal to 80 MPa to less than or equal to 150 MPa, from greater than or equal to 85 MPa to less than or equal to 150 MPa, from greater than or equal to 90 MPa to less than or equal to 150 MPa, from greater than or equal to 95 MPa to less than or equal to 150 MPa, from greater than or equal to 100 MPa to less than or equal to 150 MPa, from greater than or equal to 105 MPa to less than or equal to 150 MPa, from greater than or equal to 110 MPa to less than or equal to 150 MPa, from greater than or equal to 115 MPa to less than or equal to 150 MPa, from greater than or equal to 120 MPa to less than or equal to 150 MPa, or from greater than or equal to 125 MPa to less than or equal to 150 MPa and all ranges and sub-ranges between the foregoing values. In yet other embodiments, the glass composition may have a maximum CT from greater than or equal to 30 MPa to less than or equal to 125 MPa, from greater than or equal to 30 MPa to less than or equal to 120 MPa, from greater than or equal to 30 MPa to less than or equal to 115 MPa, from greater than or equal to 30 MPa to less than or equal to 110 MPa, from greater than or equal to 30 MPa to less than or equal to 105 MPa, from greater than or equal to 30 MPa to less than or equal to 100 MPa, from greater than or equal to 30 MPa to less than or equal to 95 MPa, from greater than or equal to 30 MPa to less than or equal to 90 MPa, from greater than or equal to 30 MPa to less than or equal to 85 MPa, from greater than or equal to 30 MPa to less than or equal to 80 MPa, from greater than or equal to 30 MPa to less than or equal to 75 MPa, from greater than or equal to 30 MPa to less than or equal to 70 MPa, from greater than or equal to 30 MPa to less than or equal to 65 MPa, from greater than or equal to 30 MPa to less than or equal to 60 MPa, from greater than or equal to 30 MPa to less than or equal to 55 MPa, from greater than or equal to 30 MPa to less than or equal to 50 MPa, from greater than or equal to 30 MPa to less than or equal to 45 MPa, from greater than or equal to 30 MPa to less than or equal to 40 MPa, or from greater than or equal to 30 MPa to less than or equal to 35 MPa and all ranges and sub-ranges between the foregoing values. In further embodiments, the glass composition may have a maximum CT from greater than or equal to 30 MPa to less than or equal to 100 MPa and all ranges and sub-ranges between the foregoing values. In still further embodiments, the glass composition may have a maximum CT from greater than or equal to 70 MPa to less than or equal to 150 MPa, or from greater than or equal to 75 MPa to less than or equal to 150 MPa and all ranges and sub-ranges between the foregoing values.

As noted above, DOC is measured using a scattered light polariscope (SCALP) technique known in the art. The DOC is provided herein as a portion of the thickness (t) of the glass article. In embodiments, the glass compositions may have a depth of compression (DOC) from greater than or equal to 0.15t to less than or equal to 0.25t, such as from greater than or equal to 0.17t to less than or equal to 0.23t, or from greater than or equal to 0.19t to less than or equal to 0.21t and all ranges and sub-ranges between the foregoing values. In other embodiments, the glass composition may have a DOC from greater than or equal to 0.16 to less than or equal to 0.2t, from greater than or equal to 0.17t to less than or equal to 0.25t, from greater than or equal to 0.18t to less than or equal to 0.25t, from greater than or equal to 0.19t to less than or equal to 0.25t, from greater than or equal to 0.20t to less than or equal to 0.25t, from greater than or equal to 0.21t to less than or equal to 0.25t, from greater than or equal to 0.22t to less than or equal to 0.25t, from greater than or equal to 0.23t to less than or equal to 0.25t, or from greater than or equal to 0.24t to less than or equal to 0.25t and all ranges and sub-ranges between the foregoing values. In yet other embodiments, the glass composition may have a DOC from greater than or equal to 0.15t to less than or equal to 0.24t, from greater than or equal to 0.15t to less than or equal to 0.23t, from greater than or equal to 0.15t to less than or equal to 0.22t, from greater than or equal to 0.15t to less than or equal to 0.21t, from greater than or equal to 0.15t to less than or equal to 0.20t, from greater than or equal to 0.15t to less than or equal to 0.19t, from greater than or equal to 0.15t to less than or equal to 0.18t, from greater than or equal to 0.15t to less than or equal to 0.17t, or from greater than or equal to 0.15t to less than or equal to 0.16t and all ranges and sub-ranges between the foregoing values.

Compressive stress layers may be formed in the glass by exposing the glass to an ion exchange solution. In embodiments, the ion exchange solution may be molten nitrate salt. In some embodiments, the ion exchange solution may be molten $KNO_3$, molten $NaNO_3$, or combinations thereof. In certain embodiments, the ion exchange solution may comprise about 100% molten $KNO_3$, about 90% molten $KNO_3$, about 80% molten $KNO_3$, about 70% molten $KNO_3$, or about 60% molten $KNO_3$. In certain embodiments, the ion exchange solution may comprise about 10% molten $NaNO_3$, about 20% molten $NaNO_3$, about 30% molten $NaNO_3$, or about 40% molten $NaNO_3$. In other embodiments, the ion exchange solution may comprise about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$ and all ranges and sub-ranges between the foregoing values. In embodiments, other sodium and potassium salts may be used in the ion exchange solution, such as, for example sodium or potassium nitrites, phosphates, or sulfates.

The glass composition may be exposed to the ion exchange solution by dipping a glass article made from the glass composition into a bath of the ion exchange solution, spraying the ion exchange solution onto a glass article made from the glass composition, or otherwise physically applying the ion exchange solution to a glass article made from the glass composition. Upon exposure to the glass composition, the ion exchange solution may, according to embodiments, be at a temperature from greater than or equal to 400° C. to less than or equal to 500° C., such as from greater than or equal to 410° C. to less than or equal to 490° C., from greater than or equal to 420° C. to less than or equal to 480° C., from greater than or equal to 430° C. to less than or equal to 470° C., or from greater than or equal to 440° C. to less than or equal to 460° C. and all ranges and sub-ranges between the foregoing values. In embodiments, the glass composition may be exposed to the ion exchange solution for a duration from greater than or equal to 4 hours to less than or equal to 48 hours, such as from greater than or equal to 8 hours to less than or equal to 44 hours, from greater than or equal to 12 hours to less than or equal to 40 hours, from greater than or equal to 16 hours to less than or equal to 36 hours, from greater than or equal to 20 hours to less than or equal to 32 hours, or from greater than or equal to 24 hours to less than or equal to 28 hours and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety.

The glass articles disclosed herein have improved scratch resistance compared to other glasses. As used herein, Knoop Scratch Lateral Cracking Threshold is the onset of lateral cracking (in 3 or more of 5 indentation events). In Knoop Scratch Lateral Cracking Threshold testing, samples of the glass articles and articles were first scratched with a Knoop indenter under a dynamic or ramped load to identify the lateral crack onset load range for the sample population. Once the applicable load range is identified, a series of increasing constant load scratches (3 minimum or more per load) are performed to identify the Knoop scratch threshold. The Knoop scratch threshold range can be determined by comparing the test specimen to one of the following 3 failure modes: 1) sustained lateral surface cracks that are more than two times the width of the groove, 2) damage is contained within the groove, but there are lateral surface cracks that are less than two times the width of groove and there is damage visible by naked eye, or 3) the presence of large subsurface lateral cracks which are greater than two times the width of groove and/or there is a median crack at the vertex of the scratch.

In embodiments, the glass articles may have a Knoop Scratch Lateral Cracking Threshold from greater than or equal to 5 N to less than or equal to 24 N, such as from greater than or equal to 6 N to less than or equal to 22 N, from greater than or equal to 8 N to less than or equal to 20 N, from greater than or equal to 10 N to less than or equal to 18 N, or from greater than or equal to 12 N to less than or equal to 16 N and all ranges and sub-ranges between the foregoing values. In other embodiments, the glass articles may have a Knoop Scratch Lateral Cracking Threshold from greater than or equal to 6 N to less than or equal to 24 N, greater than or equal to 7 N to less than or equal to 24 N, greater than or equal to 8 N to less than or equal to 24 N, greater than or equal to 9 N to less than or equal to 24 N, greater than or equal to 10 N to less than or equal to 24 N, greater than or equal to 11 N to less than or equal to 24 N, greater than or equal to 12 N to less than or equal to 24 N, greater than or equal to 13 N to less than or equal to 24 N, greater than or equal to 14 N to less than or equal to 24 N, greater than or equal to 15 N to less than or equal to 24 N, greater than or equal to 16 N to less than or equal to 24 N, greater than or equal to 17 N to less than or equal to 24 N, greater than or equal to 18 N to less than or equal to 24 N, greater than or equal to 19 N to less than or equal to 24 N, greater than or equal to 20 N to less than or equal to 24 N, greater than or equal to 21 N to less than or equal to 24 N, greater than or equal to 22 N, or greater than or equal to 23 N to less than or equal to 24 N to less than or equal to 24 N and all ranges and sub-ranges between the foregoing values. In yet other embodiments, the glass articles may have a Knoop Scratch Lateral Cracking Threshold from greater than or equal to 5 N to less than or equal to 23 N, greater than or equal to 5 N to less than or equal to 22 N, greater than or equal to 5 N to less than or equal to 21 N, greater than or equal to 5 N to less than or equal to 20 N, greater than or equal to 5 N to less than or equal to 19 N, greater than or equal to 5 N to less than or equal to 18 N, greater than or equal to 5 N to less than or equal to 17 N, greater than or equal to 5 N to less than or equal to 16 N, greater than or equal to 5 N to less than or equal to 15 N, greater than or equal to 5 N to less than or equal to 14 N, greater than or equal to 5 N to less than or equal to 13 N, greater than or equal to 5 N to less than or equal to 12 N, greater than or equal to 5 N to less than or equal to 11 N, greater than or equal to 5 N to less than or equal to 10 N, greater than or equal to 5 N to less than or equal to 9 N, greater than or equal to 5 N to less than or equal to 8 N, greater than or equal to 5 N to less than or equal to 7 N, or greater than or equal to 5 N to less than or equal to 6 N and all ranges and sub-ranges between the foregoing values.

The glass articles disclosed herein have improved indentation resistance compared to other glasses. Indentation Fracture Threshold (or Vickers crack initiation threshold) is measured by a Vickers indenter. Indentation Fracture Threshold is a measure of indentation damage resistance of the glass. The test involved the use of a square-based pyramidal diamond indenter with an angle of 136° between faces, referred to as a Vickers indenter. The Vickers indenter was same as the one used in standard micro hardness testing (reference ASTM-E384-11). A minimum of five specimens were chosen to represent the glass type and/or pedigree of interest. For each specimen, multiple sets of five indentations were introduced to the specimen surface. Each set of five indentations was introduced at a given load, with each individual indentation separated by a minimum of 5 mm and no closer than 5 mm to a specimen edge. A rate of indenter loading/unloading of 50 kg/minute was used for test loads ≥2 kg. For test loads <2 kg, a rate of 5 kg/minute was used. A dwell (i.e., hold) time of 10 seconds at the target load was utilized. The machine maintained load control during the dwell period. After a period of at least 12 hours, the indentations were inspected in under reflected light using a compound microscope at 500× magnification. The presence or absence of median/radial cracks, or specimen fracture, was then noted for each indentation. Note that the formation of lateral cracks was not considered indicative of exhibiting threshold behavior, since the formation of median/radial cracks was of interest, or specimen fracture, for this test. The specimen threshold value is defined as the midpoint of the lowest consecutive indentation loads which bracket greater than 50% of the individual indentations meeting threshold. For example, if within an individual specimen 2 of the 5 (40%) indentations induced at a 5 kg load have exceeded threshold, and 3 of the 5 (60%) indentations induced at a 6 kg load have exceeded threshold, then the specimen threshold value would be defined as the midpoint of 5 and 6 kg, or 5.5 kg. The sample mean threshold value is defined as the arithmetic mean of all individual specimen threshold values. Along with the mean, the range (lowest value to highest value) of all the specimen midpoints was reported for each sample. The pre-test, test and post-test environment was controlled to 23±2° C. and 50±5% RH to minimize variation in the fatigue (stress corrosion) behavior of the glass specimens. It should be noted that when first testing an unfamiliar composition or pedigree, the required indentation loads and bracketing increment were determined by performing an "iterative search." Once familiarity with the sample's performance was gained, future testing may be streamlined by testing only those loads near the expected threshold, and then "filling in" additional indentation loads only if necessary.

In embodiments, the Indentation Fracture Threshold is greater than or equal to 15 kgf, such as greater than or equal to 15.5 kgf, greater than or equal to 16 kgf, greater than or equal to 16.5 kgf, greater than or equal to 17 kgf, greater than or equal to 17.5 kgf, greater than or equal to 18 kgf, greater than or equal to 18.5 kgf, greater than or equal to 19 kgf, greater than or equal to 19.5 kgf, greater than or equal to 20 kgf, greater than or equal to 15.5 kgf, greater than or equal to 20.5 kgf, greater than or equal to 21 kgf, greater than or equal to 21.5 kgf, greater than or equal to 22 kgf, greater than or equal to 22.5 kgf and all ranges and sub-ranges between the foregoing values. In some embodiments, the Indentation Fracture Threshold is less than or equal to 28 kgf, less than or equal to 27.5 kgf, less than or equal to 27 kgf, less than or equal to 26.5 kgf, less than or equal to 26 kgf, or less than or equal to 25.5 kgf and all ranges and sub-ranges between the foregoing values. In yet other embodiments, the Indentation Fracture Threshold is from greater than or equal to 15 kgf to less than or equal to 28 kgf, from greater than or equal to 16 kgf to less than or equal to 28 kgf, from greater than or equal to 17 kgf to less than or equal to 28 kgf from greater than or equal to 18 kgf to less than or equal to 28 kgf, from greater than or equal to 19 kgf to less than or equal to 28 kgf, from greater than or equal to 20 kgf to less than or equal to 28 kgf, from greater than or equal to 21 kgf to less than or equal to 28 kgf, from greater than or equal to 22 kgf to less than or equal to 28 kgf, from greater than or equal to 23 kgf to less than or equal to 28 kgf, from greater than or equal to 24 kgf to less than or equal to 28 kgf, from greater than or equal to 25 kgf to less than or equal to 28 kgf, from greater than or equal to 26 kgf to less than or equal to 28 kgf, or from greater than or equal to 27 kgf to less than or equal to 28 kgf and all ranges and sub-ranges between the foregoing values. In still other embodiments, the Indentation Fracture Threshold is from greater than or equal to 15 kgf to less than or equal to 27 kgf, from greater than or equal to 15 kgf to less than or equal to 26 kgf, from greater than or equal to 15 kgf to less than or equal to 25 kgf, from greater than or equal to 15 kgf to less than or equal to 24 kgf, from greater than or equal to 15 kgf to less than or equal to 23 kgf, from greater than or equal to 15 kgf to less than or equal to 22 kgf, from greater than or equal to 15 kgf to less than or equal to 21 kgf, from greater than or equal to 15 kgf to less than or equal to 20 kgf, from greater than or equal to 15 kgf to less than or equal to 19 kgf, from greater than or equal to 15 kgf to less than or equal to 18 kgf, from greater than or equal to 17 kgf to less than or equal to 26 kgf, or from greater than or equal to 15 kgf to less than or equal to 16 kgf and all ranges and sub-ranges between the foregoing values.

Figure 26A:
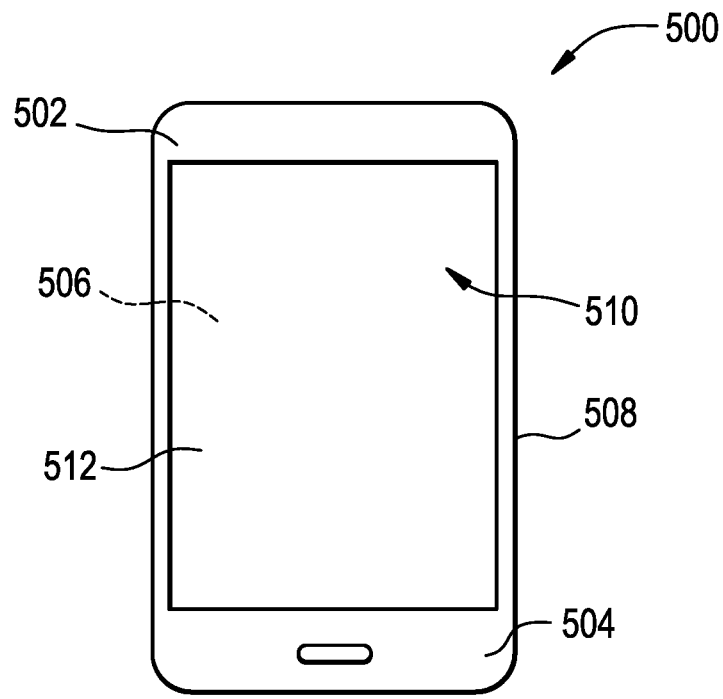
FIG. 26A is a plan view of an exemplary electronic device incorporating any of the glass articles disclosed herein.
Figure 26B:
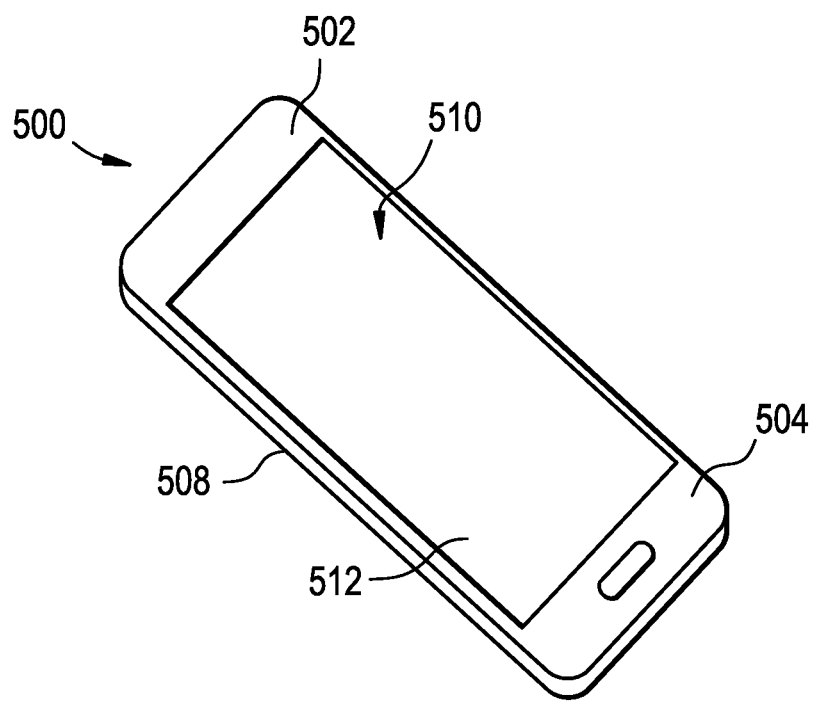
FIG. 26B is a perspective view of the exemplary electronic device of FIG. 26A.

The glass articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the glass articles disclosed herein is shown in FIGS. 26A and 26B. Specifically, FIGS. 26A and 26B show a consumer electronic device 500 including a housing 502 having front 504, back 506, and side surfaces 508; electrical components (not shown) that are at least partially inside or entirely within the housing and including at least a controller, a memory, and a display 510 at or adjacent to the front surface of the housing; and a cover substrate 512 at or over the front surface of the housing such that it is over the display. In some embodiments, at least one of a portion of housing 502 or cover substrate 512 may include any of the glass articles disclosed herein.

As described previously, glass compositions according to embodiments may be formed by any suitable method, such as slot forming, float forming, rolling processes, fusion forming processes, etc.

Exemplary glass article may be characterized by the manner in which it is formed. For instance, where the glass article may be characterized as float-formable (i.e., formed by a float process), down-drawable and, in particular, fusion-formable or slot-drawable (i.e., formed by a down draw process such as a fusion draw process or a slot draw process).

Some embodiments of the glass articles described herein may be formed by a down-draw process. Down-draw processes produce glass articles having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the glass articles may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. A fusion line is formed where the two flowing glass films fuse together. The presense of a fusion line is one manner of identifying a fusion drawn glass article. The fusion line may be seen as an optical distortion when the glass is viewed under an optical microscope. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the glass articles described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

A first clause includes a glass article comprising, on an oxide basis: from greater than or equal to 60 mol % to less than or equal to 74 mol % $SiO_2$; from greater than or equal to 7 mol % to less than or equal to 18 mol % $Al_2O_3$; from greater than or equal to 3 mol % to less than or equal to 16 mol % $B_2O_3$; from greater than 0 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; less than or equal to 0.2 mol % $SnO_2$, and from greater than or equal to 0.5 mol % to less than or equal to 6.5 mol % divalent cation oxides, wherein a molar ratio of $Al_2O_3$:($R_2O$+RO) is greater than or equal to 0.9, where $R_2O$ is a sum of alkali metal oxides in mol % and RO is a sum of divalent cation oxides in mol %.

A second clause includes a glass article comprising, on an oxide basis: from greater than or equal to 60 mol % to less than or equal to 66 mol % $SiO_2$; from greater than or equal to 11.5 mol % to less than or equal to 18 mol % $Al_2O_3$; from greater than or equal to 3 mol % to less than or equal to 8 mol % $B_2O_3$; from greater than or equal to 2 mol % to less than or equal to 6 mol % $Na_2O$; from greater than or equal to 0 mol % to less than or equal to 5 mol % $P_2O_5$; from greater than or equal to 5 mol % to less than or equal to 11 mol % $Li_2O$; and from greater than or equal to 0.5 mol % to less than or equal to 6.5 mol % divalent cation oxides, wherein a molar ratio of $Al_2O_3$:($R_2O$+RO) is greater than or equal to 0.9, where $R_2O$ is a sum of alkali metal oxides in mol % and RO is a sum of divalent cation oxides in mol %.

A third clause includes a glass article comprising, on an oxide basis: from greater than or equal to 65 mol % to less than or equal to 74 mol % $SiO_2$; from greater than or equal to 7 mol % to less than or equal to 12 mol % $Al_2O_3$; from greater than or equal to 5 mol % to less than or equal to 16 mol % $B_2O_3$; from greater than or equal to 0 mol % to less than or equal to 4 mol % $Na_2O$; from greater than or equal to 0 mol % to less than or equal to 5 mol % $P_2O_5$; from greater than or equal to 5 mol % to less than or equal to 11 mol % $Li_2O$; and from greater than or equal to 0.5 mol % to less than or equal to 6.5 mol % divalent cation oxides, wherein a molar ratio of $Al_2O_3$:($R_2O$+RO) is greater than or equal to 0.9, where $R_2O$ is a sum of alkali metal oxides in mol % and RO is a sum of divalent cation oxides in mol %.

A fourth clause includes the glass article of any one of clauses 2 to 3, wherein the glass article comprises less than or equal to 0.2 mol % $SnO_2$.

A fifth clause includes the glass article of any preceding clause, wherein the glass article has a liquidus viscosity of less than or equal to 300 kP.

A sixth clause includes the glass article of any preceding clause, wherein the glass article comprises a molar ratio of $Li_2O$:$R_2O$ greater than or equal to 0.4, where $R_2O$ is a sum of alkali metal oxides in mol %.

A seventh clause includes the glass article of any preceding clause, wherein the glass article comprises greater than or equal to 80 mol % $Al_2O_3+SiO_2+B_2O_3+P_2O_5$.

An eighth clause includes the glass article of any preceding clause, wherein the glass article comprises from greater than or equal to 0.5 mol % to less than or equal to 2 mol % SrO.

A ninth clause includes the glass article of any preceding clause, wherein the glass article is formed by a fusion process.

A tenth clause includes the glass article of any preceding clause, wherein the glass article is strengthened by an ion exchange process, such that a compressive stress layer is formed on at least one surface of the glass article.

An eleventh clause includes the glass article of clause 10, wherein a depth of compression (DOC) is greater than or equal to 0.15t, where t is the thickness of the glass article.

A twelfth clause includes the glass article of clause 10 or 11, wherein a depth of compression (DOC) is from greater than or equal to 0.15t to less than or equal to 0.25t, where t is the thickness of the glass article.

A thirteenth clause includes the glass article of any one of clauses 10-12, wherein the glass article has a central tension from greater than or equal to 30 MPa to less than or equal to 150 MPa.

A fourteenth clause includes the glass article of clause 13, wherein the glass article has a central tension from greater than or equal to 70 MPa to less than or equal to 150 MPa.

A fifteenth clause includes the glass article of clause 13, wherein the glass article has a central tension from greater than or equal to 30 MPa to less than or equal to 100 MPa.

A sixteenth clause includes the glass article of any one of clauses 10-15, the glass article is strengthened by an ion exchange process that adds potassium ions to the glass article and a potassium depth of layer (DOL) is from greater than or equal to 5 μm to less than or equal to 30 μm.

A seventeenth clause includes the glass article of any one of clauses 10-16, wherein the compressive stress layer has a compressive stress at its surface from greater than or equal to 300 MPa to less than or equal to 950 MPa.

An eighteenth clause includes the glass article of any preceding clause, wherein the glass article has a Knoop Scratch Lateral Cracking Threshold of greater than or equal to 5 N to less than or equal to 24 N.

A nineteenth clause includes the glass article of any preceding clause, wherein the glass article has an Indentation Fracture Threshold of greater than or equal to 15 kgf.

A twentieth clause includes the glass article of any preceding clause, wherein the glass article comprises from greater than or equal to 0 mol % to less than or equal to 6.5 mol % MgO.

A twenty-first clause includes the glass article of any preceding clause, wherein the glass article comprises from greater than or equal to 0 mol % to less than or equal to 5 mol % CaO.

A twenty-second clause includes the glass article of any preceding clause, wherein the glass article comprises from greater than or equal to 0 mol % to less than or equal to 2 mol % ZnO.

A twenty-third clause includes a glass article comprising $Li_2O$, $SiO_2$, $Al_2O_3$, and a liquidus viscosity of less than or equal to 300 kP, wherein $RI_{annealed}-RI_{as\ formed}$ is greater than or equal to 0.0003, where $RI_{annealed}$ is a refractive index at a wavelength of 589 nm of the glass heated at the annealing point of the glass for 1 hour and $RI_{as\ formed}$ is a refractive index at a wavelength of 589 nm of the glass as formed.

A twenty-fourth clause includes the glass article of clause 23 further comprising a fusion line.

A twenty-fifth clause includes the glass article of clause 23 or 24, wherein $RI_{annealed}-RI_{as\ formed}$ is in a range from 0.0003 to 0.001.

A twenty-sixth clause includes the glass article of clause 23 or 24, wherein $RI_{annealed}-RI_{as\ formed}$ is in a range from 0.0005 to 0.001.

A twenty-seventh clause includes the glass article of clause 23 or 24, wherein $RI_{annealed}-RI_{as\ formed}$ is greater than or equal to 0.0005.

A twenty-eighth clause includes the glass article of any one of clauses 23-27, comprising at least one alkali metal oxide ($R_2O$) or divalent cation oxide (RO), wherein a molar ratio of $Al_2O_3:(R_2O+RO)$ is greater than or equal to 0.9.

A twenty-ninth clause includes the glass article of any one of clauses 23-28, wherein the glass article comprises a molar ratio of $Li_2O:R_2O$ greater than or equal to 0.4, where $R_2O$ is a sum of alkali metal oxides in mol %.

A thirtieth clause includes the glass article of any one of clauses 23-29, wherein the glass article comprises greater than or equal to 80 mol % $Al_2O_3+SiO_2+B_2O_3+P_2O_5$.

A thirty-first clause includes a consumer electronic product, comprising: a housing having a front surface, a back surface, and side surfaces; electrical components provided at least partially within the housing, the electrical components including at least a controller, a memory, and a display, the display being provided at or adjacent to the front surface of the housing; and a cover substrate disposed over the display, wherein at least one of a portion the housing or the cover substrate comprises the glass article of any preceding clause.

EXAMPLES

Embodiments will be further clarified by the following examples. It should be understood that these examples are not limiting to the embodiments described above.

Glass compositions having components listed in Table 2 below were prepared. In Table 2, all components are in mol %.

TABLE 2

|  | Glass 1 | Glass 2 | Glass 3 | Glass 4 | Glass 5 | Glass 6 | Glass 7 | Glass 8 | Glass 9 | Glass 10 |
|---|---|---|---|---|---|---|---|---|---|---|
| $Al_2O_3$ | 15.04 | 15.03 | 15.08 | 12.59 | 13.07 | 13.55 | 14.09 | 14.59 | 15.09 | 9.94 |
| $B_2O_3$ | 7.00 | 7.00 | 7.00 | 5.78 | 5.78 | 5.78 | 5.78 | 5.80 | 5.82 | 6.73 |
| CaO | 1.49 | 1.49 | 1.49 | 1.50 | 1.50 | 1.50 | 1.50 | 1.50 | 1.51 | 0.05 |
| MgO | 1.00 | 1.00 | 1.01 | 1.01 | 1.47 | 1.97 | 2.48 | 2.95 | 3.46 | 0.98 |
| $Na_2O$ | 3.64 | 4.53 | 5.40 | 2.70 | 2.69 | 2.71 | 2.67 | 2.69 | 2.70 | 2.47 |
| $SiO_2$ | 62.64 | 62.76 | 62.84 | 69.37 | 68.36 | 67.35 | 66.29 | 65.25 | 64.23 | 73.38 |
| $SnO_2$ | 0.05 | 0.05 | 0.05 | 0.05 | 0.05 | 0.05 | 0.05 | 0.05 | 0.05 | 0.05 |
| ZnO | 0.00 | 0.00 | 0.00 | 0.00 | 0.00 | 0.00 | 0.00 | 0.00 | 0.00 | 0.00 |

TABLE 2-continued

| | Glass 1 | Glass 2 | Glass 3 | Glass 4 | Glass 5 | Glass 6 | Glass 7 | Glass 8 | Glass 9 | Glass 10 |
|---|---|---|---|---|---|---|---|---|---|---|
| $P_2O_5$ | 0.03 | 0.03 | 0.03 | 0.03 | 0.03 | 0.03 | 0.03 | 0.03 | 0.03 | 0.03 |
| $Li_2O$ | 8.00 | 7.00 | 6.00 | 6.87 | 6.96 | 6.97 | 7.00 | 7.03 | 7.00 | 6.28 |
| SrO | 1.00 | 1.01 | 1.01 | 0.00 | 0.00 | 0.00 | 0.00 | 0.00 | 0.00 | 0.00 |
| Density (g/cm$^3$) | | | | 2.349 | 2.358 | 2.367 | 2.376 | 2.385 | 2.393 | 2.292 |
| CTE (from 0-300° C. 10$^{-7}$/° C.) | | | | 47.5 | 47.1 | 47 | 47.5 | 47.1 | 47.2 | 43.7 |
| Strain (° C.) | | | | 568 | 571 | 573 | 575 | 580 | 581 | 546 |
| Anneal (° C.) | | | | 621 | 623 | 625 | 626 | 630 | 631 | 602 |
| Softening (° C.) | | | | 882 | 879.3 | 874.3 | 866.6 | 864.6 | 862.7 | 897 |
| Liquidus temperature (° C.) | | | | 1140 | 1140 | 1160 | 1120 | 1160 | 1165 | 1125 |
| liquidus viscosity (kP) | | | | | | | | | | |
| Stress Optical Coefficient (nm/mm/MPa) | | | | 3.299 | 3.281 | 3.234 | 3.195 | 3.199 | 3.127 | 3.518 |
| Refractive Index | | | | 1.5036 | 1.5053 | 1.5075 | 1.5096 | 1.5113 | 1.5134 | 1.4933 |
| Young's Modulus (GPa) | 77.625 | 76.728 | 75.9 | 79.074 | 76.383 | 77.418 | 78.039 | 78.591 | 79.971 | 71.346 |
| Shear Modulus (GPa) | 31.464 | 31.05 | 30.981 | 32.43 | 31.464 | 27.6 | 32.016 | 31.74 | 32.568 | 29.532 |
| Poisson's ratio | 0.234 | 0.228 | 0.226 | 0.22 | 0.215 | 0.221 | 0.218 | 0.214 | 0.229 | 0.208 |

| | Glass 11 | Glass 12 | Glass 13 | Glass 14 | Glass 15 | Glass 16 | Glass 17 | Glass 18 | Glass 19 |
|---|---|---|---|---|---|---|---|---|---|
| $Al_2O_3$ | 10.40 | 10.92 | 11.42 | 11.92 | 12.40 | 13.53 | 13.54 | 13.50 | 13.51 |
| $B_2O_3$ | 6.77 | 6.72 | 6.73 | 6.72 | 6.77 | 6.50 | 6.51 | 6.51 | 6.50 |
| CaO | 0.05 | 0.05 | 0.05 | 0.05 | 0.06 | 1.49 | 1.50 | 1.50 | 1.50 |
| MgO | 1.46 | 1.96 | 2.44 | 2.90 | 3.40 | 1.48 | 1.97 | 2.45 | 2.92 |
| $Na_2O$ | 2.44 | 2.41 | 2.45 | 2.46 | 2.44 | 2.37 | 2.38 | 2.41 | 2.40 |
| $SiO_2$ | 72.33 | 71.34 | 70.37 | 69.43 | 68.46 | 67.46 | 66.91 | 66.45 | 65.98 |
| $SnO_2$ | 0.05 | 0.05 | 0.05 | 0.05 | 0.05 | 0.05 | 0.05 | 0.05 | 0.05 |
| ZnO | 0.00 | 0.00 | 0.00 | 0.00 | 0.00 | 0.00 | 0.00 | 0.00 | 0.00 |
| $P_2O_5$ | 0.03 | 0.03 | 0.03 | 0.03 | 0.03 | 0.03 | 0.03 | 0.03 | 0.03 |
| $Li_2O$ | 6.38 | 6.43 | 6.37 | 6.35 | 6.30 | 7.00 | 7.01 | 7.01 | 7.00 |
| SrO | 0.00 | 0.00 | 0.00 | 0.00 | 0.00 | 0.00 | 0.00 | 0.00 | 0.00 |
| Density (g/cm$^3$) | 2.303 | 2.316 | 2.325 | 2.336 | 2.345 | 2.359 | 2.365 | 2.369 | 2.374 |
| CTE (from 0-300° C. 10$^{-7}$/° C.) | 43.7 | 43.4 | 43.8 | 44.2 | 44 | 45.8 | 46.3 | 47 | 46.8 |
| Strain (° C.) | 548 | 557 | 561 | 563 | 566 | 580 | 577 | 575 | 575 |
| Anneal (° C.) | 603 | 612 | 615 | 615 | 617 | 634 | 629 | 626 | 625 |
| Softening (° C.) | 894.3 | 887.5 | 882.9 | 876.3 | 869.5 | 882.8 | 874.3 | 872.1 | 866.5 |
| Liquidus temperature (° C.) | 1110 | 1115 | 1110 | 1085 | 1100 | | | | |
| liquidus viscosity (kP) | | | | | | | | | |
| Stress Optical Coefficient (nm/mm/MPa) | 3.535 | 3.438 | 3.387 | 3.376 | 3.324 | 3.276 | 3.265 | 3.245 | 3.225 |
| Refractive Index | 1.4951 | 1.4970 | 1.4990 | 1.5010 | 1.5032 | 1.5065 | 1.5075 | 1.5083 | 1.5094 |
| Young's Modulus (GPa) | 279.312 | 73.416 | 74.382 | 75.21 | 76.176 | 77.073 | 77.349 | 78.039 | 78.384 |
| Shear Modulus (GPa) | 29.808 | 30.222 | 30.636 | 30.912 | 31.257 | 31.464 | 31.671 | 31.878 | 32.085 |
| Poisson's ratio | 0.212 | 0.215 | 0.214 | 0.217 | 0.22 | 0.224 | 0.222 | 0.223 | 0.220 |

| | Glass 20 | Glass 21 | Glass 22 | Glass 23 | Glass 24 | Glass 25 | Glass 26 | Glass 27 |
|---|---|---|---|---|---|---|---|---|
| $Al_2O_3$ | 13.58 | 13.60 | 12.70 | 14.14 | 14.46 | 15.08 | 15.51 | 15.64 |
| $B_2O_3$ | 6.51 | 6.50 | 6.39 | 6.26 | 6.44 | 6.13 | 6.36 | 6.34 |
| CaO | 1.50 | 1.51 | 1.44 | 1.52 | 1.49 | 1.50 | 1.50 | 1.46 |
| MgO | 3.43 | 3.92 | 1.90 | 1.98 | 1.96 | 1.97 | 1.97 | 1.90 |
| $Na_2O$ | 2.42 | 2.42 | 2.41 | 2.42 | 2.42 | 2.42 | 2.39 | 2.42 |
| $SiO_2$ | 65.38 | 64.87 | 68.20 | 66.65 | 66.15 | 65.83 | 65.02 | 65.20 |
| $SnO_2$ | 0.05 | 0.05 | 0.05 | 0.05 | 0.05 | 0.05 | 0.05 | 0.05 |
| ZnO | 0.00 | 0.00 | 0.00 | 0.00 | 0.00 | 0.00 | 0.00 | 0.00 |
| $P_2O_5$ | 0.03 | 0.03 | 0.03 | 0.03 | 0.03 | 0.03 | 0.03 | 0.04 |
| $Li_2O$ | 7.01 | 7.00 | 6.80 | 6.86 | 6.92 | 6.91 | 7.06 | 6.87 |
| SrO | 0.00 | 0.00 | 0.00 | 0.00 | 0.00 | 0.00 | 0.00 | 0.00 |
| Density (g/cm$^3$) | 2.379 | 2.383 | 2.359 | 2.368 | 2.373 | 2.378 | 2.38 | 2.387 |
| CTE (from 0-300° C. 10$^{-7}$/° C.) | 47.1 | 47.6 | 46.3 | 45.7 | 45.4 | 45.2 | 44.1 | 44.5 |
| Strain (° C.) | 572 | 573 | 569 | 576 | 584 | 587 | 593 | 590 |
| Anneal (° C.) | 622 | 622 | 619 | 627 | 634 | 638 | 643 | 640 |
| Softening (° C.) | 856.6 | 853.7 | 866.6 | 871.8 | 875 | 877.3 | 878.5 | 872.6 |
| Liquidus temperature (° C.) | | | 1140 | 1175 | 1230 | 1270 | >1290 | >1275 |
| liquidus viscosity (kP) | | | 48.59 | 27.53 | 10.34 | 5.44 | | |
| Stress Optical Coefficient (nm/mm/MPa) | 3.191 | 3.17 | 3.25 | 3.238 | 3.23 | 3.214 | 3.206 | 3.184 |
| Refractive Index | 1.5103 | 1.5113 | 1.5062 | 1.5081 | 1.5093 | 1.5102 | 1.5115 | 1.5123 |
| Young's Modulus (GPa) | 78.729 | 79.074 | 76.866 | 77.625 | 78.177 | 78.177 | 79.005 | 79.902 |
| Shear Modulus (GPa) | 32.292 | 32.361 | 31.464 | 31.74 | 32.016 | 32.085 | 32.292 | 32.568 |
| Poisson's ratio | 0.220 | 0.223 | 0.222 | 0.223 | 0.22 | 0.217 | 0.223 | 0.228 |

| | Glass 28 | Glass 29 | Glass 30 | Glass 31 | Glass 32 | Glass 33 | Glass 34 | Glass 35 |
|---|---|---|---|---|---|---|---|---|
| $Al_2O_3$ | 15.45 | 15.19 | 9.62 | 15.18 | 15.21 | 15.18 | 15.23 | 15.23 |
| $B_2O_3$ | 3.85 | 4.97 | 10.09 | 5.33 | 5.31 | 5.38 | 5.38 | 5.34 |
| CaO | 0.03 | 0.04 | 1.50 | 0.04 | 0.04 | 0.04 | 0.96 | 1.18 |
| MgO | 1.12 | 1.81 | 0.51 | 2.01 | 2.05 | 2.06 | 2.10 | 2.06 |

TABLE 2-continued

|  |  |  |  |  |  |  |  |  |
|---|---|---|---|---|---|---|---|---|
| Na₂O | 5.01 | 4.78 | 0.10 | 4.75 | 4.74 | 4.74 | 3.95 | 3.71 |
| SiO₂ | 63.33 | 63.22 | 70.63 | 63.71 | 64.08 | 64.19 | 64.11 | 64.21 |
| SnO₂ | 0.05 | 0.06 | 0.03 | 0.07 | 0.07 | 0.07 | 0.06 | 0.07 |
| ZnO | 0.00 | 0.00 | 0.00 | 0.00 | 0.00 | 0.00 | 0.00 | 0.00 |
| P₂O₅ | 1.83 | 1.10 | 0.00 | 0.31 | 0.10 | 0.05 | 0.04 | 0.03 |
| Li₂O | 9.23 | 8.74 | 6.97 | 8.53 | 8.31 | 8.20 | 8.08 | 8.08 |
| SrO | 0.00 | 0.00 | 0.00 | 0.00 | 0.00 | 0.00 | 0.00 | 0.00 |
| Density (g/cm³) | 2.37 |  | 2.297 | 2.371 |  |  |  |  |
| CTE (from 0-300° C. 10⁻⁷/° C.) |  |  | 38.6 |  |  |  |  |  |
| Strain (° C.) |  |  | 540 | 549 |  |  |  |  |
| Anneal (° C.) |  |  | 592 | 600 |  |  |  |  |
| Softening (° C.) |  |  | 856.2 |  |  |  |  |  |
| Liquidus temperature (° C.) | 1145 | 1120 | 1060 | 1135 | 1125 | 1125 | 1115 | 1140 |
| liquidus viscosity (kP) | 34.90 | 40.74 | 262.93 | 29.43 | 34.71 | 34.18 | 35.64 | 24.46 |
| Stress Optical Coefficient (nm/mm/MPa) |  |  | 3.594 |  |  |  |  |  |
| Refractive Index |  |  | 1.4967 |  |  |  |  |  |
| Young's Modulus (GPa) |  |  | 69.483 |  |  |  |  |  |
| Shear Modulus (GPa) |  |  | 28.635 |  |  |  |  |  |
| Poisson's ratio |  |  | 0.214 |  |  |  |  |  |

|  | Glass 36 | Glass 37 | Glass 38 | Glass 39 | Glass 40 | Glass 41 | Glass 42 | Glass 43 | Glass 44 |
|---|---|---|---|---|---|---|---|---|---|
| Al₂O₃ | 15.24 | 15.21 | 15.22 | 15.13 | 15.12 | 15.16 | 15.25 | 15.21 | 9.59 |
| B₂O₃ | 5.42 | 5.45 | 5.43 | 5.82 | 6.29 | 6.41 | 6.36 | 6.40 | 8.58 |
| CaO | 1.36 | 1.40 | 1.44 | 1.46 | 1.51 | 1.51 | 1.53 | 1.53 | 2.44 |
| MgO | 2.07 | 2.06 | 2.09 | 2.04 | 2.03 | 2.02 | 2.04 | 2.03 | 0.53 |
| Na₂O | 3.54 | 3.48 | 3.49 | 3.84 | 4.20 | 4.25 | 4.30 | 4.32 | 0.86 |
| SiO₂ | 64.11 | 64.18 | 64.18 | 63.74 | 63.08 | 63.19 | 63.41 | 63.41 | 71.31 |
| SnO₂ | 0.07 | 0.08 | 0.08 | 0.07 | 0.07 | 0.06 | 0.04 | 0.04 | 0.03 |
| ZnO | 0.00 | 0.00 | 0.00 | 0.00 | 0.00 | 0.00 | 0.00 | 0.00 | 0.00 |
| P₂O₅ | 0.03 | 0.03 | 0.03 | 0.03 | 0.03 | 0.03 | 0.03 | 0.03 | 0.00 |
| Li₂O | 8.07 | 8.02 | 7.96 | 7.78 | 7.59 | 7.28 | 6.96 | 6.96 | 6.08 |
| SrO | 0.00 | 0.00 | 0.00 | 0.00 | 0.00 | 0.00 | 0.00 | 0.00 | 0.51 |
| Density (g/cm³) |  | 2.381 |  | 2.379 |  | 2.378 |  | 2.377 | 2.323 |
| CTE (from 0-300° C. 10⁻⁷/° C.) |  |  |  |  |  | 54.4 |  |  | 40.5 |
| Strain (° C.) |  | 562 |  |  |  | 555 |  |  | 540 |
| Anneal (° C.) |  | 609 |  |  |  | 603 |  |  | 590 |
| Softening (° C.) |  |  |  |  |  | 838.1 |  |  | 850.5 |
| Liquidus temperature (° C.) |  | 1135 |  |  |  |  |  |  | 1050 |
| Liquidus viscosity (kP) |  | 25.10 |  |  |  |  |  |  | 294.38 |
| Stress Optical Coefficient (nm/mm/MPa) | 3.199 |  |  |  |  |  |  | 3.215 | 3.47 |
| Refractive Index | 1.5110 |  |  |  |  |  |  | 1.5101 | 1.4992 |
| Young's Modulus (GPa) | 31.67 |  |  |  |  |  |  | 75.969 | 72.105 |
| Shear Modulus (GPa) | 1.49 |  |  |  |  |  |  | 31.05 | 29.739 |
| Poisson's ratio |  |  |  |  |  |  |  | 0.222 | 0.21 |

|  | Glass 45 | Glass 46 | Glass 47 | Glass 48 | Glass 49 | Glass 50 | Glass 51 | Glass 52 | Glass 53 |
|---|---|---|---|---|---|---|---|---|---|
| Al₂O₃ | 9.58 | 9.61 | 10.54 | 15.10 | 15.17 | 15.13 | 15.13 | 15.11 | 15.05 |
| B₂O₃ | 8.56 | 8.64 | 5.79 | 6.65 | 6.73 | 6.76 | 5.79 | 4.81 | 7.58 |
| CaO | 1.48 | 1.49 | 1.48 | 1.50 | 1.51 | 1.48 | 1.50 | 1.49 | 1.48 |
| MgO | 1.52 | 0.53 | 0.52 | 1.03 | 1.04 | 1.02 | 1.03 | 1.02 | 1.03 |
| Na₂O | 0.87 | 0.87 | 1.75 | 3.48 | 4.33 | 5.28 | 3.49 | 3.50 | 3.46 |
| SiO₂ | 71.29 | 71.07 | 73.19 | 63.18 | 63.13 | 63.26 | 63.96 | 64.91 | 62.31 |
| SnO₂ | 0.03 | 0.03 | 0.03 | 0.03 | 0.03 | 0.03 | 0.03 | 0.03 | 0.03 |
| ZnO | 0.00 | 0.00 | 0.00 | 0.00 | 0.00 | 0.00 | 0.00 | 0.00 | 0.00 |
| P₂O₅ | 0.00 | 0.00 | 0.00 | 0.00 | 0.00 | 0.00 | 0.00 | 0.00 | 0.00 |
| Li₂O | 6.10 | 6.17 | 6.10 | 7.92 | 6.94 | 5.92 | 7.96 | 8.02 | 7.97 |
| SrO | 0.51 | 1.54 | 0.52 | 1.03 | 1.04 | 1.03 | 1.03 | 1.02 | 1.02 |
| Density (g/cm³) | 2.317 | 2.338 | 2.332 | 2.402 | 2.402 | 2.404 | 2.405 | 2.409 | 2.396 |
| CTE (from 0-300° C. 10⁻⁷/° C.) | 39.7 | 41 | 41.6 | 54.8 | 55.3 | 57.2 | 54.6 | 54.7 | 54.8 |
| Strain (° C.) | 542 | 542 | 572 | 556 | 559 | 560 | 565 | 570 | 545 |
| Anneal (° C.) | 592 | 592 | 629 | 604 | 607 | 609 | 613 | 620 | 592 |
| Softening (° C.) | 860.6 | 850 | 908.4 | 835.6 | 843.2 | 848.2 | 847.4 | 858.7 | 821.1 |
| Liquidus | 1070 | 1065 | 1105 | 1100 | 1060 | 1070 | 1105 | 1150 | 1080 |
| Liquidus viscosity (kP) | 206.08 | 205.29 | 320.85 | 42.49 | 104.54 | 104.26 | 51.82 | 29.46 | 47.51 |
| Stress Optical Coefficient (nm/mm/MPa) | 3.459 | 3.454 | 3.408 | 3.146 | 3.187 | 3.216 | 3.138 | 3.09 | 3.188 |
| Refractive Index | 1.4980 | 1.4995 | 1.4981 | 1.5140 | 1.5118 | 1.5104 | 1.5127 | 1.5133 | 1.5131 |
| Young's Modulus (GPa) | 72.381 | 72.105 | 73.968 | 77.418 | 77.004 | 76.107 | 78.729 | 79.143 | 76.935 |
| Shear Modulus (GPa) | 29.739 | 29.601 | 30.567 | 31.395 | 31.326 | 31.05 | 32.016 | 32.223 | 31.188 |
| Poisson's ratio | 0.22 | 0.22 | 0.21 | 0.23 | 0.23 | 0.23 | 0.23 | 0.23 | 0.23 |

The density, strain point, anneal point, softening point, stress optical coefficient, Young's modulus, and Shear modulus were measured according to the techniques described above. The linear coefficient of thermal expansion (CTE) over the temperature range 0-300 C was determined using a push-rod dilatometer in accordance with ASTM E228-11. The Poisson's ratio was measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

Table 3 below shows properties of various glass compositions provided in Table 2 above. The ion exchange solution composition, temperature, and duration of the ion exchange process are also provided in Table 3. The CT, DOC, CS, and Potassium DOL recorded in Table 3 were determined using the measurement techniques described above.

TABLE 3

|  | KNO$_3$ % | NaNO$_3$ % | T (° C.) | time (h) | Thickness (mm) | CT (MPa) | DOC (mm) | CS (MPa) | Potassium DOL (μm) |
|---|---|---|---|---|---|---|---|---|---|
| Glass 44 | 80 | 20 | 430 | 8 | 0.86 | 45.1 | 0.153 | 363.6 | 7.1 |
| Glass 44 | 60 | 40 | 430 | 8 | 0.84 | 55.33 | 0.152 | 327.1 | 8.2 |
| Glass 45 | 80 | 20 | 430 | 8 | 0.84 | 46.47 | 0.15 | 366.6 | 7.3 |
| Glass 45 | 60 | 40 | 430 | 8 | 0.83 | 58.04 | 0.141 | 318.9 | 8.2 |
| Glass 46 | 80 | 20 | 430 | 8 | 0.83 | 47.03 | 0.149 | 376.7 | 6.9 |
| Glass 46 | 60 | 40 | 430 | 8 | 0.83 | 53.94 | 0.145 | 344.3 | 7.3 |
| Glass 47 | 80 | 20 | 430 | 8 | 0.82 | 64.86 | 0.155 | 402.6 | 10.5 |
| Glass 47 | 60 | 40 | 430 | 8 | 0.83 | 68.79 | 0.157 | 354.2 | 11.2 |
| Glass 48 | 80 | 20 | 430 | 8 | 1 | 103 | 0.18 |  |  |
| Glass 48 | 60 | 40 | 430 | 8 | 1.004 | 108.72 | 0.163 |  |  |
| Glass 49 | 80 | 20 | 430 | 8 | 1.076 | 84.52 | 0.18 |  |  |
| Glass 49 | 60 | 40 | 430 | 8 | 1.077 | 93.61 | 0.179 |  |  |
| Glass 50 | 80 | 20 | 430 | 8 | 1.007 | 79.81 | 0.17 |  |  |
| Glass 50 | 60 | 40 | 430 | 8 | 0.999 | 84.8 | 0.171 |  |  |
| Glass 51 | 80 | 20 | 430 | 8 | 1.056 | 103.93 | 0.18 |  |  |
| Glass 51 | 60 | 40 | 430 | 8 | 1.061 | 110.51 | 0.18 |  |  |
| Glass 52 | 80 | 20 | 430 | 8 | 1.039 | 113.77 | 0.18 |  |  |
| Glass 52 | 60 | 40 | 430 | 8 | 1.025 | 121.15 | 0.179 |  |  |
| Glass 53 | 80 | 20 | 430 | 8 | 1.078 | 89.47 | 0.17 |  |  |
| Glass 53 | 60 | 40 | 430 | 8 | 1.07 | 96.96 | 0.176 |  |  |

Figure 24:
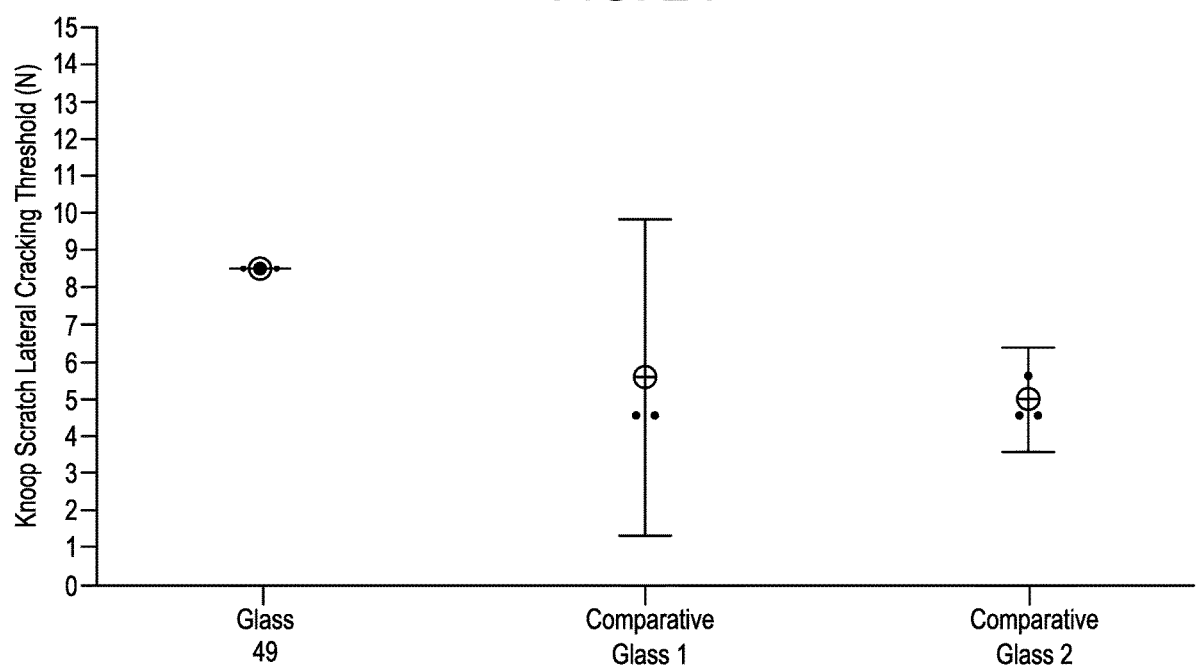
FIG. 24 is a graph depicting the Knoop Scratch Lateral Cracking Threshold test results for a glass article according to embodiments disclosed and described herein.

In addition to the above data, the Knoop Scratch Lateral Cracking Threshold was tested for Glass 49 as disclosed in Table 2 above. The results of the Knoop Scratch Lateral Cracking Threshold test are shown in FIG. 24. As shown in that figure, the Knoop Scratch Lateral Cracking Threshold is higher in Glass 49 than in the comparative lithium-containing glasses. The glass article according to Glass 49 was ion exchanged in a 20 wt % NaNO$_3$ and 80 wt % KNO$_3$ molten salt bath at 430° C. for 10 hrs. Comparative Glass 1 was ion exchanged in a 20% NaNO$_3$ and 80% KNO$_3$ molten salt bath at 430° C. for 16 hrs. Comparative Glass 2 was ion exchanged in a 49% NaNO$_3$ and 51% KNO$_3$ molten salt bath at 380° C. for 3.75 hrs. Each of the glasses were formed into 0.8 mm thick glass sheets. The compositions for Comparative Glass 1 and Comparative Glass 2 are provided in Table 4 below in mol %.

TABLE 4

|  | Comp. Glass 1 | Comp. Glass 2 |
|---|---|---|
| Al$_2$O$_3$ | 12.78 | 15.67 |
| B$_2$O$_3$ | 1.95 |  |
| MgO | 2.98 |  |
| Na$_2$O | 2.43 | 10.81 |
| SiO$_2$ | 70.91 | 63.60 |
| ZnO | 0.89 | 1.16 |
| P$_2$O$_5$ |  | 2.48 |
| Li$_2$O | 7.95 | 6.24 |
| SnO$_2$ | 0.10 | 0.04 |

Figure 25:
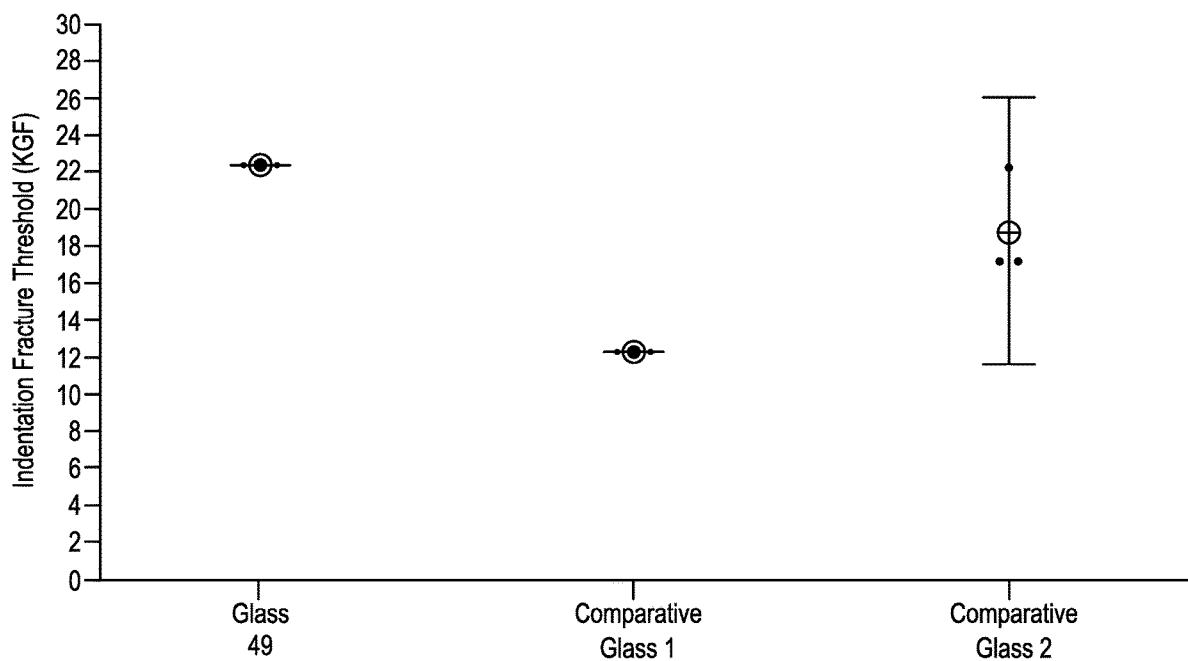
FIG. 25 is a graph depicting the Indentation Fracture Threshold test results for a glass article according to embodiments discloses and described herein.

Additionally, the Indentation Fracture Threshold was tested for Glass 49 as disclosed in Table 2 above. The results of the Indentation Fracture Threshold test are shown in FIG. 25. As shown in that figure, the Indentation Fracture Threshold is higher in Glass 49 than in the comparative lithium-containing glasses. The glass article according to Glass 49 was ion exchanged in a 20 wt % NaNO$_3$ and 80 wt % KNO$_3$ molten salt bath at 430° C. for 10 hrs. Comparative Glass 1 was ion exchanged in a 20% NaNO$_3$ and 80% KNO$_3$ molten salt bath at 430° C. for 16 hrs. Comparative Glass 2 was ion exchanged in a 49% NaNO$_3$ and 51% KNO$_3$ molten salt bath at 380° C. for 3.75 hrs. Each of the glasses were formed into 0.8 mm thick glass sheets.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass article comprising, on an oxide basis:
   from greater than or equal to 65 mol% to less than or equal to 74 mol% SiO$_2$;
   from greater than or equal to 7 mol% to less than or equal to 12 mol% Al$_2$O$_3$;
   from greater than or equal to 5 mol% to less than or equal to 16 mol% B$_2$O$_3$;
   from greater than or equal to 0 mol% to less than or equal to 4 mol% Na$_2$O;
   from greater than or equal to 0 mol% to less than or equal to 5 mol% P$_2$O$_5$;
   from greater than or equal to 5 mol% to less than or equal to 11 mol% Li$_2$O; and from greater than or equal to 0.5 mol% to less than or equal to 6.5 mol% divalent cation oxides, wherein a molar ratio of $Al_2O_3:(R_2O+RO)$ is greater than or equal to 0.9, where $R_2O$ is a sum of alkali metal oxides in mol% and RO is a sum of divalent cation oxides in mol%.

2. The glass article of claim 1, wherein the glass article comprises a molar ratio of $Li_2O:R_2O$ greater than or equal to 0.4, where $R_2O$ is a sum of alkali metal oxides in mol%.

3. The glass article of claim 1, wherein the glass article comprises greater than or equal to 80 mol% $Al_2O_3+SiO_2+B_2O_3+P_2O_5$.

4. The glass article of claim 1, wherein the glass article comprises from greater than or equal to 0.5 mol% to less than or equal to 2 mol% SrO.

5. The glass article of claim 1, wherein the glass article comprises from greater than or equal to 0 mol% to less than or equal to 6.5 mol% MgO.

6. The glass article of claim 1, wherein the glass article comprises from greater than or equal to 0 mol% to less than or equal to 5 mol% CaO.

7. The glass article of claim 1, wherein the glass article comprises from greater than or equal to 0 mol% to less than or equal to 2 mol% ZnO.

8. The glass article of claim 1, wherein the glass article comprises from greater than or equal to 0 mol% to less than or equal to 0.2 mol% $SnO_2$.

9. The glass article of claim 1, wherein the glass article has a liquidus viscosity of less than or equal to 300 kP.

10. The glass article of claim 1, wherein the glass article is strengthened by an ion exchange process, such that a compressive stress layer is formed on at least one surface of the glass article.

11. The glass article of claim 10, wherein a depth of compression is greater than or equal to 0.15 t, where t is a thickness of the glass article.

12. The glass article of claim 10, wherein a depth of compression (DOC) is from greater than or equal to 0.15 t to less than or equal to 0.25 t, where t is a thickness of the glass article.

13. The glass article of claim 10, wherein the glass article has a central tension from greater than or equal to 30 MPa to less than or equal to 100 MPa.

14. The glass article of claim 1, wherein the glass article is strengthened by an ion exchange process that adds potassium ions to the glass article and a potassium depth of layer (DOL) is from greater than or equal to 5μm to less than or equal to 30 μm.

15. The glass article of claim 14, wherein a compressive stress layer has a compressive stress at its surface from greater than or equal to 300 MPa to less than or equal to 950 MPa.

16. The glass article of claim 14, wherein the glass article has a Knoop Scratch Lateral Cracking Threshold of greater than or equal to 5 N to less than or equal to 24 N.

17. The glass article of claim 14, wherein the glass article has an Indentation Fracture Threshold of greater than or equal to 15 kgf.

18. A consumer electronic product, comprising:
a housing having a front surface, a back surface, and side surfaces;
electrical components provided at least partially within the housing, the electrical components including at least a controller, a memory, and a display, the display being provided at or adjacent to the front surface of the housing; and
and a cover substrate disposed over the display, wherein at least one of a portion of the housing or the cover substrate comprises the glass article of claim 1.

* * * * *